(12) United States Patent
Lim et al.

(10) Patent No.: US 8,809,943 B2
(45) Date of Patent: Aug. 19, 2014

(54) THREE DIMENSIONAL SEMICONDUCTOR MEMORY DEVICES AND METHODS OF FABRICATING THE SAME

(75) Inventors: Jin-Soo Lim, Yongin-si (KR); Vladimir Urazaev, Suwon-si (KR); Jin Ha Jeong, Yongin-si (KR); Hansoo Kim, Suwon-si (KR); Heayun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/456,552

(22) Filed: Apr. 26, 2012

(65) Prior Publication Data

US 2012/0273872 A1    Nov. 1, 2012

(30) Foreign Application Priority Data

Apr. 27, 2011  (KR) .......................... 10-2011-0039683

(51) Int. Cl.
*H01L 29/66*      (2006.01)
(52) U.S. Cl.
USPC .................... 257/330; 257/314; 257/E29.262

(58) Field of Classification Search
USPC ................. 257/314, 315, 324, 329, 330, 334, 257/E29.262; 438/156, 201, 211
See application file for complete search history.

(56) References Cited

U.S. PATENT DOCUMENTS

| 2010/0163968 A1* | 7/2010 | Kim et al. ..................... 257/324 |
| 2010/0240205 A1* | 9/2010 | Son et al. ...................... 438/588 |
| 2012/0001252 A1* | 1/2012 | Alsmeier et al. .............. 257/321 |

* cited by examiner

*Primary Examiner* — Tucker Wright
(74) *Attorney, Agent, or Firm* — Myers Bigel Sibley & Sajovec, PA

(57) ABSTRACT

A three dimensional semiconductor memory device includes an electrode structure having a plurality of conductive electrode patterns and insulating patterns alternatingly stacked on a substrate. Opposite sidewalls of the electrode structure include respective grooves therein extending in a direction substantially perpendicular to the substrate. First and second active patterns protrude from the substrate and extend within the grooves in the opposite sidewalls of the electrode structure, respectively. Respective data storing layers extend in the grooves between the conductive electrode patterns of the electrode structure and sidewalls of the first and second active patterns adjacent thereto. Related fabrication methods are also discussed.

32 Claims, 52 Drawing Sheets

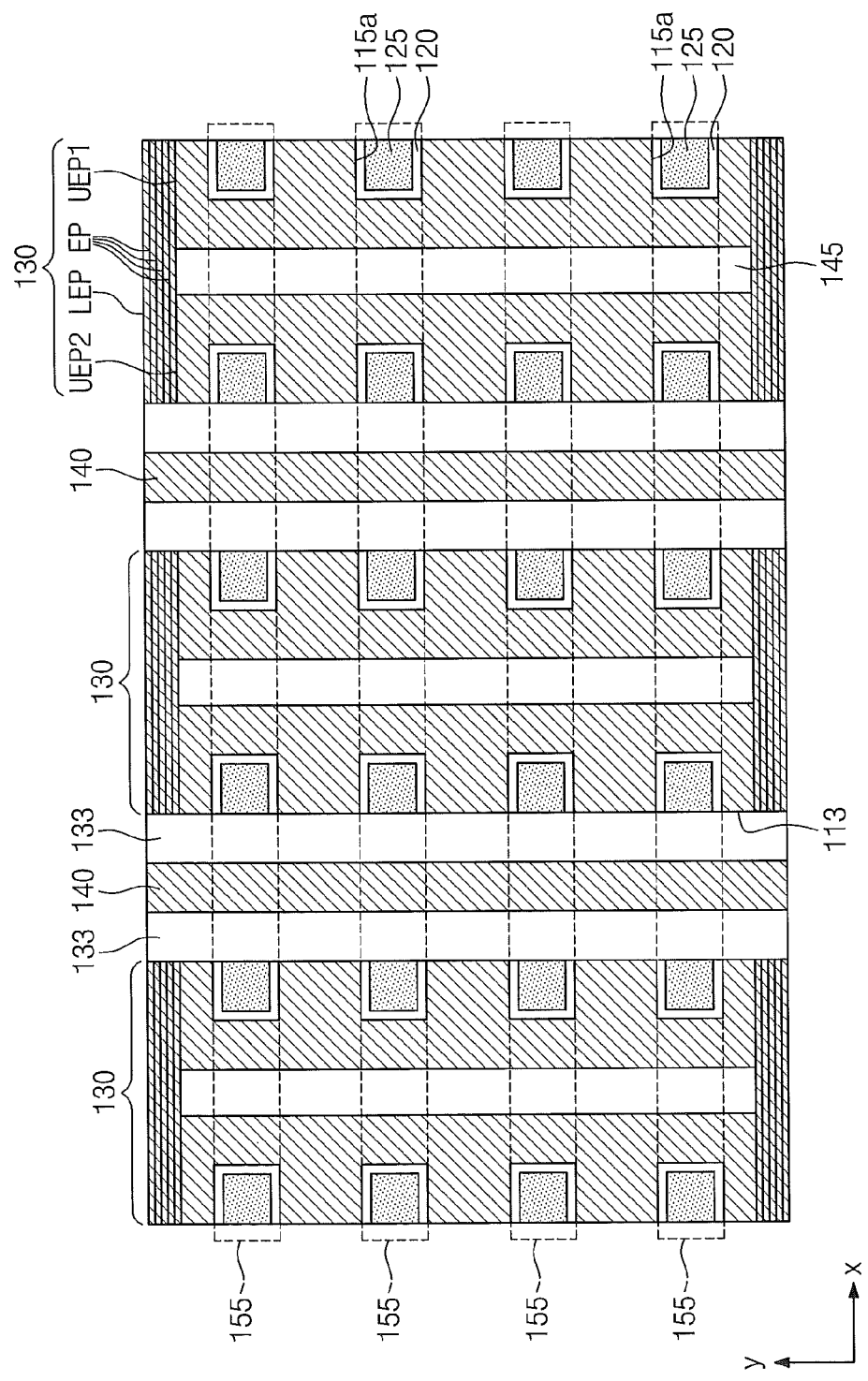

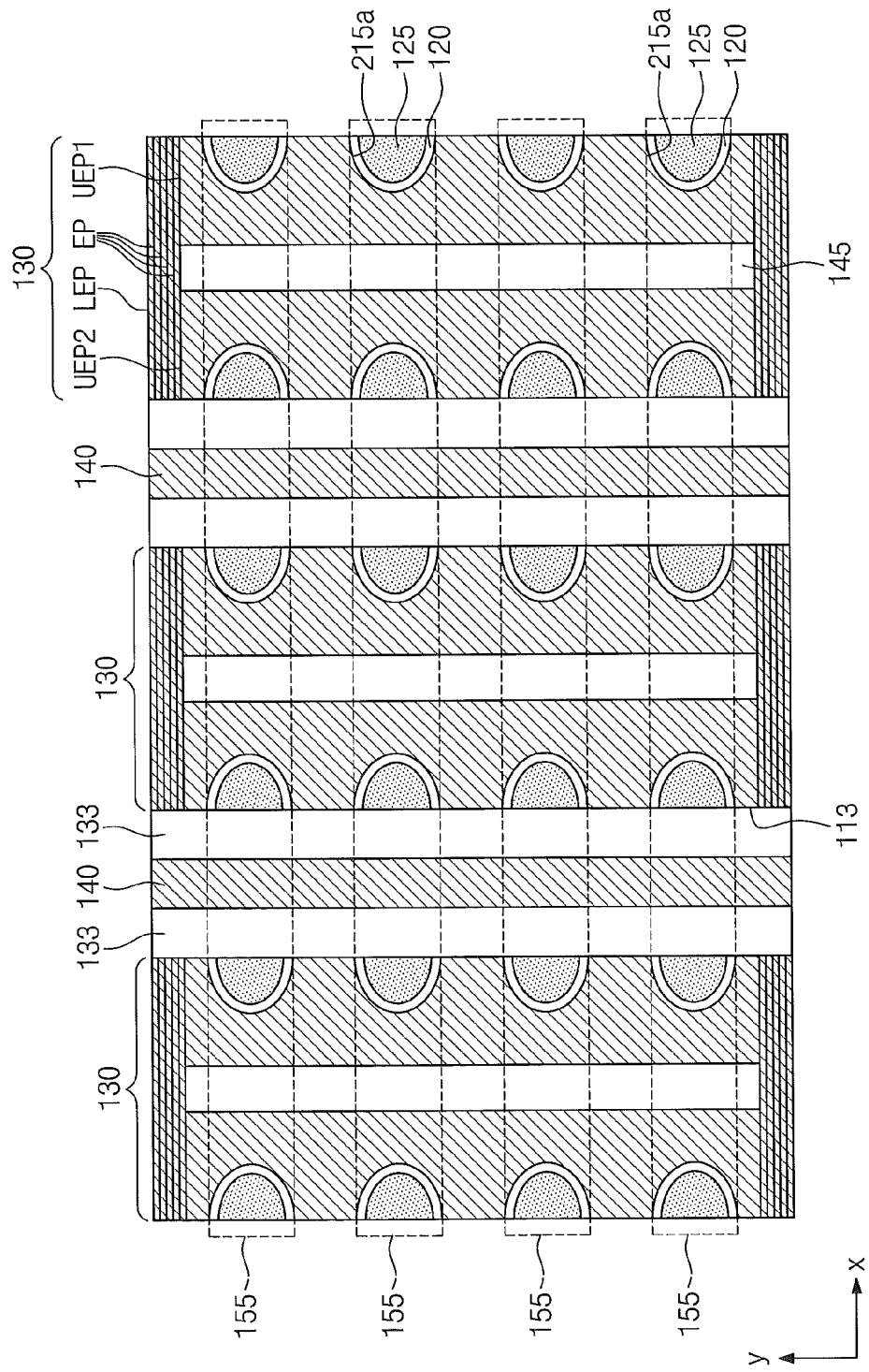

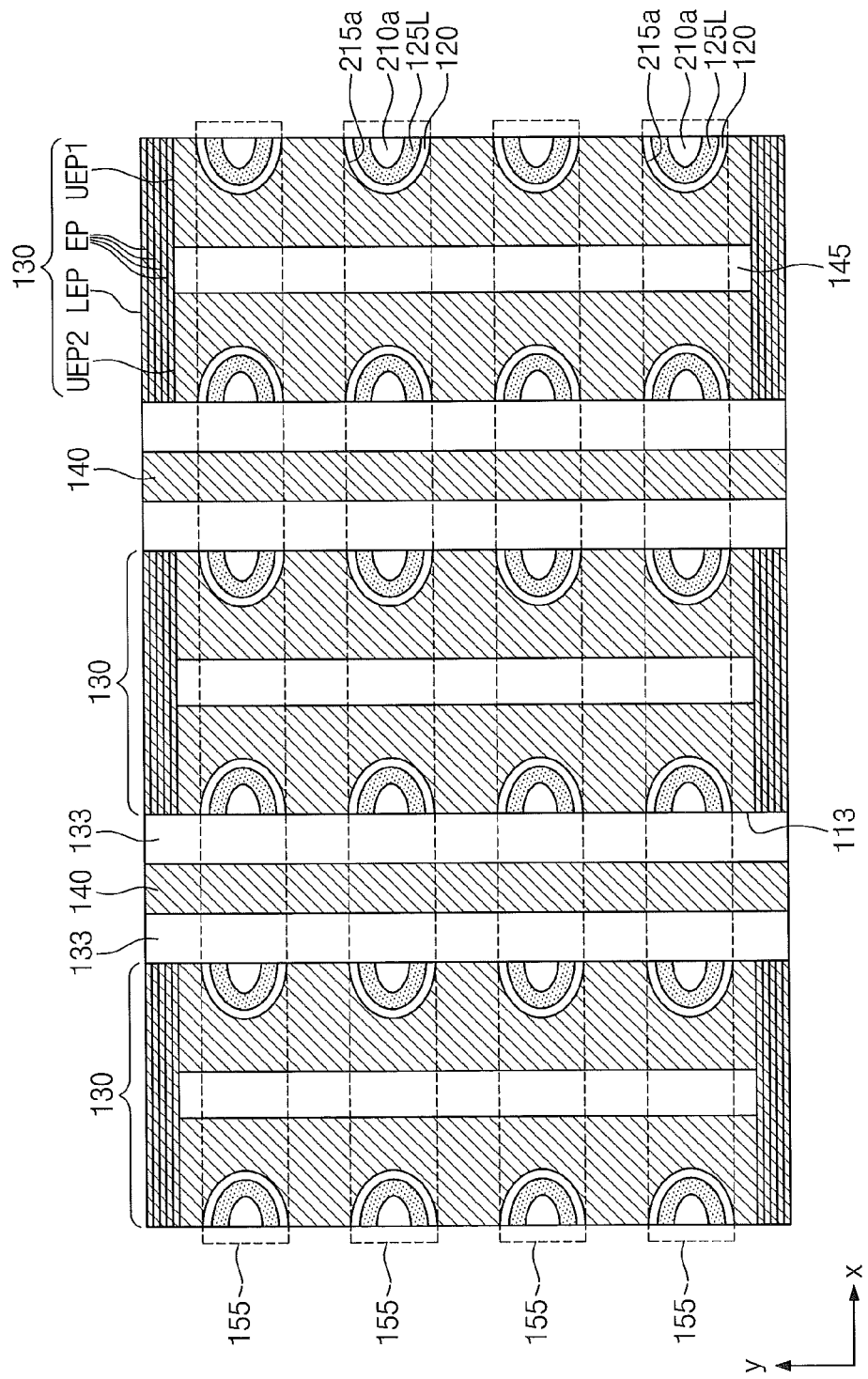

THREE DIMENSIONAL SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0039683, filed on Apr. 27, 2011, the entirety of which is incorporated by reference herein.

BACKGROUND

The present disclosure herein relates to semiconductor devices and, more particularly, to three dimensional semiconductor memory devices and methods of fabricating the same.

Semiconductor devices may be attractive in the electronics industry because of small size, multi-function and/or low fabrication costs. High performance semiconductor devices and/or low cost semiconductor devices have been increasingly demanded with the development of the electronics industry. The semiconductor devices have been more highly integrated in order to meet the above demands. In particular, to store greater amounts of logic data, the integration density of semiconductor memory devices has been increased.

In two dimensional semiconductor memory devices, a planar area in which a unit memory cell occupies may directly affect the integration density of the two dimensional semiconductor memory devices. That is, the integration density of the two dimensional semiconductor memory devices may be influenced by a minimum feature size which may correspond to a process technology for forming fine patterns. However, there may be limitations in improving the process technology for forming the fine patterns. In addition, high cost equipment or apparatus may be required to form the fine patterns. Thus, cost for fabricating the highly integrated semiconductor memory devices may be increased.

Recently, three dimensional semiconductor memory devices including a plurality of memory cells three dimensionally arrayed have been proposed which may address at least some of the above limitations.

SUMMARY

Embodiments of the inventive concept are directed to three dimensional semiconductor memory devices and methods of fabricating the same.

According to some embodiments, a three dimensional semiconductor memory device includes an electrode structure having a plurality of conductive electrode patterns and insulating patterns alternatingly stacked on a substrate. Opposite sidewalls of the electrode structure include respective grooves therein extending in a direction substantially perpendicular to the substrate. First and second active patterns protrude from the substrate and extend within the grooves in the opposite sidewalls of the electrode structure, respectively. Respective data storing layers extend in the grooves between the conductive electrode patterns of the electrode structure and sidewalls of the first and second active patterns adjacent thereto.

In some embodiments, the substrate may include respective common source regions of a second conductivity type therein adjacent the opposite sidewalls of the electrode structure and a well region of a first conductivity type therebetween, and the first and second active patterns contact the common source regions, respectively. For example, the first and second active patterns may directly contact the respective common source regions and the well region. In some embodiments, the first and second active patterns may directly contact the well region at respective bottom portions and/or at respective sidewalls thereof.

In some embodiments, an interconnection line may be electrically connected to the first and second active patterns. An uppermost one of the conductive electrode patterns opposite the substrate may include first and second segments that are electrically isolated from one another.

In some embodiments, each of the conductive electrode patterns may include first and second segments that are electrically isolated from one another by a partition pattern including an insulating material having an etching selectivity with that of the insulating patterns of the electrode structure.

In some embodiments, first and second interconnection lines extending substantially parallel to one another may be electrically connected to the first and second active patterns, respectively. The grooves in the opposite sidewalls of the electrode structure and the first and second active patterns therein may be offset relative to one another or otherwise not aligned along a direction substantially perpendicular to that of the first and second interconnection lines.

In some embodiments, the respective data storing layers may further include a tunnel dielectric layer, a charge storage layer, and a blocking dielectric layer extending between the conductive electrode patterns and the sidewalls of the first and second active patterns.

In some embodiments, the blocking dielectric layer may further extend between the insulating patterns and the conductive electrode patterns.

In some embodiments, the respective data storing layers may extend along the respective grooves in the opposite sidewalls of the electrode structure between the insulating patterns and the sidewalls of the first and second active regions, and may further extend into respective recessed regions of the substrate adjacent to the opposite sidewalls.

In some embodiments, the respective grooves may define a substantially concave shape, and the sidewalls of the first and second active patterns adjacent to the grooves may have the substantially concave shape. In some embodiments, respective dielectric patterns may protrude from the substrate and extend along the first and second active patterns in the respective grooves. In some embodiments, respective sidewalls of the first and second active patterns opposite the grooves may define a substantially planar shape.

In some embodiments, sidewall insulating layers may extend along the opposite sidewalls of the electrode structure and at least partially into the respective grooves.

According to further embodiments, a method of fabricating a three dimensional semiconductor memory device includes forming an electrode structure having a plurality of conductive electrode patterns and insulating patterns alternatingly stacked on a substrate, where opposite sidewalls of the electrode structure include respective grooves therein extending in a direction substantially perpendicular to the substrate, forming respective data storing layers in the grooves, and forming first and second active patterns protruding from the substrate and extending along the grooves in the opposite sidewalls of the electrode structure, respectively, such that the respective data storing layers extend between the conductive electrode patterns and sidewalls of the first and second active patterns adjacent thereto.

In some embodiments, the electrode structure may be formed by forming a stack structure including a plurality of material layers and insulating layers alternatingly stacked on a substrate. The material layers may have an etch selectivity with respect to the insulating layers. The stack structure may be patterned to form a stack pattern including a plurality of material patterns and the insulating patterns alternatingly stacked, and the grooves may be formed in opposite sidewalls of the stack pattern.

In some embodiments, patterning the stack structure and forming the grooves may be performed using a same mask pattern.

In some embodiments, a well region of a first conductivity type may be formed in the substrate, and respective common source regions of a second conductivity type may be formed in the well region adjacent to the opposite sidewalls of the stack pattern. The first and second active patterns may contact the respective common source regions. For example, the first and second active patterns may directly contact the respective common source regions and may directly contact the well region extending between the respective common source regions.

In some embodiments, forming the grooves may further define respective recessed regions in the substrate adjacent the opposite sidewalls of the stack pattern, and wherein forming the first and second active patterns may include forming a first active layer on sidewalls of the grooves, etching the data storing layer to expose the recessed regions in the substrate, and forming a second active layer in the grooves on the first active layer therein such that the second active layer contacts the exposed recessed regions in the substrate.

In some embodiments, the first and second active layers may be amorphous layers, and forming the active patterns may further include performing a laser annealing process on the first and second active layers to change respective crystalline phases thereof to a single crystalline state.

In some embodiments, the material patterns may define the conductive electrode patterns of the electrode structure. In other embodiments the material patterns may be dummy patterns. The dummy patterns may be selectively etched between the insulating patterns of the stack pattern, and the conductive electrode patterns may be formed between the insulating patterns of the stack pattern to define the electrode structure.

In some embodiments, portions of the data storing layer may be formed on the insulating patterns prior to forming the conductive electrode patterns therebetween.

In some embodiments, portions of the dummy patterns may remain between the insulating patterns of the stack pattern after selectively etching the dummy patterns, and the conductive electrode patterns may be formed to respectively define first and second segments that are electrically isolated from one another by the remaining portions of the dummy patterns. According to still further aspects, the three dimensional semiconductor memory device comprises an electrode structure including electrode patterns and insulating patterns alternately and repeatedly stacked on a substrate, a vertical active pattern disposed in a vertical groove defined by a sidewall of the electrode structure, and a data storing layer between the respective electrode patterns and a sidewall of the vertical active pattern.

In some embodiments, the device may further include a well region formed in the substrate and a common source region formed in the well region at a side of the electrode structure. The well region may be doped with dopants of a first conductivity type, and the common source region may be doped with dopants of a second conductivity type. The common source region may be adjacent to the sidewall of the electrode structure, and the vertical active pattern may be connected to the common source region. The vertical active pattern may be also connected to the well region. The vertical active pattern may downwardly extend to be disposed in a recessed region formed in the substrate under the vertical groove, and the vertical active pattern may contact a bottom surface of the recessed region. A first portion and a second portion of the bottom surface of the vertical active pattern may contact the well region and the common source region, respectively. The vertical active pattern may contact an inner sidewall of the recessed region. A portion of the vertical active pattern contacting the inner sidewall of the recessed region may be in contract with the well region, and an entire portion of the bottom surface of the vertical active pattern may be in contact with the common source region. A reference voltage may be applied to the common source region in an operation mode.

In other embodiments, the vertical groove may have a rounded sidewall in a plan view.

In yet other embodiments, the device may further comprise a filling dielectric pattern disposed in the vertical groove. The vertical active pattern may be disposed between the filling dielectric pattern and an inner surface of the vertical groove, and the vertical active pattern may be disposed along the inner surface of the vertical groove with substantially a uniform thickness.

In still other embodiments, the vertical active pattern may cover an entire portion of the inner surface of the vertical groove.

In yet still other embodiments, the vertical active pattern may be laterally recessed from the sidewall of the electrode structure which is located outside the vertical groove.

In further embodiments, the data storing layer may vertically extend to intervene between the insulating patterns and the sidewall of the vertical active pattern.

In yet further embodiments, a first portion of the data storing layer may vertically extend to intervene between the insulating patterns and the sidewall of the vertical active pattern, and a second portion of the data storing layer may horizontally extend to cover a bottom surface and a top surface of the respective electrode patterns.

In still further embodiments, an entire portion of the data storing layer may horizontally extend to cover a bottom surface and a top surface of the respective electrode patterns.

In another aspect, the device comprises an electrode structure including electrode patterns and insulating patterns alternately and repeatedly stacked on a substrate, and a pair of vertical active patterns respectively disposed in a pair of vertical grooves. The pair of vertical grooves are defined by both opposite sidewalls of the electrode structure, respectively. A data storing layer is disposed between the respective electrode patterns and a sidewall of the respective vertical active patterns.

In some embodiments, the device may further comprise an interconnection electrically connected to upper ends of the pair of vertical active patterns. At least an uppermost electrode pattern of the electrode patterns may be divided into a pair of segments horizontally separated from each other, and the pair of segments may be coupled to the pair of vertical active patterns, respectively.

In other embodiments, the device may further comprise a pair of interconnections electrically connected to upper ends of the pair of vertical active patterns, respectively. The pair of interconnections may extend in parallel.

In still other embodiments, each of the stacked electrode patterns may be divided into a first segment and a second segment which are separated from each other at a same level. In this case, the device may further comprise a partition pattern between the respective first segments and the respective second segments located at the same level. The partition patterns may include an insulating material having an etch selectivity with respect to the insulating patterns.

In still another aspect, the device comprises an electrode structure including electrode patterns and insulating patterns alternately and repeatedly stacked on a substrate, a common source region in the substrate at a side of the electrode structure, and a vertical active pattern on a sidewall of the electrode structure adjacent to the common source region. The vertical active pattern contacts the common source region. A data storing layer is disposed between the respective electrode patterns and a sidewall of the vertical active pattern.

In some embodiments, the device may further comprise a well region in the substrate. The well region may be doped with dopants of a first conductivity type, and the common source region may be doped with dopants of a second conductivity type. The vertical active pattern may also contact the well region.

In other embodiments, the sidewall of the electrode structure may include a first portion which is flat and a second portion which is laterally concave from the first portion in a plan view. The second portion of the sidewall of the electrode structure may vertically extend. The vertical active pattern may be disposed on the second portion of the sidewall of the electrode structure.

According to still other aspects, a method comprises forming a stack structure including insulating layers and material layers alternately and repeatedly stacked on a substrate, patterning the stack structure to form a stack pattern including insulating patterns and material patterns alternately and repeatedly stacked, forming a vertical groove at a sidewall of the stack pattern, and forming a vertical active pattern in the vertical groove.

In some embodiments, the stack pattern and the vertical groove may be formed simultaneously.

In other embodiments, the material patterns may be formed of a material having an etch selectivity with respect to the insulating patterns. In this case, the method may further comprise etching the material patterns to form empty regions, forming electrode patterns in the empty regions to complete an electrode stack structure, and forming a data storing layer between the respective electrode patterns and a sidewall of the vertical active pattern. At least a portion of the data storing layer may be formed on a sidewall of the stack pattern including an inner surface of the vertical groove, prior to formation of the vertical active pattern. The at least a portion of the data storing layer outside the vertical groove may be removed after formation of the vertical active pattern, thereby exposing the insulating patterns and the material patterns. The empty regions may be formed by etching the exposed material patterns. The method may further comprise forming a recessed region in the substrate under the vertical groove. In this case, forming the at least a portion of the data storing layer and the vertical active pattern may comprise sequentially forming the at least a portion of the data storing layer and a first active layer on the substrate having the vertical groove and the recessed region, anisotropically etching the first active layer to form a first active layer pattern on a sidewall of the stack pattern, etching the at least a portion of the data storing layer to expose an inner sidewall of the recessed region, forming a second active layer contacting the first active layer pattern and the inner sidewall of the recessed region, and removing the second active layer and the first active layer pattern outside the vertical groove to form the vertical active pattern. The data storing layer may be formed in the empty regions prior to formation of the electrode patterns. The method may further comprise forming a well region doped with dopants of a first conductivity type in the substrate prior to formation of the stack structure, and forming a common source region in the well region at a side of the electrode structure. The vertical active pattern may be connected to the common source region and the well region. The empty regions may be formed by etching the material patterns, and portions of the material patterns may remain after the material patterns are etched.

In still other embodiments, the material patterns may be formed of a conductive material. The method may further comprise forming a data storing layer on an inner surface of the vertical groove prior to formation of the vertical active pattern.

In yet other embodiments, the method may further comprise laterally recessing the vertical active pattern after formation of the vertical active pattern. The recessed vertical active pattern may fill a portion of the vertical groove.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Embodiments of the inventive concept will become more apparent in view of the attached drawings and accompanying detailed description.

FIG. 1B is a plan view illustrating the three dimensional semiconductor memory device shown in FIG. 1A.

FIG. 4B is a plan view illustrating the three dimensional semiconductor memory device shown in FIG. 4A.

FIG. 5B is a plan view illustrating the three dimensional semiconductor memory device shown in FIG. 5A.

DETAILED DESCRIPTION OF THE EMBODIMENTS

Figure 1A:
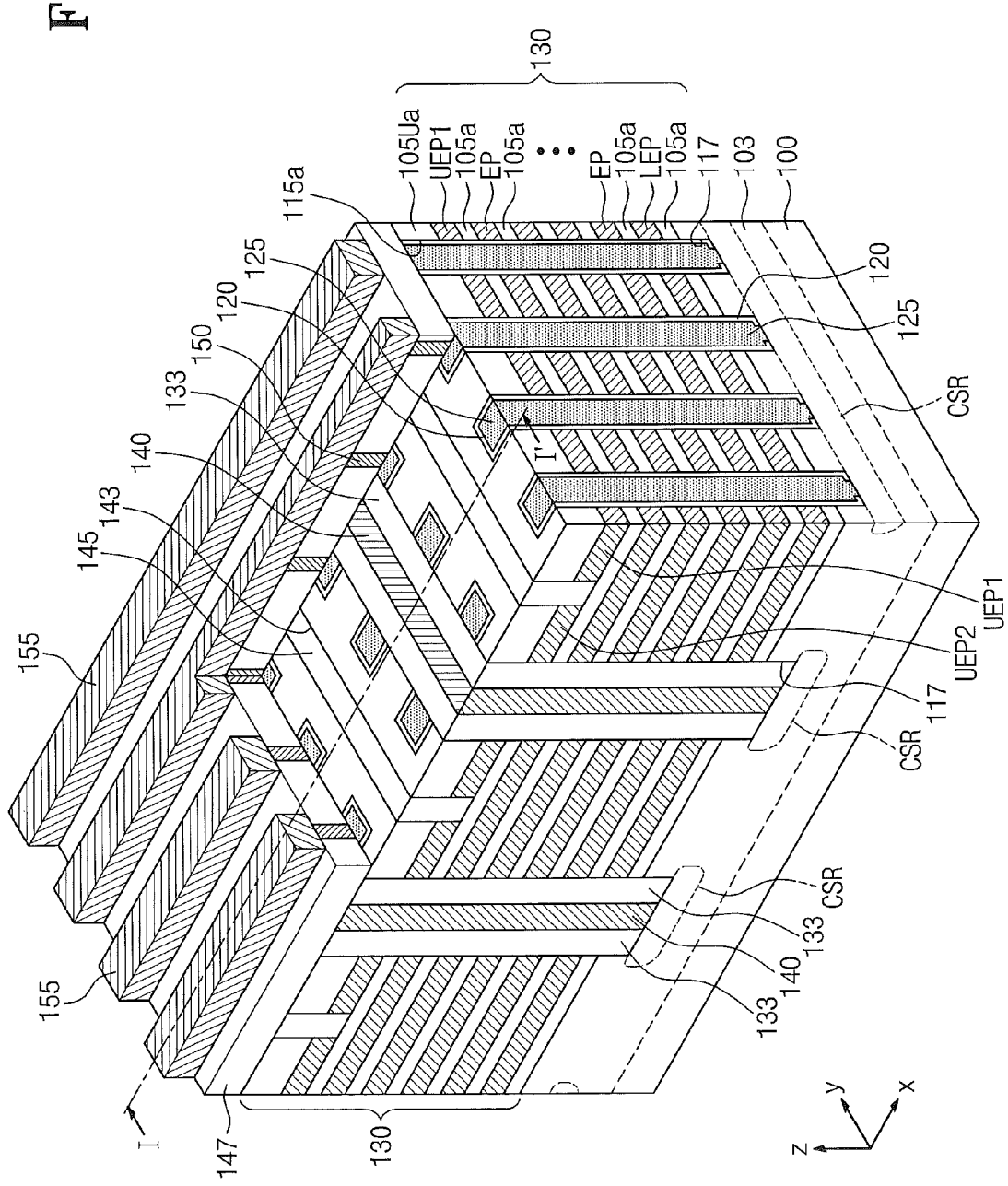
FIG. 1A is a perspective view illustrating a three dimensional semiconductor memory device according to some embodiments of the inventive concept.

The inventive concepts will now be described more fully hereinafter with reference to the accompanying drawings, in which exemplary embodiments of the inventive concept are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concept. In the drawings, embodiments of the inventive concept are not limited to the specific examples provided herein and are exaggerated for clarity. Like numbers indicate like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

Figure 1C:
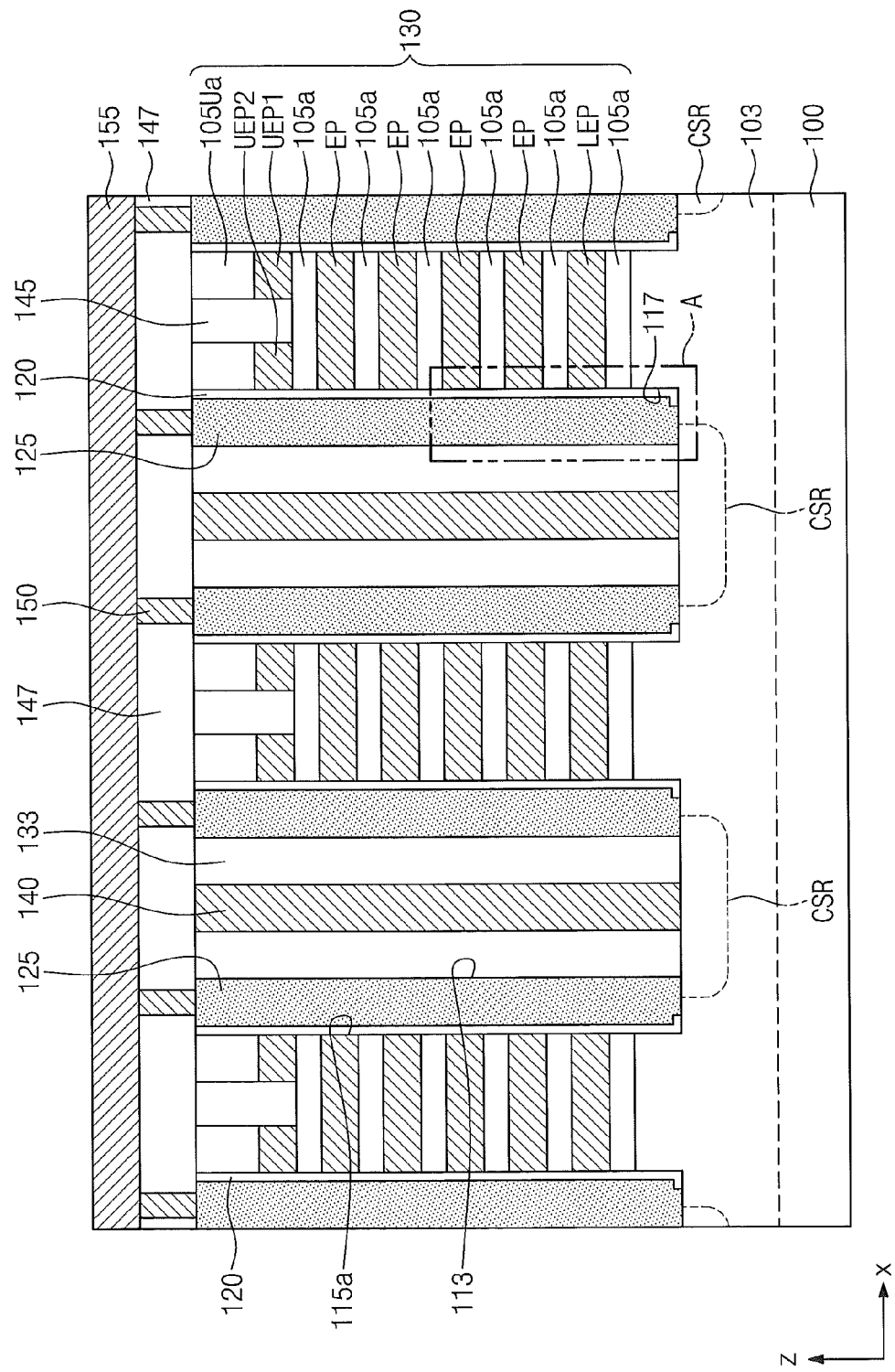
FIG. 1C is a cross sectional view taken along a line I-I' of FIG. 1A.
Figure 1D:
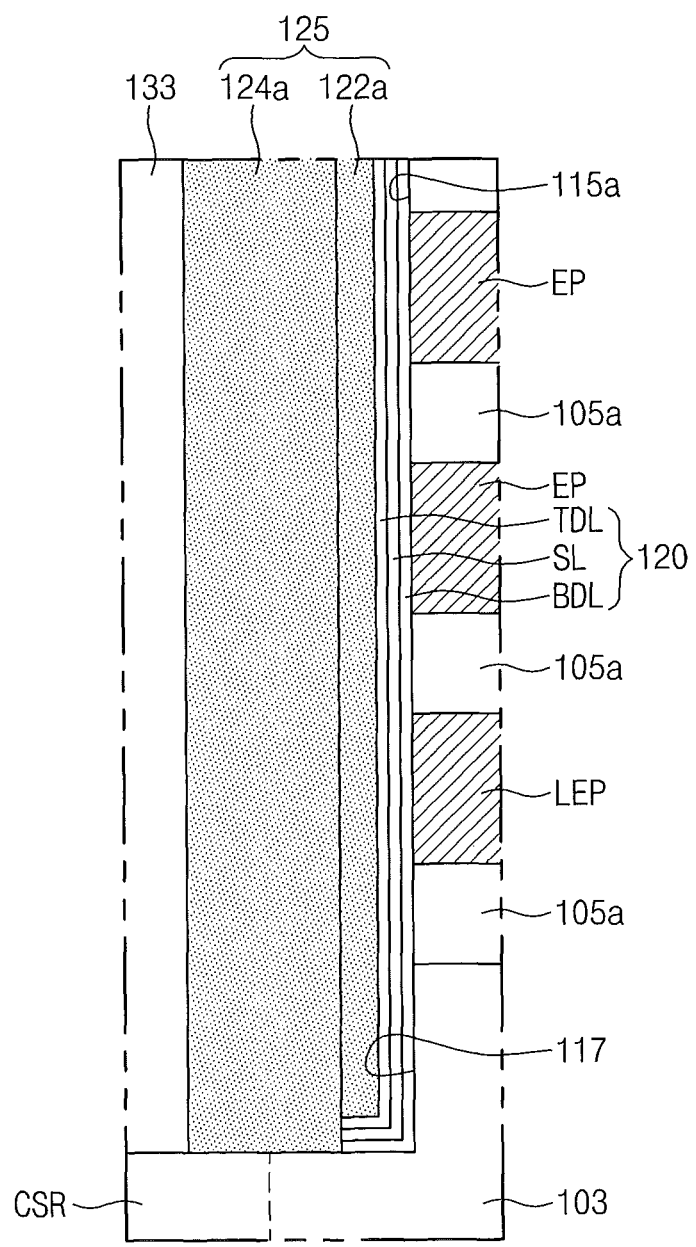
FIG. 1D is an enlarged view of a portion 'A' of FIG. 1C.

FIG. 1A is a perspective view illustrating a three dimensional semiconductor memory device according to some embodiments of the inventive concept, and FIG. 1B is a plan view illustrating the three dimensional semiconductor memory device shown in FIG. 1A. FIG. 1B illustrates to put emphasis on electrode patterns. FIG. 1C is a cross sectional view taken along a line I-I' of FIG. 1A, and FIG. 1D is an enlarged view of a portion 'A' of FIG. 1C.

Referring to FIGS. 1A, 1B and 1C, a well region 103 may be formed in a semiconductor substrate 100 (hereinafter, referred to as 'a substrate'). The well region 103 may be doped with dopants of a first conductivity type. A plurality of electrode structures 130 may be disposed on the substrate 100 and may be arranged along a first direction to be parallel with each other. The first direction may correspond to a Y-axis direction of FIG. 1A. The electrode structures 130 may be separated from each other by a predetermined space along a second direction substantially perpendicular to the first direction. The second direction may correspond to an X-axis direction of FIG. 1A. A trench 113 may be defined between the adjacent electrode structures 130.

Each of the electrode structures 130 may include insulating patterns 105a and 105Ua and conductive electrode patterns LEP, EP, UEP1 and UEP2 which are alternately and repeatedly stacked. Each of the insulating patterns 105a and 105Ua may include an oxide material. Each of the electrode patterns LEP, EP, UEP1 and UEP2 may include a doped semiconductor layer (e.g., a doped silicon layer, a doped germanium layer or a doped silicon-germanium layer), a metal layer (e.g., a tungsten layer, an aluminum layer or a copper layer), a conductive metal nitride layer (e.g., a titanium nitride layer, a tantalum nitride layer or a tungsten nitride layer) and/or a transition metal layer (e.g., a titanium layer or a tantalum layer).

A pair of vertical grooves 115a may be defined in opposite or opposing sidewalls of each of the electrode structures 130, respectively. Further, a pair of vertically extending active regions (also referred to herein as vertical active patterns 125) may be disposed in the pair of vertical grooves 115a, respectively. That is, the pair of vertical active patterns 125 may be disposed at both sides of each of the electrode structures 130. The pair of vertical active patterns 125 may be arrayed in the second direction to be located in a same row. The pair of vertical active patterns 125 respectively disposed at both sides of the electrode structure 130 may be repeatedly arrayed in the first direction, thereby being located in two different columns. Each of the vertical active patterns 125 may have a pillar shape extending from the substrate 100. In some embodiments, each of the vertical active patterns 125 may cover or extend along an entire inner surface of each of the vertical grooves 115a such that the conductive electrode patterns LEP, EP, UEP1 and UEP2 at least partially but do not completely surround the active patterns 125. Each of the opposite sidewalls of each electrode structure 130 may have an uneven or notched shape in a plan view because of the presence of the vertical grooves 115a, as illustrated in FIG. 1B.

The vertical groove 115a may vertically extend from a top end of the sidewall of the electrode structure 130 to a bottom end of the sidewall of the electrode structure 130. The sidewall of the electrode structure 130 may include a first portion which is substantially planar or flat in plan view and a second portion which is concave relative to the first portion in plan view, as illustrated in FIG. 1B. The vertical groove 115a may correspond to the second portion of the sidewall of the electrode structure 130.

In some embodiments, the vertical groove 115a may have a substantially rectangular shape in plan view, as illustrated in FIGS. 1A and 1B. However, the shape of the vertical groove 115a may not be limited to the embodiment illustrated in FIGS. 1A and 1B. That is, the vertical groove 115a may have a different shape from the rectangular shape in plan view. The vertical groove 115a may be defined by notched regions formed in one sidewalls of the insulating patterns 105a and 105Ua included in the electrode structure 130 and by notched regions formed in one sidewalls of the electrode patterns LEP, EP and UEP1 (or UEP2) included in the electrode structure 130. In more detail, the vertical groove 115a may be defined by notched regions of the insulating patterns 105a and 105Ua and notched regions of the electrode patterns LEP, EP and UEP1 (or UEP2) which are alternately and repeatedly stacked.

A data storing layer 120 may be disposed between the sidewall of the respective vertical active patterns 125 and the respective electrode patterns LEP, EP, UEP1 and UEP2. More specifically, the data storing layer 120 may be disposed between the sidewall of the respective vertical active patterns 125 and an inner surface of the notched region of the respective electrode patterns LEP, EP, UEP1 and UEP2. In some embodiments, the data storing layer 120 may vertically extend between the insulating patterns 105a and 105Ua and the sidewall of the respective vertical active patterns 125. That is, the data storing layer 120 may vertically extend between the inner surface of the vertical groove 115a and the sidewall of the vertical active patterns 125 located in the vertical groove 115a.

Each of the vertical active patterns 125 may constitute or define a vertical cell string. The vertical cell string may include a ground selection transistor, a plurality of cell transistors and at least one string selection transistor which are sequentially stacked. The transistors in the vertical cell string may include vertical channel regions defined in the vertical active pattern 125. At least a lowermost electrode pattern LEP of the electrode patterns may correspond to a gate electrode of the ground selection transistor, and at least an uppermost electrode pattern UEP1 or UEP2 of the electrode patterns may correspond to a gate electrode of the string selection transistor. At least some of the electrode patterns EP between the uppermost electrode pattern UEP1 or UEP2 and the lowermost electrode pattern LEP may correspond to gate electrodes of the cell transistors.

In the event that the pair of vertical active patterns 125 respectively disposed at both sides of the electrode structure 130 are arrayed in the second direction to be located in a single or same row, the pair of vertical active patterns 125 in the single or same row may be electrically connected to an interconnection 155. The interconnection 155 may correspond to a bit line. In this case, the uppermost electrode pattern used as the gate electrode of the string selection transistor may be divided into a first segment UEP1 and a second segment UEP2 which are laterally and electrically separated from each other. A separating region 143 may be defined between the adjacent first and second segments UEP1 and UEP2. The separating region 143 may upwardly extend to penetrate an uppermost insulating pattern 105Ua of the insulating patterns 105a and 105Ua. The separating region 143 may be filled with a separating dielectric pattern 145.

The first segment UEP1 of the uppermost electrode pattern may be coupled to the vertical active pattern 125 in the vertical groove 115a defined at one of the opposing sidewalls of the electrode structure 130, and the second segment UEP2 of the uppermost electrode pattern may be coupled to the vertical active pattern 125 in the vertical groove 115a defined at the other of the opposing sidewalls of the electrode structure 130. During operation of a three dimensional semiconductor memory device including the cell strings illustrated in FIGS. 1A to 1C, the first and second segments UEP1 and UEP2 may be controlled independently from each other. That is, the adjacent first and second segments UEP1 and UEP2 may be respectively included in a pair of cell strings which may respectively include the pair of vertical active patterns 125. Accordingly, the pair of vertical cell strings may share the electrode patterns EP and LEP which are used as gate electrodes of the cell transistors and the ground selection transistor. In some embodiments, at least one of the electrode patterns downwardly disposed under the uppermost electrode pattern may also be divided into a first segment and a second segment being laterally and electrically separated from each other.

Common source regions CSR may be disposed in the well region 103 at both sides of the electrode structures 130. That is, the common source regions CSR may be disposed under the trenches 113, respectively. The common source regions CSR may be doped with dopants of a second conductivity type. One of the first and second conductivity types may be a P-type, and the other of the first and second conductivity types may be an N-type. The vertical active patterns 125 arrayed in each column may be electrically connected to one of the common source regions CSR. For example, each of the vertical active patterns 125 may be in contact with one of the common source regions CSR and the well region 103 adjacent thereto, as illustrated in FIG. 1C. When the cell strings are under an operation mode, a reference voltage may be applied to the common source regions CSR.

A recessed region 117 may be formed in the substrate 100 under the respective trenches 113 and the vertical grooves 115a adjacent to the respective trenches 113. A bottom surface of the recessed region 117 may located at a lower level than a top surface of the substrate 100 under the electrode structure 130. The vertical active patterns 125 may downwardly extend into the recessed regions 117.

The vertical active patterns 125 and the data storing layer 120 will be described in more detail with reference to FIG. 1D.

Referring to FIGS. 1A to 1D, the vertical active pattern 125 may be in contact with a bottom surface of the recessed region 117. In some embodiments, the vertical active pattern 125 may be in contact with the well region 103 and the common source regions CSR by the bottom surface of the recessed region 117. For example, a first portion and a second portion of the bottom surface of each vertical active pattern 125 may be in contact with the common source region CSR and the well region 103, respectively. In some embodiments, the vertical active patterns 125 may be spaced apart from an inner sidewall of the recessed region 117 by the data storing layers 120.

Each of the vertical active patterns 125 may include a first active portion 122a and a second active portion 124a. The first active portion 122a may be disposed between the second active portion 124a and the data storing layer 120. The first active portion 122a may be spaced apart from the inner surface of the recessed region 117 by the data storing layer 120. The second active portion 124a may be in contact with a sidewall of the first active portion 122a and the bottom surface of the recessed region 117.

Each of the vertical active patterns 125 may include a semiconductor material (e.g., silicon, germanium or silicon-germanium). The vertical active patterns 125 may be doped with dopants of the first conductivity type or may not be doped with dopants to have an undoped state corresponding to an intrinsic state. The vertical active patterns 125 may have a crystalline state. For example, the vertical active patterns 125 may have a single crystalline state or a polycrystalline state. That is, the first and second active portions 122a and 124a may include a semiconductor material and may have the first conductivity type or an undoped state. In addition, the first and second active portions 122a and 124a may have a single crystalline state or a polycrystalline state.

The data storing layer 120 may include a tunnel dielectric layer TDL, a charge storage layer SL and a blocking dielectric layer BDL. The tunnel dielectric layer TDL may be adjacent to the vertical active pattern 125, and the blocking dielectric layer BDL may be adjacent to the electrode patterns LEP, EP, UEP1 and UEP2. The charge storage layer SL may be disposed between the tunnel dielectric layer TDL and the blocking dielectric layer BDL. The tunnel dielectric layer TDL may include an oxide material and/or an oxynitride material. The charge storage layer SL may include a material which is capable of storing charges. In some embodiments, the charge storage layer SL may include a trap dielectric material having traps which are capable of storing charges. For example, the charge storage layer SL may include a nitride material and/or a metal oxide material (e.g., a hafnium oxide layer). The blocking dielectric layer BDL may include a high-k dielectric layer (e.g., a metal oxide layer such as a hafnium oxide layer and/or an aluminum oxide layer) having a dielectric constant higher than that of the tunnel dielectric layer TDL. In addition, the blocking dielectric layer BDL may further include a barrier dielectric layer (e.g., an oxide layer) having an energy band gap greater than that of the high-k dielectric layer. In the event that the blocking dielectric layer BDL may include the high-k dielectric layer and the barrier dielectric layer, the high-k dielectric layer may be adjacent to the electrode patterns LEP, EP, UEP1 and UEP2 and the barrier dielectric layer may be disposed between the high-k dielectric layer and the charge storage layer SL.

Subsequently, referring to FIGS. 1A to 1C, a pair of sidewall insulating patterns 133 may be disposed on both inner sidewalls of the trench 113, respectively. That is, the sidewall insulating patterns 133 may be disposed on both the opposite sidewalls of the electrode structure 130, respectively. The sidewall insulating patterns 133 may extend in parallel along the sidewalls of the trench 113 in the first direction. The vertical active patterns 125 may be in contact with the sidewall insulating patterns 133. For example, each of the vertical active patterns 125 may include an inner sidewall contacting the data storing layer 120 in the vertical groove 115a and an outer sidewall contacting the sidewall insulating pattern 133. The sidewall insulating patterns 133 may include an oxide material, a nitride material and/or an oxynitride material.

A contact conductive pattern 140 may be disposed between the pair of sidewall insulating patterns 133 in each trench 113. The contact conductive patterns 140 may be connected to the common source regions CSR, respectively. Each of the contact conductive patterns 140 may have a linear shape extending in the first direction when viewed from a plan view. Each of the contact conductive patterns 140 may include a metal (e.g., tungsten, copper or aluminum), a conductive metal nitride (e.g., a titanium nitride, a tantalum nitride or a tungsten nitride) and/or a transition metal (e.g., titanium or tantalum).

In some embodiments, the pair of sidewall insulating patterns 133 in each trench 113 may extend in the second direction to substantially fill the trench 113 therebetween. In this case, each of the contact conductive patterns 140 may penetrate or extend through the sidewall insulating patterns 133 filling the trench 113 to have a pillar shape. The pillar-shaped contact conductive patterns 140 may be in contact with the common source regions CSR.

An interlayer dielectric layer 147 may be disposed on a surface of the substrate including the electrode structures 130, the sidewall insulating patterns 133 and the contact conductive patterns 140. The interlayer dielectric layer 147 may include an oxide material. A plurality of interconnections 155 may be disposed on the interlayer dielectric layer 147. The interconnections 155 may extend in parallel in the second direction. Each of the interconnections 155 may be electrically connected to upper ends of the vertical active patterns 125 arrayed in a single or same row along the second direction. The interconnections 155 may be electrically connected to upper ends of the vertical active patterns 125 through contact plugs 150 penetrating or extending through the interlayer dielectric layer 147. In some embodiments, a plurality of drain regions doped with dopants of the second conductivity type may be formed in the upper ends of the vertical active patterns 125, respectively. The contact plugs 150 may be electrically connected to the drain regions, respectively. A level of bottom surfaces of the drain regions may be located near a level of bottom surfaces of the uppermost insulating patterns 105Ua.

Each of the contact plugs 150 and the interconnections 155 may include a conductive material. For example, each of the contact plugs 150 and the interconnections 155 may include a metal (e.g., tungsten, copper or aluminum), a conductive metal nitride (e.g., a titanium nitride, a tantalum nitride or a tungsten nitride) and/or a transition metal (e.g., titanium or tantalum). The contact plugs 150 may include the same conductive material as the interconnections 155 or may include a different conductive material from the interconnections 155.

According to the three dimensional semiconductor memory devices set forth above, each of the vertical active patterns 125 may be disposed in the vertical groove 115a defined by a portion of one sidewall of the electrode structure 130. Thus, the vertical active pattern 125 may be directly connected to the common source region CSR disposed at one side of the electrode structure 130. That is, distances between the channel regions in the vertical active pattern 125 and the common source region CSR thereunder may be reduced and/or minimized in an operation mode of the three dimensional semiconductor memory device. As a result, a high reliable three dimensional semiconductor memory device may be realized.

In addition, the vertical active patterns 125 may be connected to the well regions 103. Thus, the erasure efficiency of the cell transistors may be enhanced. For example, an erasure voltage applied to the well regions 103 may be supplied to the channel regions in the vertical active patterns 125 with a minimum voltage drop during an erasure mode. Furthermore, each electrode structure 130 may be supported by the plurality of vertical active patterns 125 disposed at both sides of the electrode structure 130. Thus, a leaning phenomenon of the electrode structure 130 may be significantly suppressed. Accordingly, a high reliable and highly integrated three dimensional semiconductor memory device may be realized.

Modified embodiments of the three dimensional semiconductor memory device according to the above embodiment will be described hereinafter with reference to the drawings.

Figure 2A:
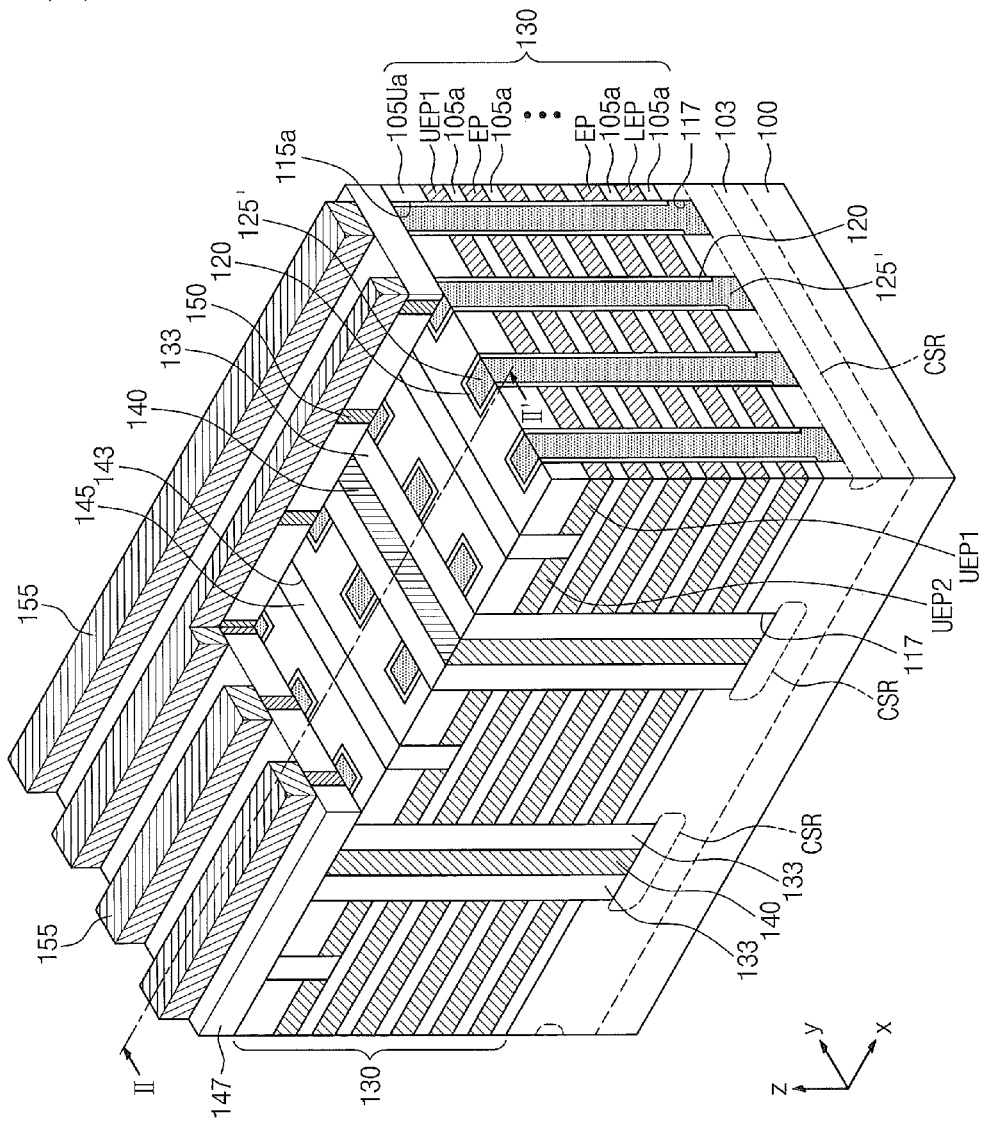
FIG. 2A is a perspective view illustrating a modified embodiment of a three dimensional semiconductor memory device according to some embodiments of the inventive concept.
Figure 2B:
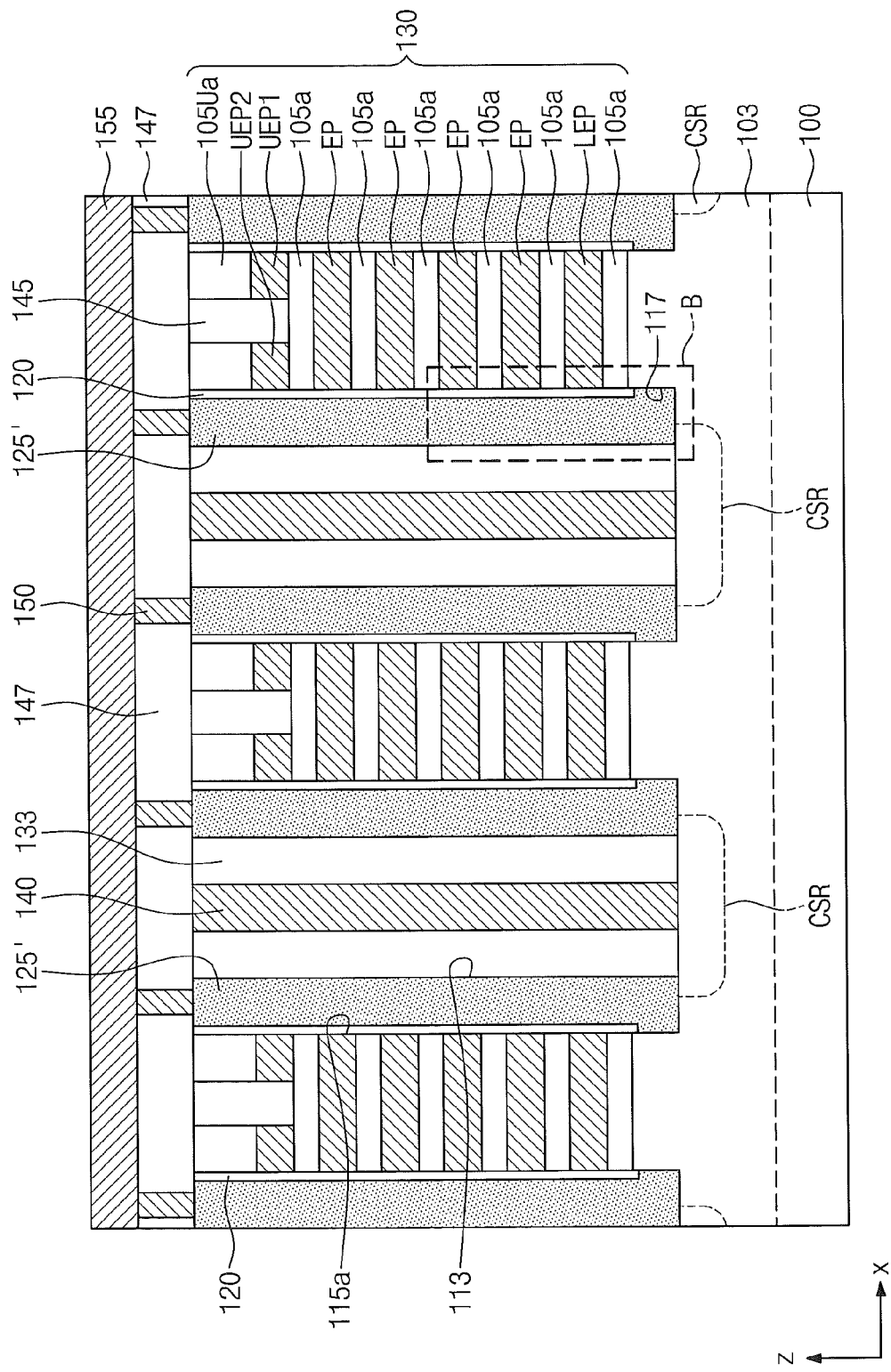
FIG. 2B is a cross sectional view taken along a line II-II' of FIG. 2A.
Figure 2C:
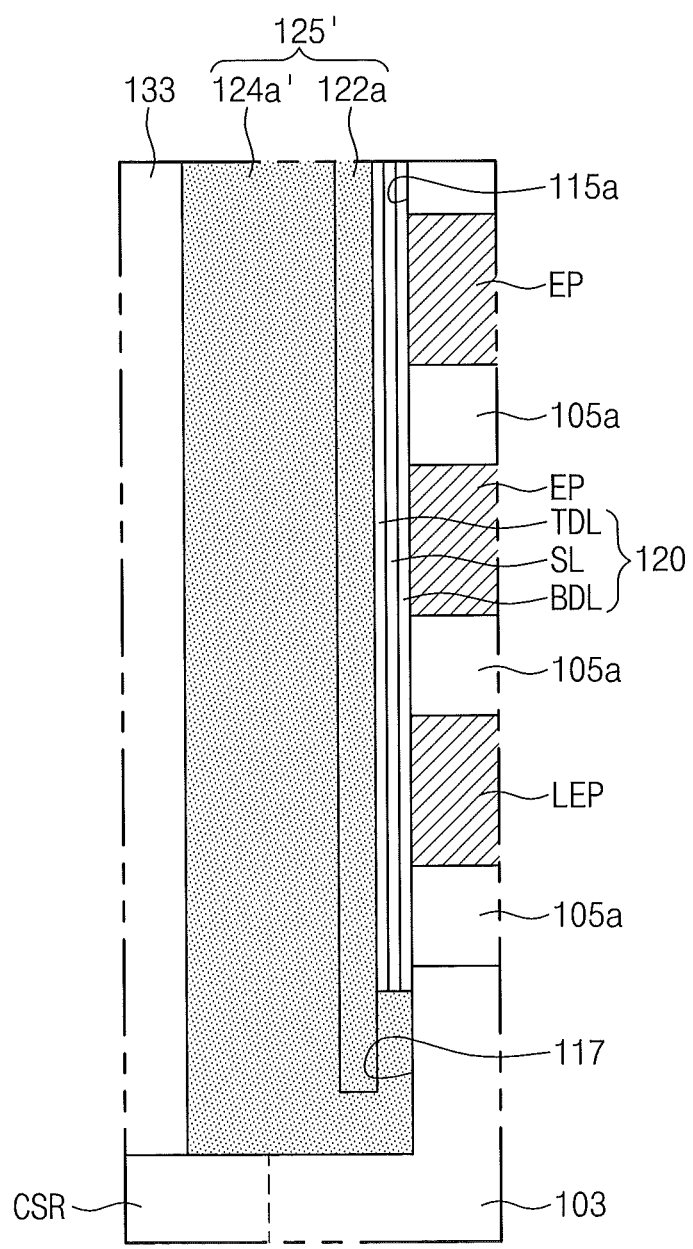
FIG. 2C is an enlarged view of a portion 'B' of FIG. 2B.

FIG. 2A is a perspective view illustrating a modified embodiment of a three dimensional semiconductor memory device according to some embodiments of the inventive concept, and FIG. 2B is a cross sectional view taken along a line II-II' of FIG. 2A. FIG. 2C is an enlarged view of a portion 'B' of FIG. 2B.

Referring to FIGS. 2A, 2B and 2C, a vertical active pattern 125' may be in contact with the bottom surface and the inner sidewall of each recessed region 117 located under the vertical groove 115a. In more detail, as illustrated in FIG. 2C, a lower end of the data storing layer 120 in the recessed region 117 may be located at a higher level than the bottom surface of the recessed region 117. Thus, at least a portion of the inner sidewall of the recessed region 117 may not be covered with the data storing layer 120. The vertical active pattern 125' may include a first active portion 122a and a second active portion 124a'. The first active portion 122a may be disposed between the second active portion 124a' and the data storing layer 120. The second active portion 124a' may be in contact with the first active portion 122a. Further, the second active portion 124a' may be in contact with the bottom surface and the inner sidewall of each recessed region 117. The second active portion 124a' may be in contact with the portion of the inner sidewall of the recessed region 117, which is not covered with the data storing layer 120.

The vertical active pattern 125' may be in contact with the well region 103 through the inner sidewall of the recessed region 117 and a portion of the bottom surface of the recessed region 117. That is, the well region 103 may be in contact with a portion of the bottom surface of the vertical active pattern 125' and a part of the vertical active pattern 125' contacting the inner sidewall of the recessed region 117. The other portion of the bottom surface of the vertical active pattern 125' may be in contact with the common source region CSR. The vertical active patterns 125' may be formed of the same material as the vertical active patterns 125 illustrated in FIGS. 1A to 1D.

Figure 3:
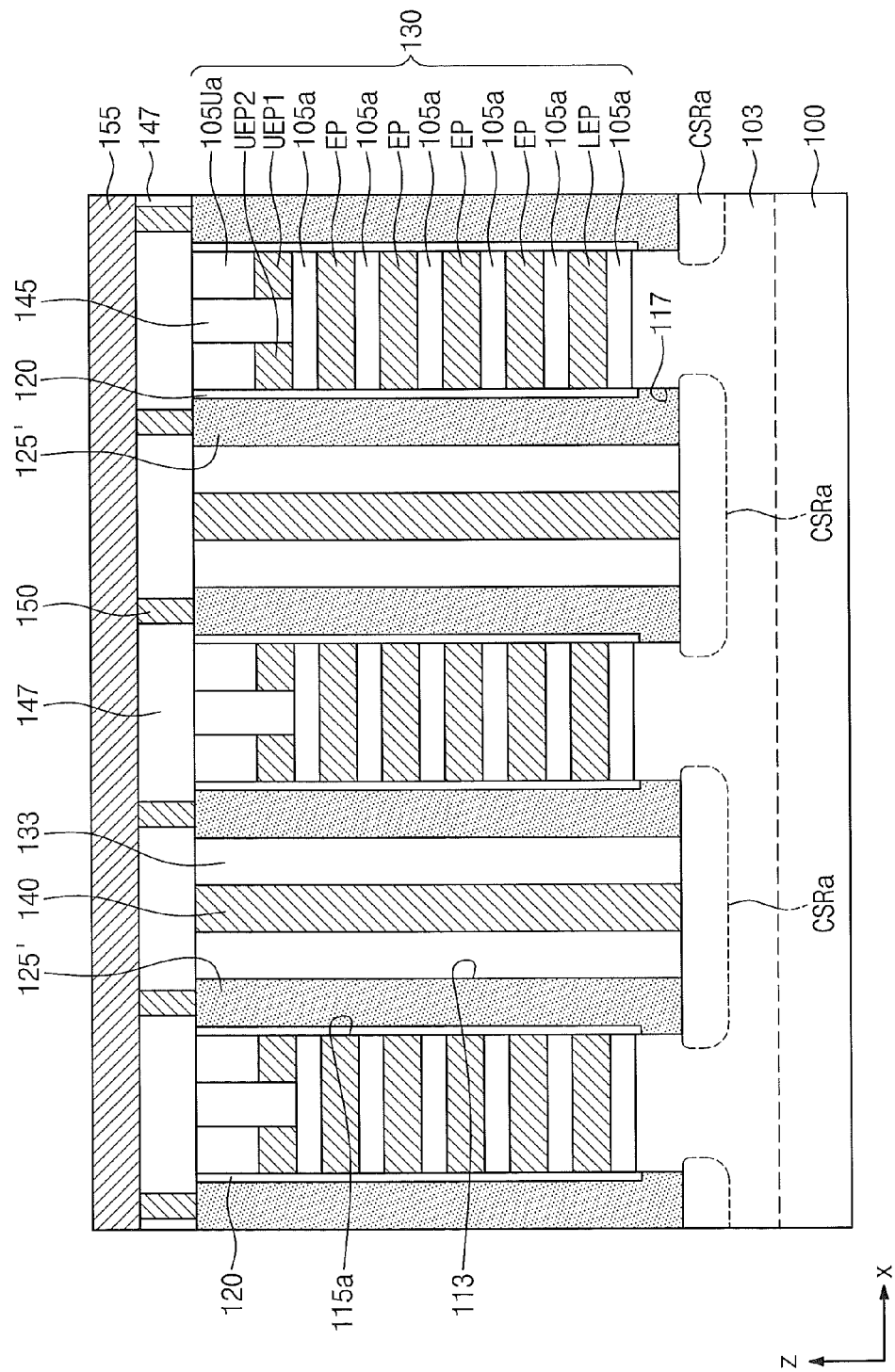
FIG. 3 is a cross sectional view taken along a line II-II' of FIG. 2A to illustrate another modified embodiment of a three dimensional semiconductor memory device according to some embodiments of the inventive concept.

FIG. 3 is a cross sectional view taken along a line II-II' of FIG. 2A to illustrate another modified embodiment of a three dimensional semiconductor memory device according to some embodiments of the inventive concept.

Referring to FIG. 3, each of common source regions CSRa in the present modified embodiment may be wider than the common source region CSR illustrated in FIG. 2B, thereby covering an entire bottom surface of the recessed region 117. In this case, an entire bottom surface of the vertical active pattern 125' may be in contact with the common source region CSRa, and a portion of the vertical active pattern 125' contacting the inner sidewall of the recessed region 117 may be in contact with the well region 103.

Figure 4A:
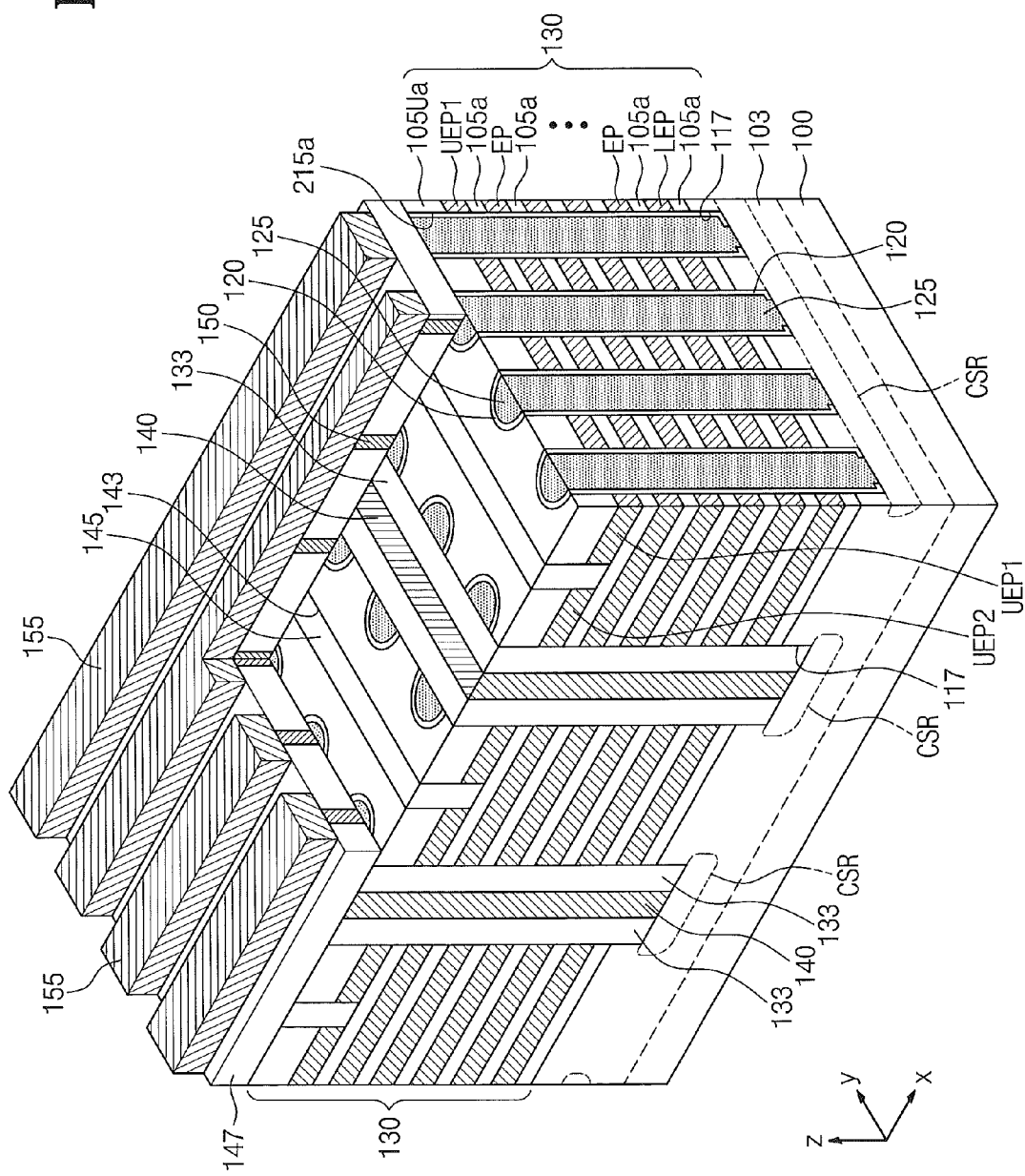
FIG. 4A is a perspective view illustrating still another modified embodiment of a three dimensional semiconductor memory device according to some embodiments of the inventive concept.

FIG. 4A is a perspective view illustrating still another modified embodiment of a three dimensional semiconductor memory device according to some embodiments of the inventive concept, and FIG. 4B is a plan view illustrating the three dimensional semiconductor memory device shown in FIG. 4A.

Referring to FIGS. 4A and 4B, each of vertical grooves 215a defined by the sidewalls of the electrode structures 130 may have a rounded shape in a plan view. The vertical active patterns 125 may be disposed in the vertical grooves 215a, respectively. Each of the inner sidewalls of the vertical active patterns 125 adjacent to the data storing layers 120 may also have a rounded shape due to the shape of vertical grooves 215a when viewed from a plan view. Meanwhile, each of the outer sidewalls of the vertical active patterns 125 adjacent to the sidewall insulating patterns 133 may have a substantially planar or flat shape in plan view. Accordingly, the vertical active patterns 125 may have substantially a half columnar shape. However, the present inventive concept is not limited to the present modified embodiment set forth above.

Figure 5A:
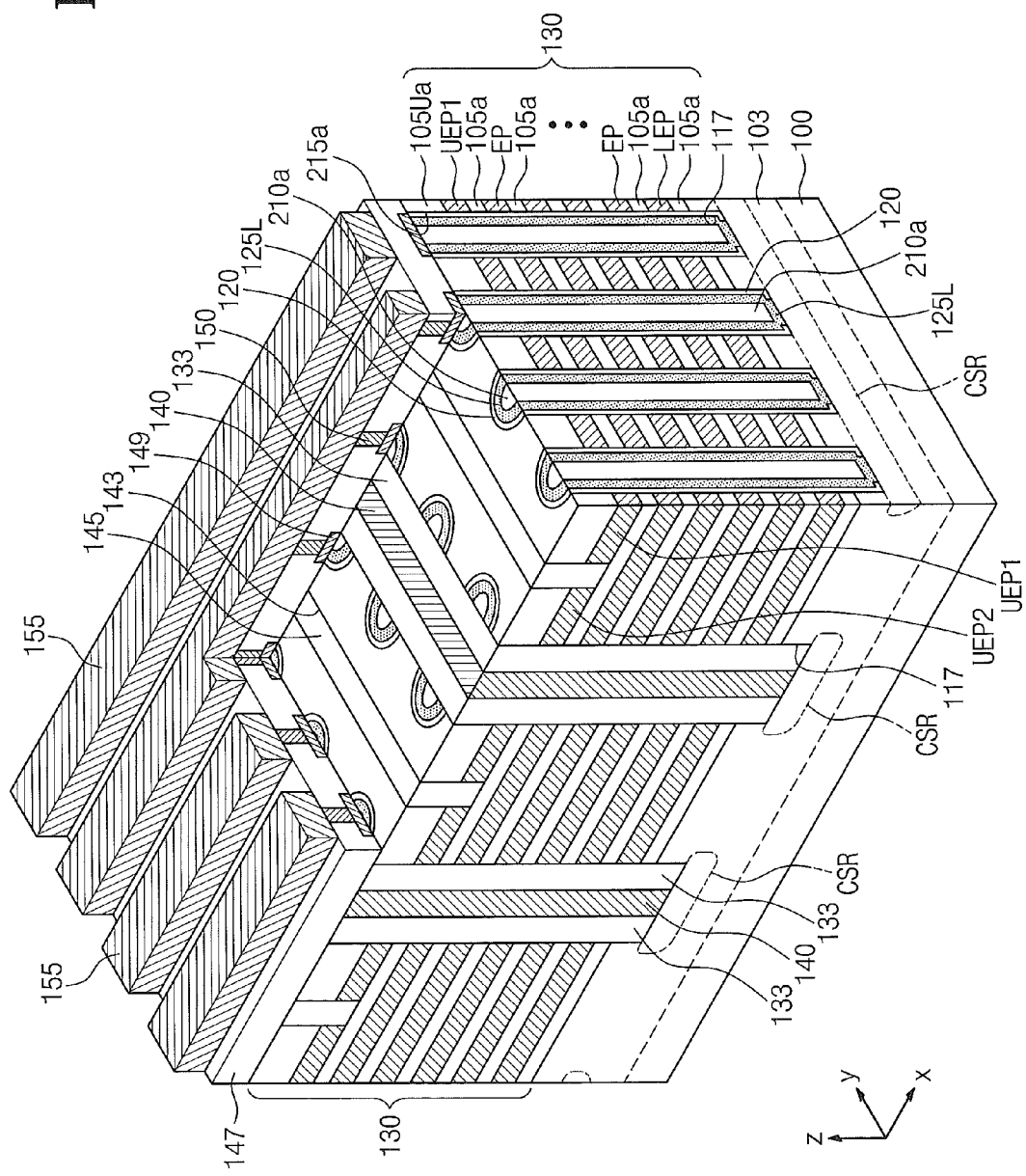
FIG. 5A is a perspective view illustrating yet another modified embodiment of a three dimensional semiconductor memory device according to some embodiments of the inventive concept.

FIG. 5A is a perspective view illustrating yet another modified embodiment of a three dimensional semiconductor memory device according to some embodiments of the inventive concept, and FIG. 5B is a plan view illustrating the three dimensional semiconductor memory device shown in FIG. 5A.

Referring to FIGS. 5A and 5B, the three dimensional semiconductor memory device according to the present modified embodiment may include vertical active patterns 125L, and each of the vertical active patterns 125L may fill a portion of the respective vertical grooves 215a. The vertical active pattern 125L may be conformably disposed along an inner surface of the vertical groove 215a. For example, the vertical active pattern 125L may have substantially a uniform thickness along the inner surface of the vertical groove 215a. Each of the vertical active patterns 125L may have a rounded inner sidewall and a rounded outer sidewall due to the shape of the vertical grooves 215a. The inner sidewalls of the vertical active patterns 125L may be adjacent to the data storing layers 120. According to the present modified embodiment, filling dielectric patterns 210a may be disposed in the vertical grooves 215a, respectively. Outer sidewalls of the vertical active patterns 125L may be adjacent to the filling dielectric patterns 210a. That is, vertical active patterns 125L may be disposed between the data storing layers 120 and the filling dielectric patterns 210a. For example, each of the vertical active patterns 125L may have a half hollow cylindrical shape.

The filling dielectric patterns 210a may contact the sidewall insulating patterns 133. Further, the vertical active patterns 125L may also contact the sidewall insulating patterns 133. Each of the filling dielectric patterns 210a may include an oxide material, a nitride material and/or an oxynitride material. The vertical active patterns 125L may be formed of the same material as the vertical active patterns 125 illustrated in FIGS. 1A to 1D.

In the present modified embodiment, conductive pads 149 may be disposed between the vertical active patterns 125L and the contact plugs 150. The conductive pads 149 may increase an alignment margin between the vertical active patterns 125L and the contact plugs 150. Each of the conductive pads 149 may include at least one of a conductive metal nitride (e.g., a titanium nitride or a tantalum nitride), a metal (e.g., tungsten), a transition metal (e.g., titanium or tantalum) and a doped semiconductor (e.g., a doped silicon).

Figure 6A:
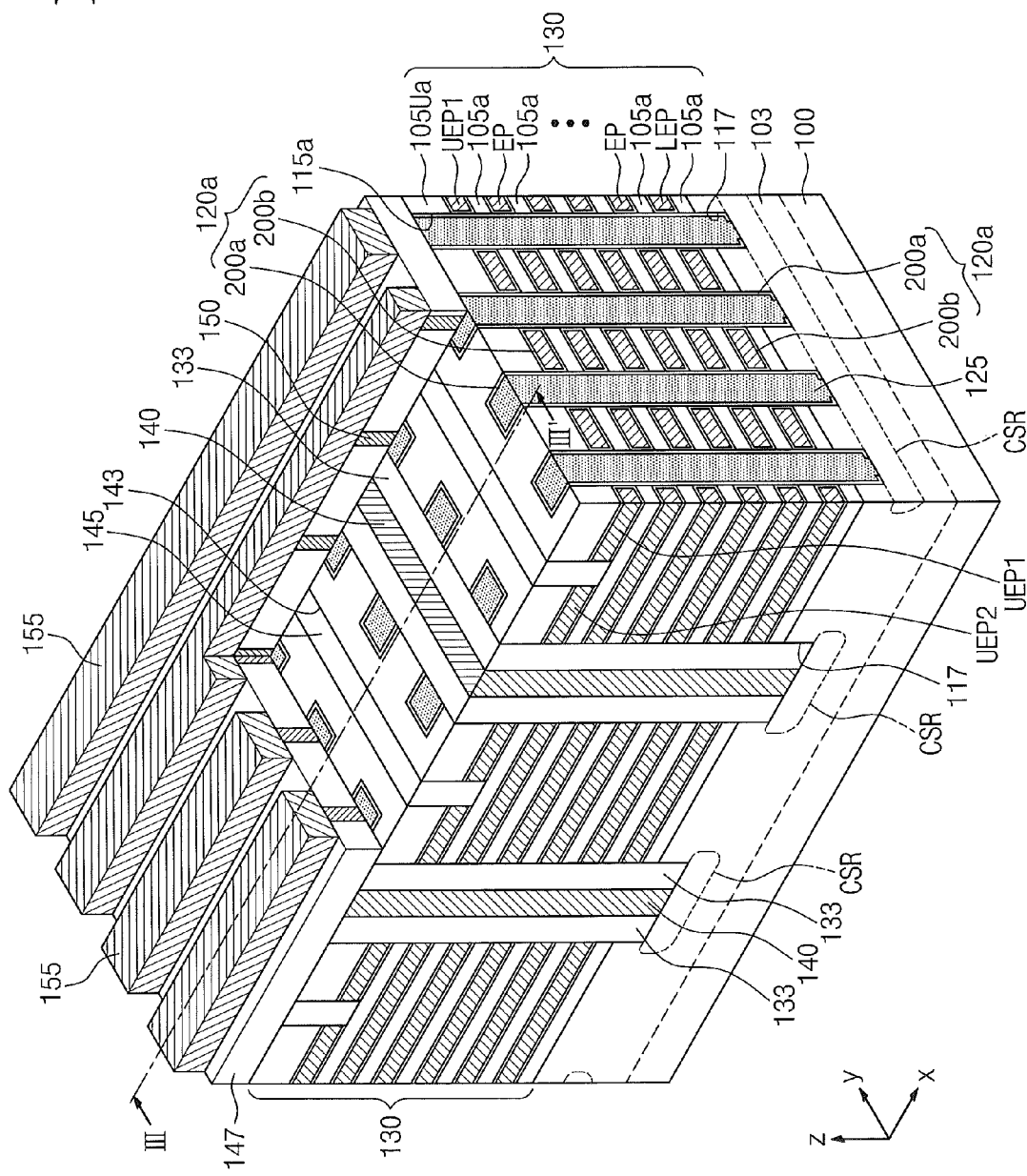
FIG. 6A is a perspective view illustrating still yet another modified embodiment of a three dimensional semiconductor memory device according to some embodiments of the inventive concept.
Figure 6B:
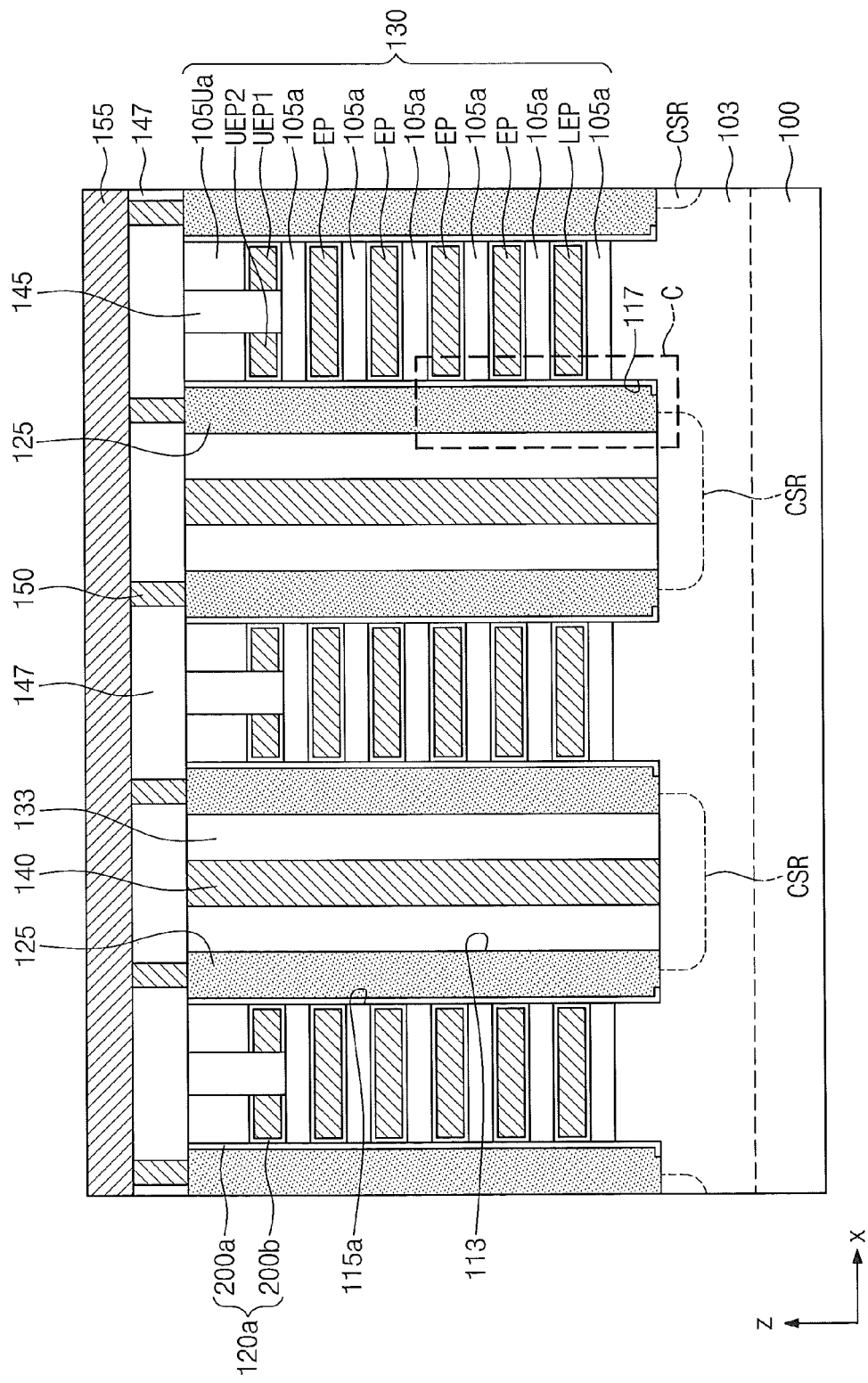
FIG. 6B is a cross sectional view taken along a line III-III' of FIG. 6A.
Figure 6C:
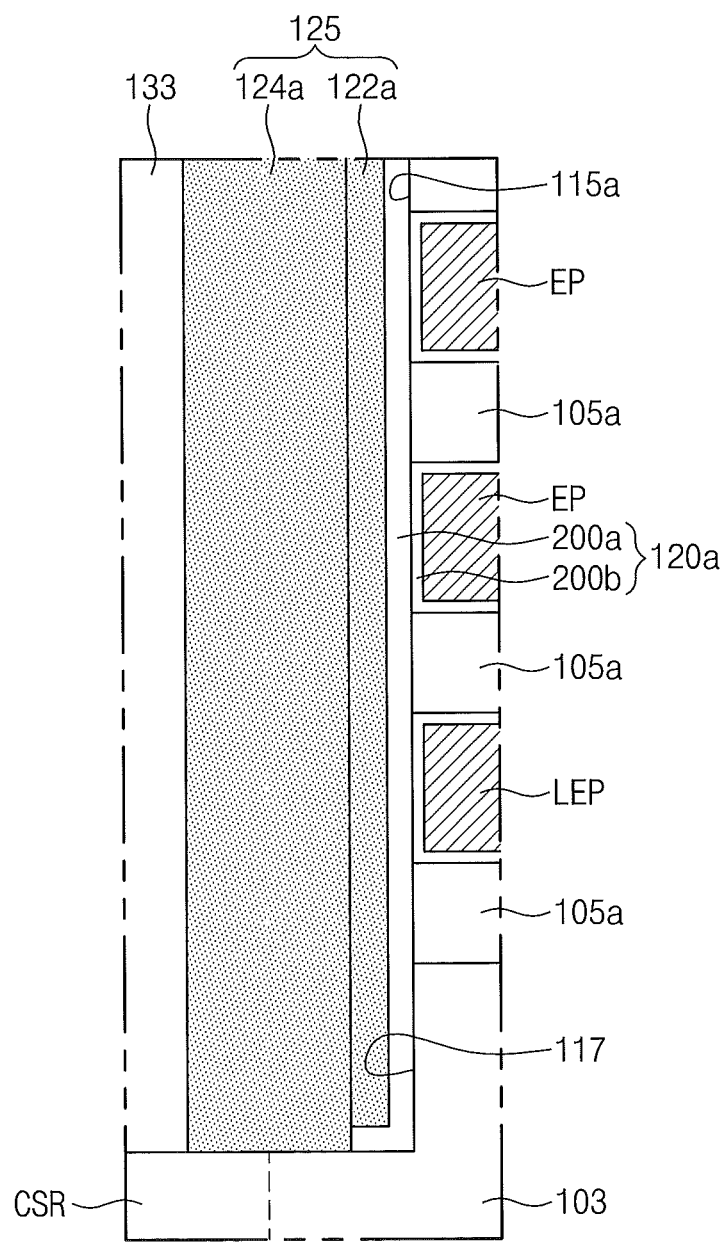
FIG. 6C is an enlarged view of a portion of FIG. 6B.

FIG. 6A is a perspective view illustrating still yet another modified embodiment of a three dimensional semiconductor memory device according to some embodiments of the inventive concept, and FIG. 6B is a cross sectional view taken along a line III-III' of FIG. 6A. FIG. 6C is an enlarged view of a portion 'C' of FIG. 6B.

Referring to FIGS. 6A, 6B and 6C, each of data storing layers 120a between the electrode patterns LEP, EP, UEP1 and UEP2 and sidewalls of the vertical active patterns 125 may include a first portion 200a and a second portion 200b. The first portion 200a of the data storing layer 120a may vertically extend between the insulating patterns 105a and 105Ua and the sidewall of the vertical active pattern 125 partially surrounded by the insulating patterns 105a and 105Ua. The second portion 200b of the data storing layer 120a may horizontally extend to cover top surfaces and bottoms surfaces of the electrode patterns LEP, EP, UEP1 and UEP2 located between the insulating patterns 105a and 105Ua.

Each of the data storing layers 120a may include a tunnel dielectric layer, a charge storage layer and a blocking dielectric layer, like the data storing layer 120 illustrated in FIG. 1D. The tunnel dielectric layer, the charge storage layer and the blocking dielectric layer of the data storing layer 120a may be formed of the same material layers as the tunnel dielectric layer TDL, the charge storage layer SL and the blocking dielectric layer BDL of the data storing layer 120 illustrated in FIG. 1D, respectively. The tunnel dielectric layers of the data storing layers 120a may be adjacent to the vertical active patterns 125, and the blocking dielectric layers of the data storing layers 120a may be adjacent to the electrode patterns LEP, EP, UEP1 and UEP2.

The first portion 200a of the respective data storing layers 120a may include at least a portion of the tunnel dielectric layer. The second portion 200b of the respective data storing layers 120a may include at least a portion of the blocking dielectric layer. Any one of the first and second portions 200a and 200b may include the charge storage layer. For example, the first portion 200a may include the tunnel dielectric layer and the charge storage layer, and the second portion 200b may include the blocking dielectric layer. In this case, the tunnel dielectric layer may be disposed between the charge storage layer and the vertical active pattern 125.

Additionally or alternatively, the first portion 200a may include the tunnel dielectric layer, the charge storage layer and a barrier dielectric layer of the blocking dielectric layer, and the second portion 200b may include a high-k dielectric layer of the blocking dielectric layer. In this case, the tunnel dielectric layer may be disposed between the charge storage layer and the vertical active pattern 125, and the charge storage layer may be disposed between the tunnel dielectric layer and the barrier dielectric layer.

However, the data storing layer 120a including the first and second portions 200a and 200b is not limited to the above descriptions. For example, the data storing layer 120a may include first and second portions having different combinations from the first and second portions 200a and 200b.

Figure 7A:
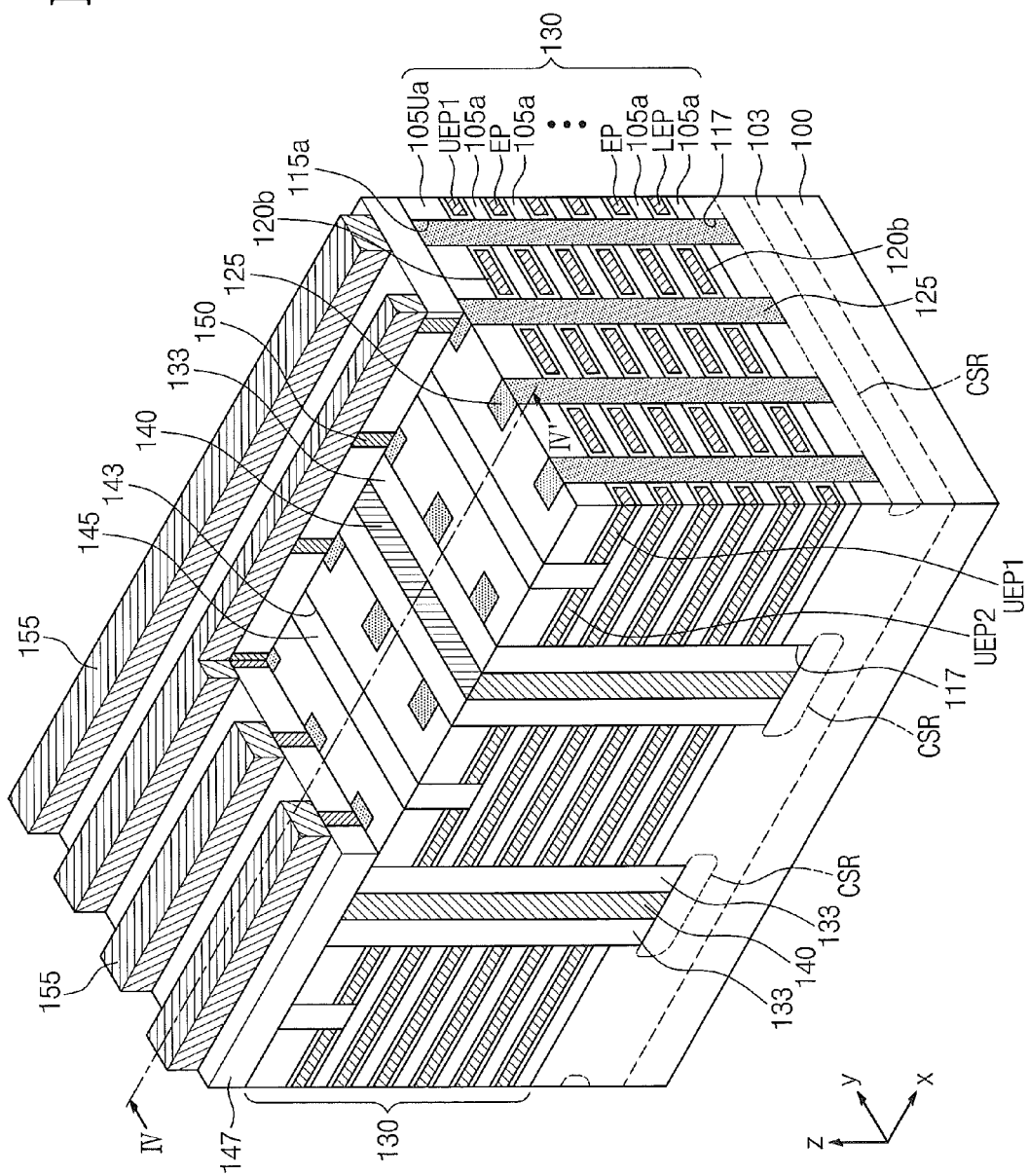
FIG. 7A is a perspective view illustrating a further modified embodiment of a three dimensional semiconductor memory device according to some embodiments of the inventive concept.
Figure 7B:
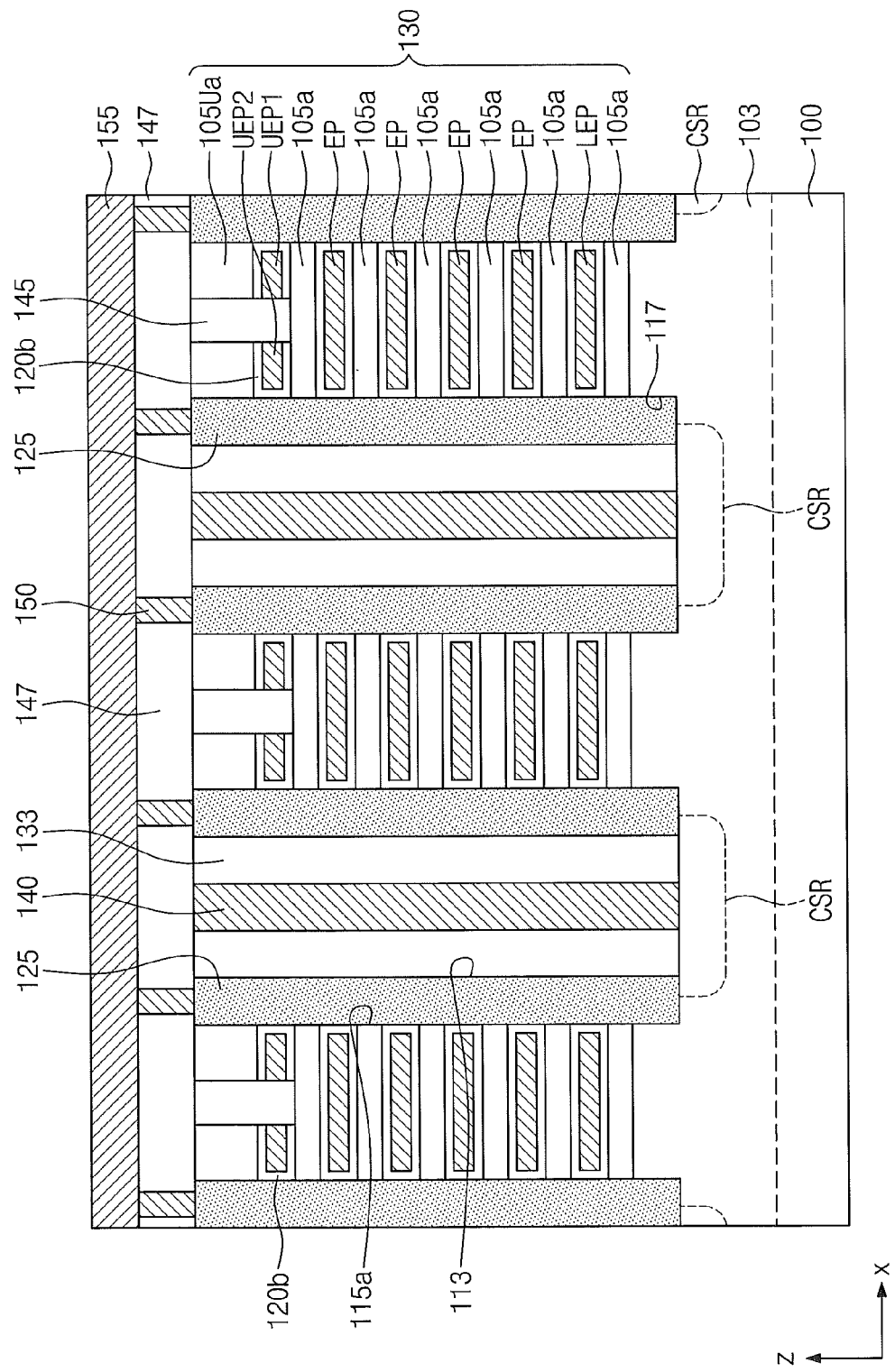
FIG. 7B is a cross sectional view taken along a line IV-IV' of FIG. 7A.

FIG. 7A is a perspective view illustrating a further modified embodiment of a three dimensional semiconductor memory device according to some embodiments of the inventive concept, and FIG. 7B is a cross sectional view taken along a line IV-IV' of FIG. 7A.

Referring to FIGS. 7A and 7B, data storing layers 120b may be disposed between the electrode patterns LEP, EP, UEP1 and UEP2 and the sidewalls of the vertical active patterns 125. Each of the data storing layers 120b may also include a tunnel dielectric layer, a charge storage layer and a blocking dielectric layer. All of the tunnel dielectric layer, the charge storage layer and the blocking dielectric layer constituting the data storing layer 120b may horizontally extend to contact or cover the top surface and the bottom surface of the respective electrode patterns LEP, EP, UEP1 and UEP2. The tunnel dielectric layer, the charge storage layer and the blocking dielectric layer of the data storing layer 120b may be formed of the same material layers as the tunnel dielectric layer TDL, the charge storage layer SL and the blocking dielectric layer BDL of the data storing layer 120 illustrated in FIG. 1D, respectively.

Figure 8A:
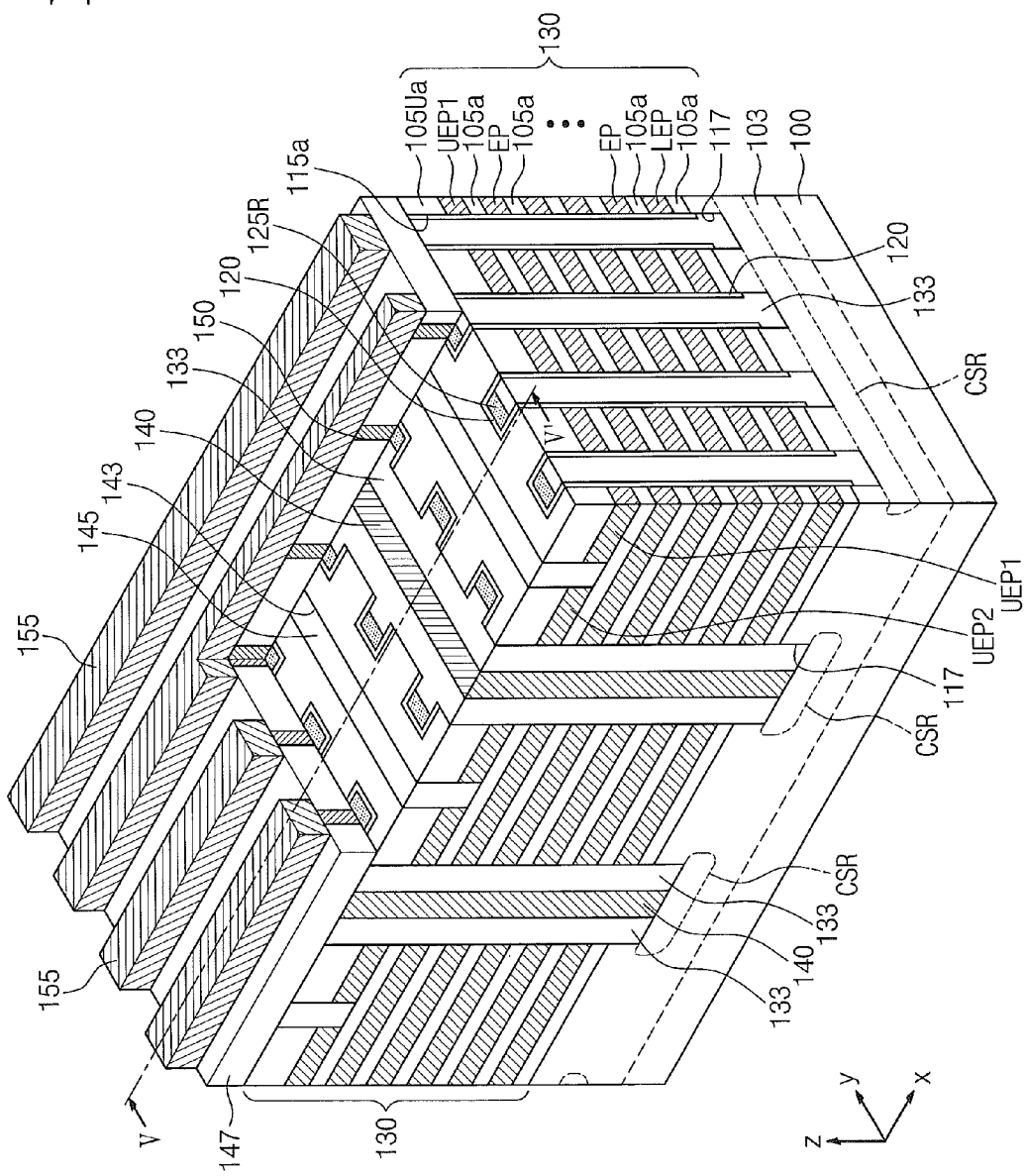
FIG. 8A is a perspective view illustrating a still further modified embodiment of a three dimensional semiconductor memory device according to some embodiments of the inventive concept.
Figure 8B:
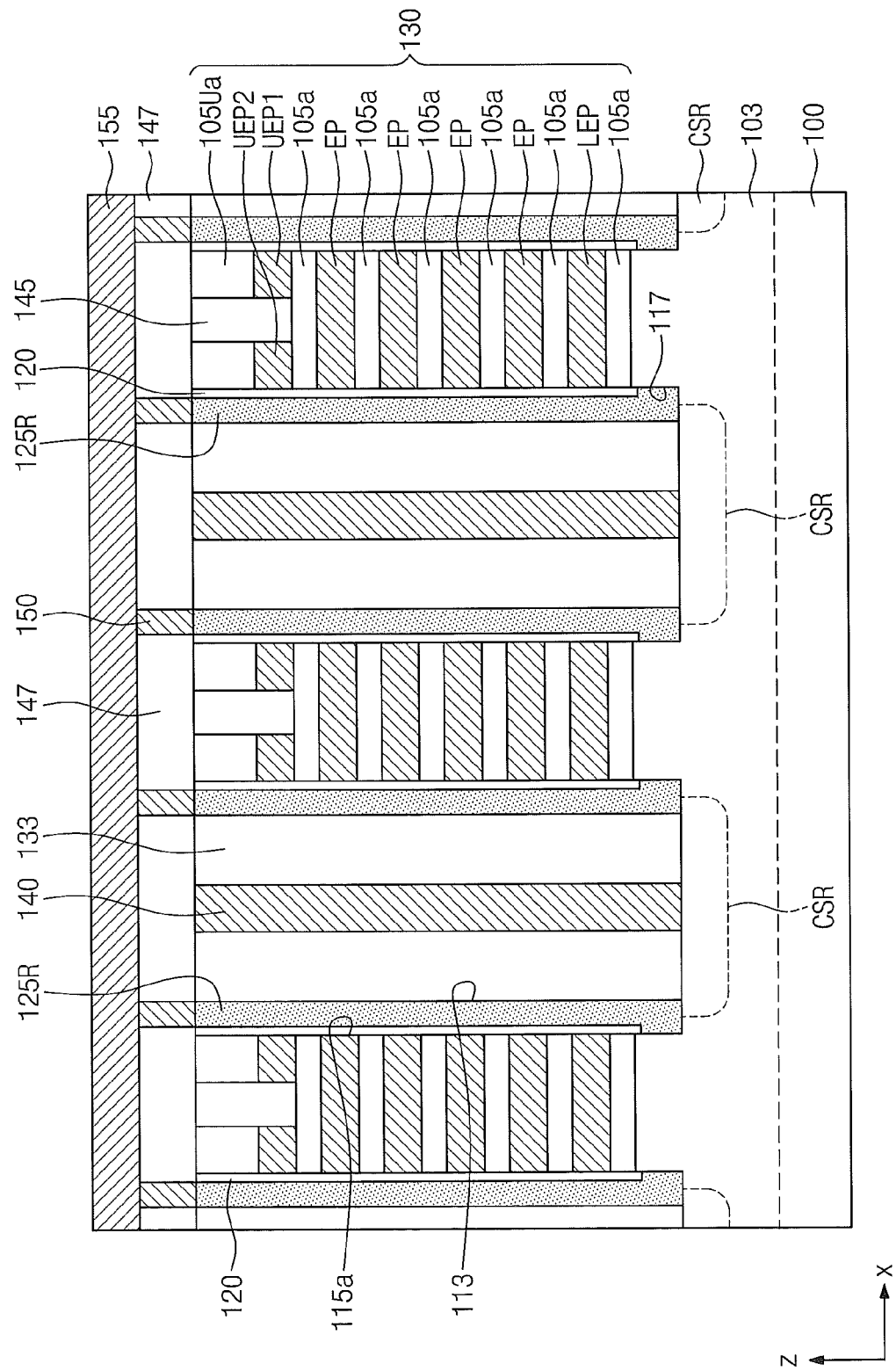
FIG. 8B is a cross sectional view taken along a line V-V' of FIG. 8A.

FIG. 8A is a perspective view illustrating a still further modified embodiment of a three dimensional semiconductor memory device according to some embodiments of the inventive concept, and FIG. 8B is a cross sectional view taken along a line V-V' of FIG. 8A.

Referring to FIGS. 8A and 8B, the vertical active patterns 125R may be laterally recessed from the sidewalls of the electrode structures 130 located outside the vertical grooves 115a. As such, each of the vertical active patterns 125R may fill or cover only a portion of the inner surface of the respective vertical grooves 115a. That is, the vertical active pattern 125R may fill a portion of the vertical groove 115a, and the sidewall insulating pattern 133 may laterally extend to fill the other portion of the vertical groove 115a. The vertical active patterns 125R may become further spaced apart from the contact conductive patterns 140 since the vertical active patterns 125R are laterally recessed from the sidewalls of the electrode structures 130. The vertical active patterns 125R may be formed of the same material layer as the vertical active patterns 125 illustrated in FIGS. 1A to 1D.

Figure 9A:
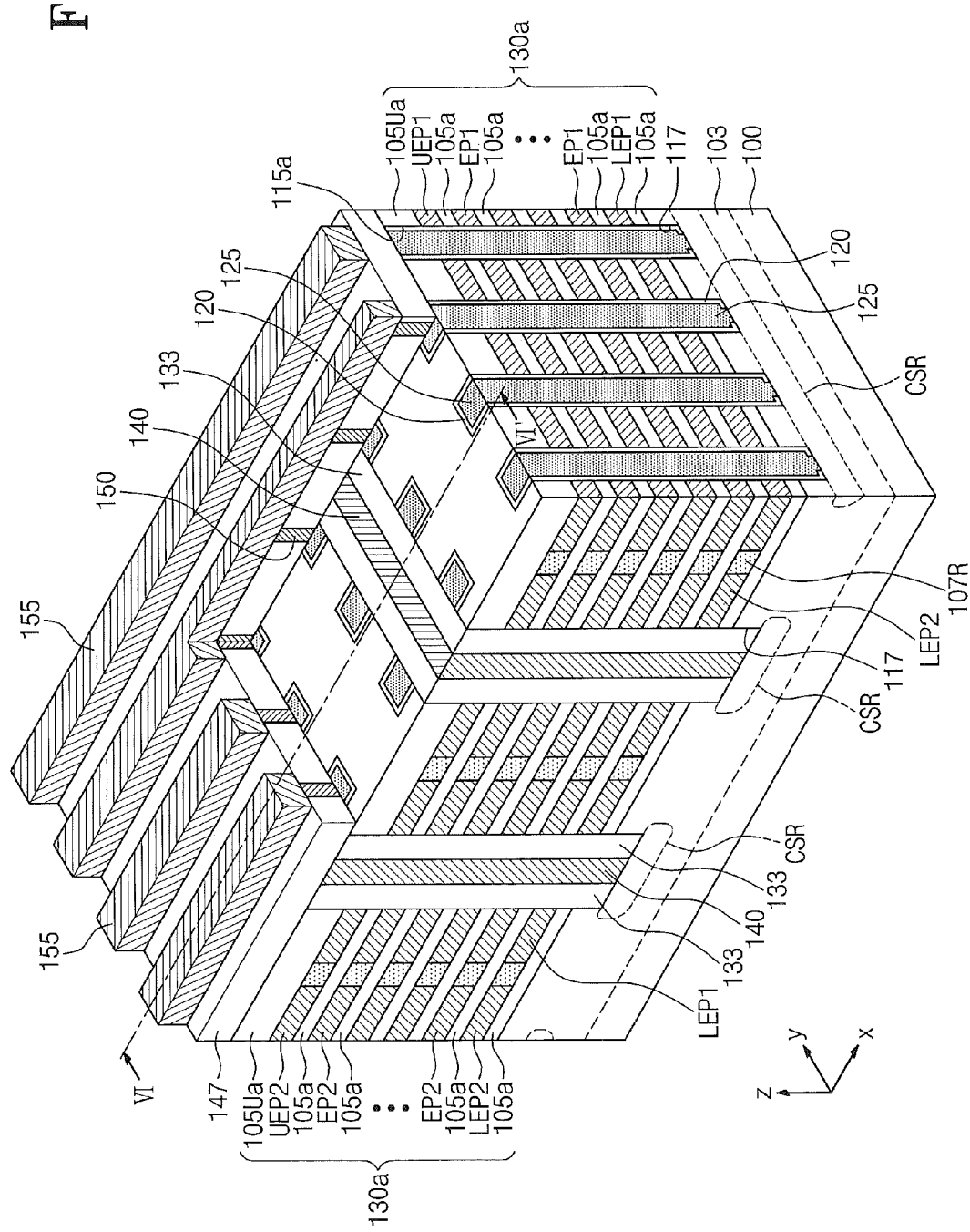
FIG. 9A is a perspective view illustrating a yet further modified embodiment of a three dimensional semiconductor memory device according to some embodiments of the inventive concept.
Figure 9B:
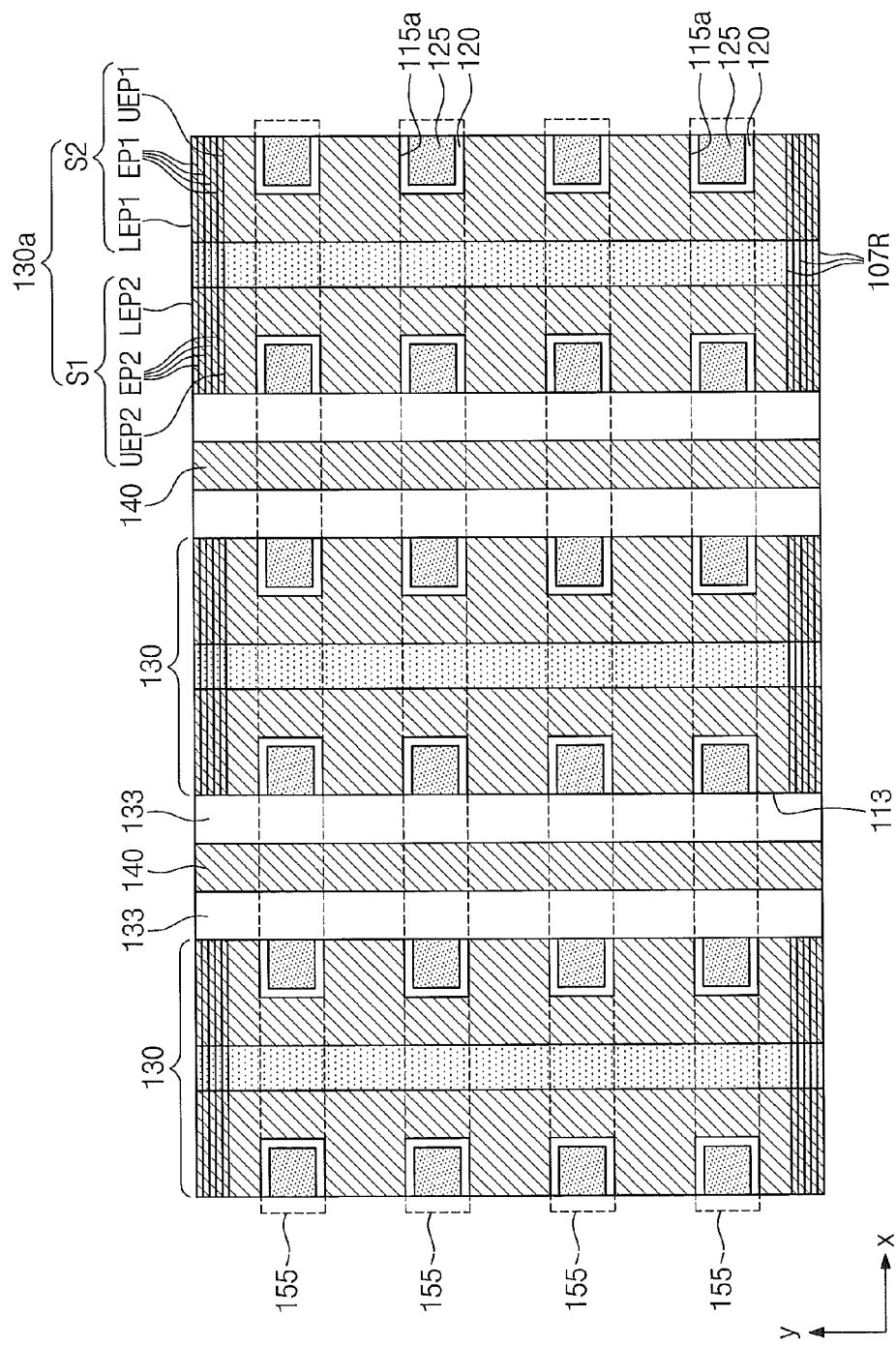
FIG. 9B is a plan view illustrating the three dimensional semiconductor memory device shown in FIG. 9A.
Figure 9C:
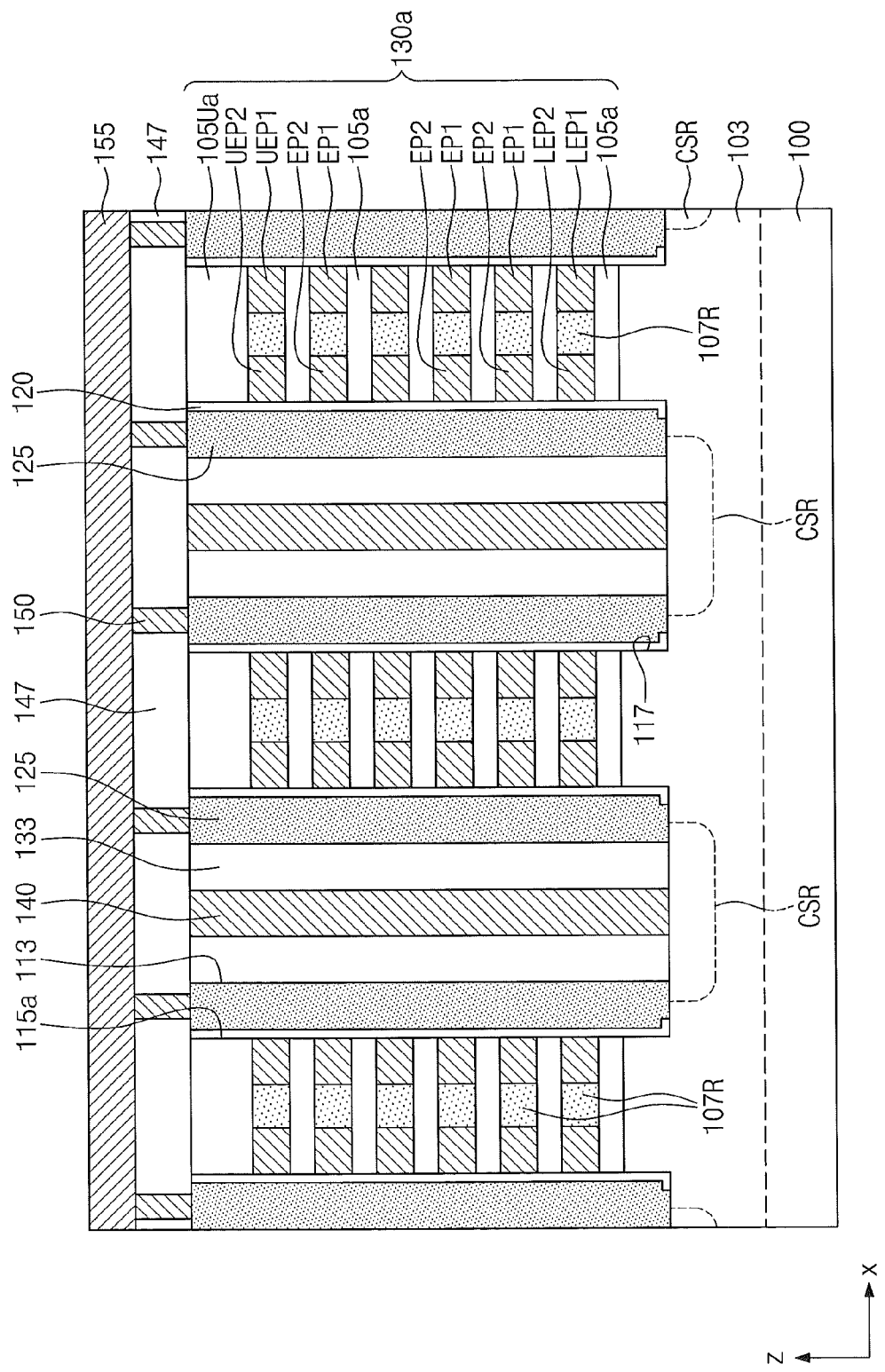
FIG. 9C is a cross sectional view taken along a line VI-VI' of FIG. 9A.

FIG. 9A is a perspective view illustrating a yet further modified embodiment of a three dimensional semiconductor memory device according to some embodiments of the inventive concept, and FIG. 9B is a plan view illustrating the three dimensional semiconductor memory device shown in FIG. 9A. FIG. 9C is a cross sectional view taken along a line VI-VI' of FIG. 9A.

Referring to FIGS. 9A, 9B and 9C, each of electrode structures 130a according to the present modified embodiment may include insulating patterns 105a and 105Ua and electrode patterns which are alternately and sequentially stacked. In this case, each of the electrode patterns in the respective electrode structures 130a may be divided into a first segment LEP1, EP1 or UEP1 and a second segment LEP2, EP2 or UEP2 which are horizontally separated from each other. A partition pattern 107R may be disposed between the first segment LEP1, EP1 or UEP1 and the second segment LEP2, EP2 or UEP2 which are located at a same level. Each of the partition patterns 107R may include an insulating material having an etch selectivity with respect to the insulating patterns 105a and 105Ua. For example, each of the insulating patterns 105a and 105Ua may include an oxide material, and each of the partition patterns 107R may include an insulating nitride material. The partition patterns 107R may be disposed between the insulating patterns 105a and 105Ua. The partition patterns 107R may constitute the electrode structures 130a. That is, each of the electrode structures 130a may include the partition patterns 107R. The partition patterns 107R may have line shapes which in parallel extend in the first direction. Each of the insulating patterns 105a and 105Ua in each electrode structure 130a may not be divided.

As illustrated in FIG. 9B, the first segments LEP1, EP1 and UEP1 stacked in each electrode structure 130a may constitute a first segment group S1, and second segments LEP2, EP2 and UEP2 stacked in each electrode structure 130a may constitute a second segment group S2. First and second lowermost segments LEP1 and LEP2 of the first and second segment groups S1 and S2 may correspond to gate electrodes of the ground selection transistors, and first and second uppermost segments UEP1 and UEP2 of the first and second segment groups S1 and S2 may correspond to gate electrodes of the string selection transistors. At least some of the first and second segments EP1 and EP2 between the uppermost segments UEP1 and UEP2 and the lowermost segments LEP1 and LEP2 may correspond to gate electrodes of the cell transistors.

The vertical grooves 115a located adjacent to one of the opposite or opposing sidewalls of each electrode structure 130a may be defined by respective sidewalls of the first segment group S1 and respective sidewalls of the insulating patterns 105a and 105Ua. Similarly, the vertical grooves 115a located adjacent to the other of the opposite or opposing sidewalls of each electrode structure 130a may be defined by respective opposite sidewalls of the second segment group S2 and respective opposite sidewalls of the insulating patterns 105a and 105Ua. As such, when viewed from a plan view, one of the opposite sidewalls of the first segment group S1 may have an uneven or notched shape, and the other (adjacent to the partition patterns 107R) of the opposite sidewalls of the first segment group S1 may have a straight line or linear shape along the first direction. Similarly, when viewed from a plan view, one of the opposite sidewalls of the second segment group S2 may have an uneven or notched shape, and the other (adjacent to the partition patterns 107R) of the opposite sidewalls of the second segment group S2 may have a straight line or linear shape along the first direction.

The vertical active patterns 125 in the vertical grooves 115a located adjacent to one of the opposite sidewalls of each electrode structure 130a may be coupled to the first segment group S1, and the vertical active patterns 125 in the vertical grooves 115a located adjacent to the other of the opposite sidewalls of each electrode structure 130a may be coupled to the second segment group S2. In the present modified embodiment, the first segment group S1 and the second segment group S2 in each electrode structure 130a may have a substantially symmetrical structure relative to the partition patterns 107R disposed therebetween.

Elements of the three dimensional semiconductor memory devices according to the above described embodiments may be combined with each other. For example, the vertical active patterns 125' contacting the inner sidewalls of the recessed regions 117 may be applied to the three dimensional semiconductor memory device disclosed in FIGS. 4A and 4B, FIGS. 5A and 5B, FIGS. 6A to 6C or FIGS. 9A to 9C. Further, the vertical grooves 215a having a rounded sidewall illustrated in FIGS. 4A and 4B may be applied to the three dimensional semiconductor memory device disclosed in FIGS. 1A to 1D, FIGS. 2A to 2C, FIG. 3, FIGS. 6A to 6C, FIGS. 7A and 7B, FIGS. 8A and 8B or FIGS. 9A to 9C. In addition, the vertical active patterns 125L and the filling dielectric patterns 210a illustrated in FIGS. 5A and 5B may be applied to the three dimensional semiconductor memory device disclosed in FIGS. 1A to 1D, FIGS. 2A to 2C, FIG. 3, FIGS. 6A to 6C, FIGS. 7A and 7B, FIGS. 8A and 8B or FIGS. 9A to 9C. Thus, present inventive concept is not limited to the above descriptions and the elements of the three dimensional semiconductor memory devices according to the above modified embodiments may be combined with each other in diverse manners.

Figure 10A:
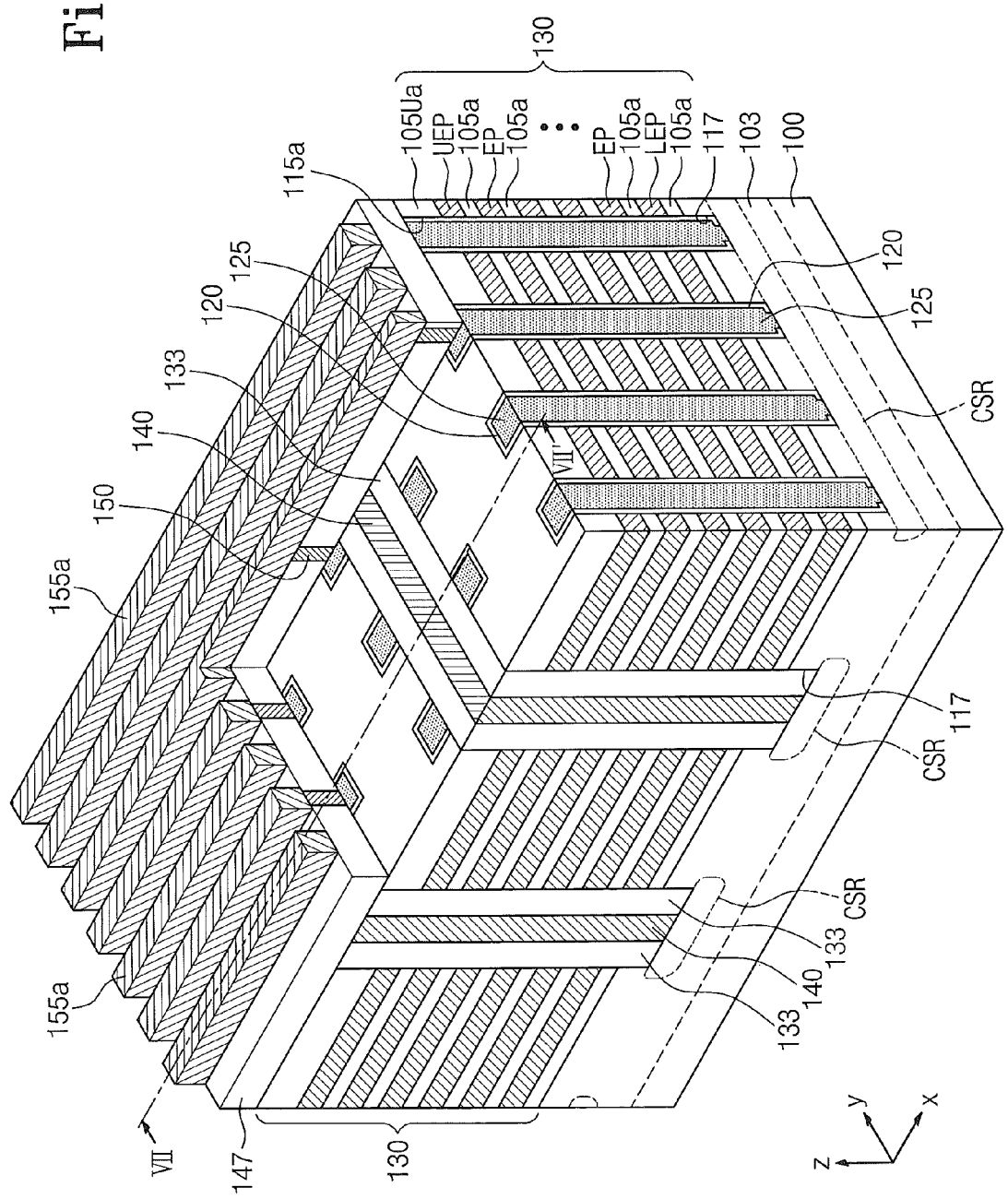
FIG. 10A is a perspective view illustrating a three dimensional semiconductor memory device according to another embodiment of the inventive concept.
Figure 10B:
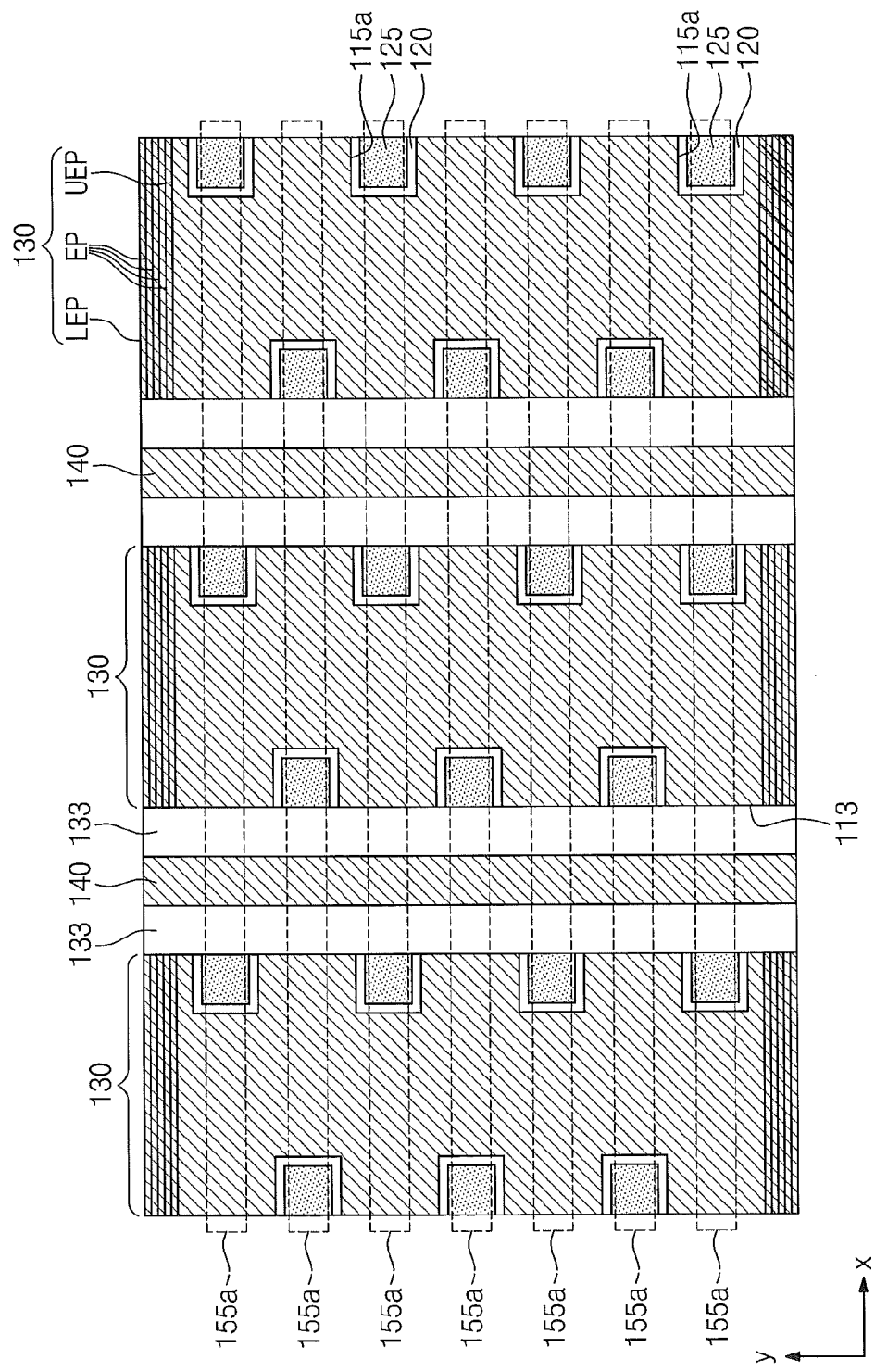
FIG. 10B is a plan view illustrating the three dimensional semiconductor memory device shown in FIG. 10A.
Figure 10C:
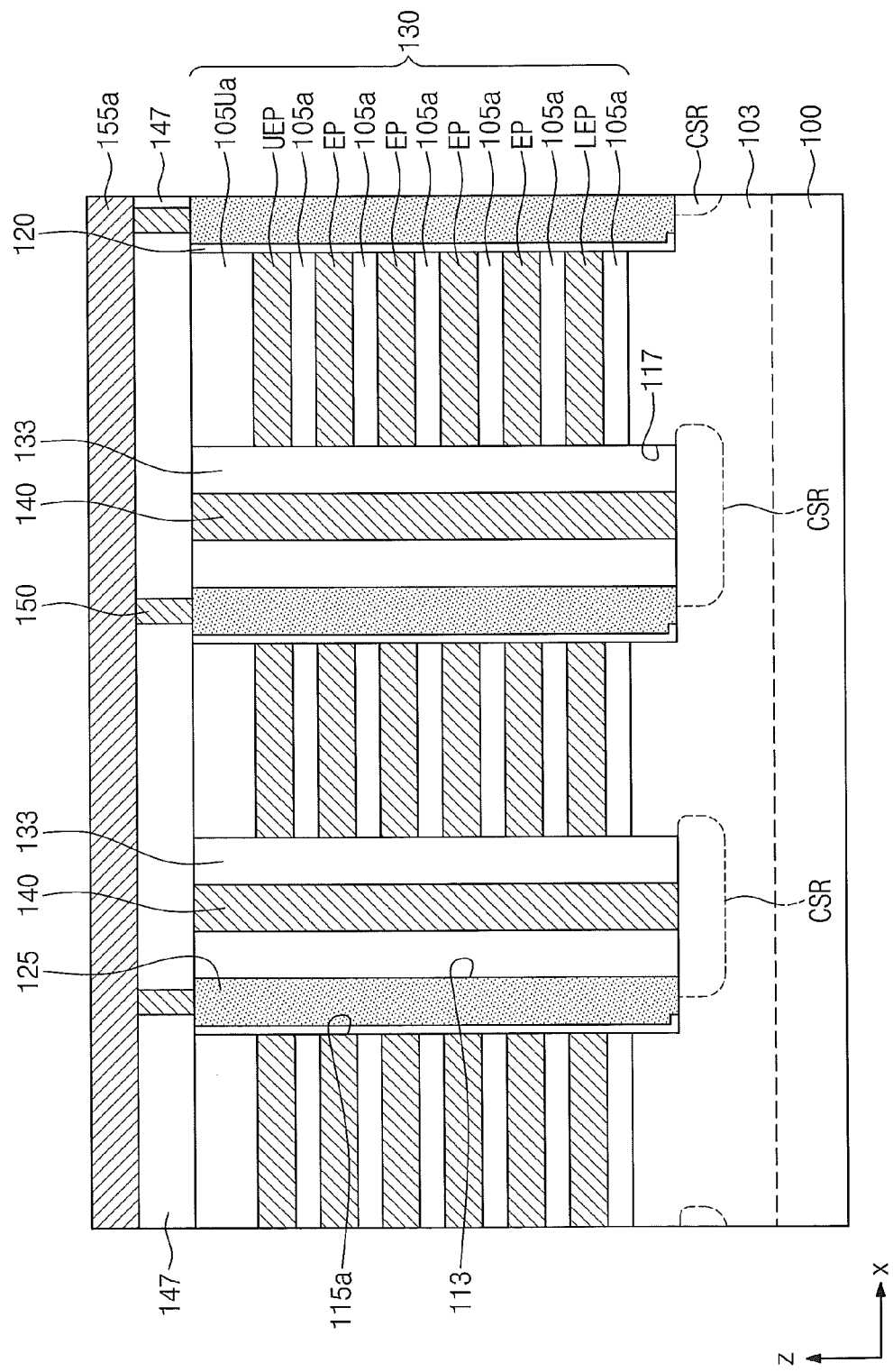
FIG. 10C is a cross sectional view taken along a line VII-VII' of FIG. 10A.

FIG. 10A is a perspective view illustrating a three dimensional semiconductor memory device according to another embodiment of the inventive concept, and FIG. 10B is a plan view illustrating the three dimensional semiconductor memory device shown in FIG. 10A. FIG. 10C is a cross sectional view taken along a line VII-VII' of FIG. 10A. The present embodiment may be similar to the previous embodiment described with reference to FIGS. 1A to 1D. Thus, to avoid duplicate explanation, differences between the present embodiment and the previous embodiment will be mainly described in detail hereinafter.

Referring to FIGS. 10A, 10B and 10C, a plurality of electrode structures 130 may be disposed on the substrate 100. The electrode structures 130 may extend along a first direction to be parallel with each other. The electrode structures 130 may arrayed in a second direction perpendicular to the first direction, thereby being spaced apart from each other by a predetermined distance. The first and second directions may correspond to a Y-axis direction and an X-axis direction of FIG. 10A, respectively.

A plurality of vertical active patterns 125 may be respectively disposed in a plurality of vertical grooves 115 defined in opposite or opposing sidewalls of each electrode structure 130. Each of the electrode structures 130 may include a first sidewall and a second sidewall which are opposite to each other. The vertical active patterns 125 disposed adjacent to the first sidewall of the electrode structure 130 may be respectively offset along the first direction relative to central positions of the vertical active patterns 125 disposed adjacent to the second sidewall of the electrode structure 130 (or relative to imaginary lines that extend through such central positions parallel to the second direction). For example, the line VII-VII' of FIG. 10A may overlap one of the imaginary lines in a plan view. As such, the central points of the vertical active patterns 125 adjacent to the first sidewall of the electrode structure 130 may not overlap with the central points of the vertical active patterns 125 adjacent to the second sidewall of the electrode structure 130, along the second direction. For example, the vertical active patterns 125 disposed at both sides of the electrode structure 130 may be arrayed in a zigzag fashion along the first direction when viewed from a plan view.

A plurality of interconnections 155a may be disposed on the interlayer dielectric layer 147. The interconnections 155a may extend in parallel extend in the second direction. Each of the interconnections 155a may be electrically connected to at least one of upper portions of the vertical active patterns 125. More specifically, the pair of vertical active patterns 125 located at both sides of the electrode structure 130 may be electrically connected to the pair of interconnections 155a which are different from each other, respectively. That is, any couple of vertical active patterns 125 of the plurality of vertical active patterns 125 disposed at both sides of the electrode structure 130 may not share one of the interconnections 155a. The interconnections 155a may correspond to bit lines. Each of the interconnections 155a may include the same material layer as the interconnections 155 illustrated in FIGS. 1A to 1D.

In some embodiments, two or more of the plurality of vertical active patterns 125 disposed at both sides of the electrode structure 130 may not share any one of the interconnections 155a. Accordingly, the plurality of vertical active patterns 125 disposed at both sides of the electrode structure 130 may share a single string selection gate electrode. Thus, the plurality of vertical active patterns 125 disposed at both sides of the electrode structure 130 may share an uppermost electrode pattern UEP in the electrode structure 130. That is, there is no need to separate the uppermost electrode pattern UEP into two segments or more. Therefore, the uppermost electrode pattern UEP may have substantially the same shape as the electrode patterns EP and LEP disposed under the uppermost electrode pattern UEP. A plurality of notched regions may be defined at both sidewalls of each of the electrode patterns LEP, EP and UEP due to the presence of the vertical grooves 115a disposed at both sides of each electrode structure 130.

The embodiments described above with reference to FIGS. 2 to 9 may be applied to the embodiment illustrated in FIGS. 10 to 10C. For example, the vertical active patterns 125' contacting the inner sidewalls of the recessed regions 117 illustrated in FIGS. 2A to 2C, the vertical active patterns 125' and the common source regions CSR illustrated in FIG. 3, the vertical grooves 215a having a rounded sidewall illustrated in FIGS. 4A and 4B, the vertical active patterns 125L and the filling dielectric patterns 210a illustrated in FIGS. 5A and 5B, the data storing layers 120a illustrated in FIGS. 6A to 6C, the data storing layers 120b illustrated in FIGS. 7A and 7B, and/or the vertical active patterns 125R illustrated in FIGS. 8A and 8B may be applied to the three dimensional semiconductor memory device disclosed in FIGS. 10A to 10C.

Further, the partition patterns 107R and the segment groups S1 and S2 of FIGS. 9A to 9C may also be applied to the three dimensional semiconductor memory device disclosed in FIGS. 10A to 10C. This embodiment will be described with reference to FIGS. 11A, 11B and 11C.

Figure 11A:
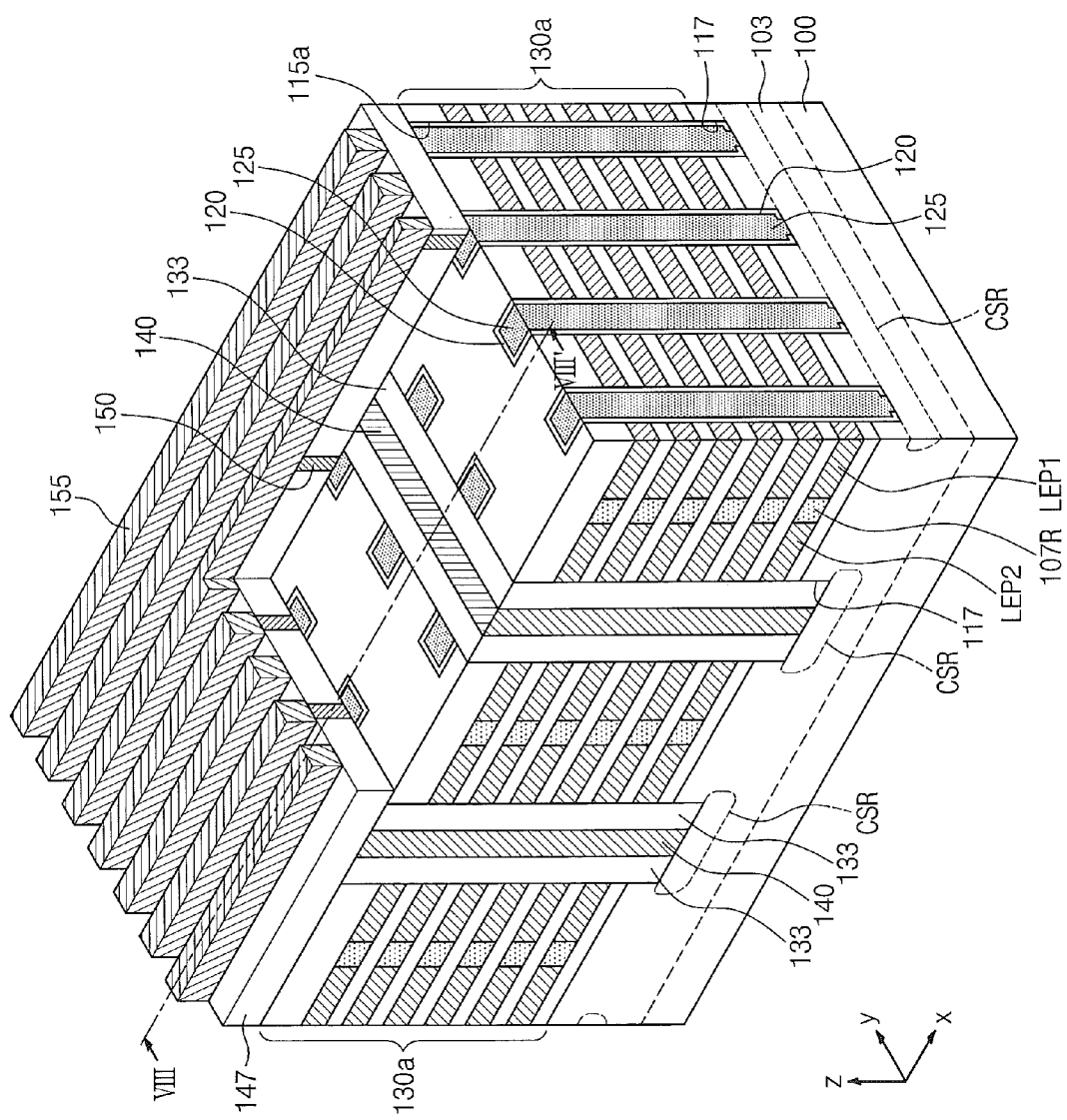
FIG. 11A is a perspective view illustrating a modified embodiment of a three dimensional semiconductor memory device according to another embodiment of the inventive concept.
Figure 11B:
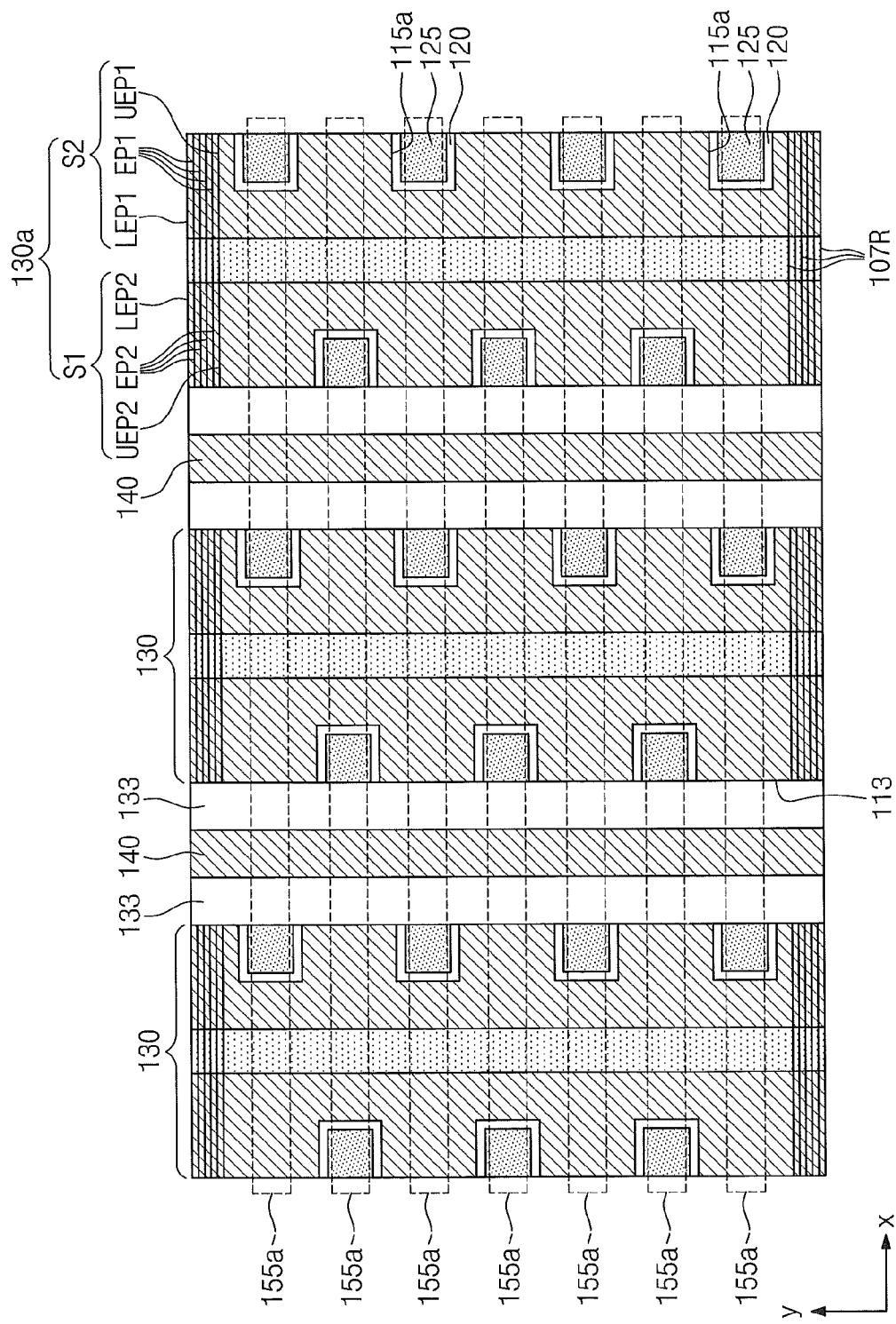
FIG. 11B is a plan view illustrating the three dimensional semiconductor memory device shown in FIG. 11A.
Figure 11C:
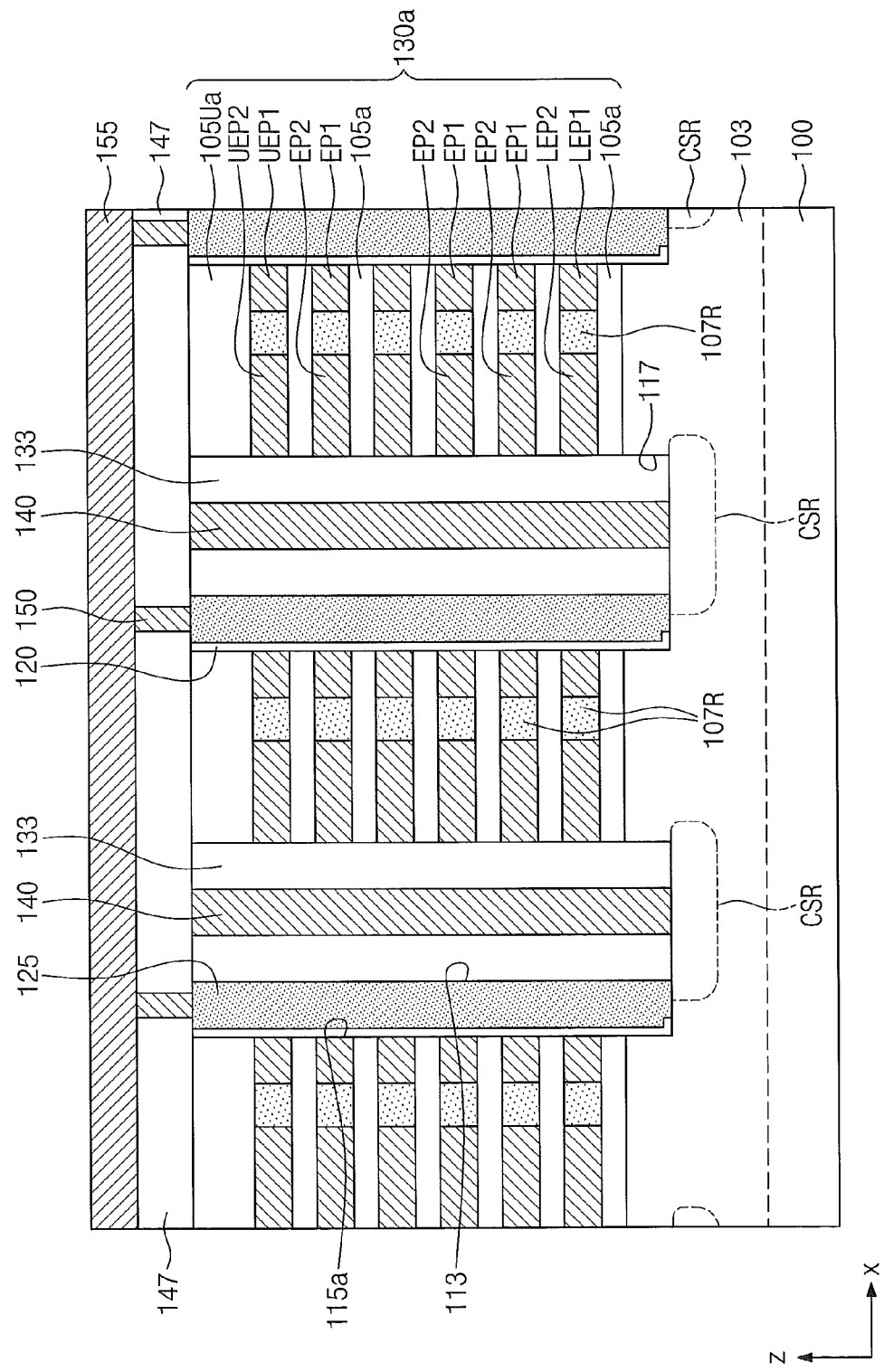
FIG. 11C is a cross sectional view taken along a line VIII-VIII' of FIG. 11A.

FIG. 11A is a perspective view illustrating a modified embodiment of a three dimensional semiconductor memory device according to another embodiment of the inventive concept, and FIG. 11B is a plan view illustrating the three dimensional semiconductor memory device shown in FIG. 11A. FIG. 11C is a cross sectional view taken along a line VIII-VIII' of FIG. 11A.

Referring to FIGS. 11A, 11B and 11C, each of the electrode structures 130a may include the first segment group S1 and the second segment group S2. The partition pattern 107R may be disposed between the first segment LEP1, EP1 or UEP1 of the first segment group S1 and the second segment LEP2, EP2 or UEP2 of the second segment group S2 which are located at a same level. The vertical active patterns 125 may be respectively disposed in the vertical grooves 115a which are defined in the opposite or opposing sidewalls of the electrode structure 130a. The vertical grooves 115a defined in one of the opposite sidewalls of the electrode structure 130a and the vertical grooves 115a defined in the other of the opposite sidewalls of the electrode structure 130a may be arrayed in a zigzag fashion along the first direction. That is, the vertical grooves 115a defined by one of the opposite sidewalls of the second segment group S2 may be respectively offset in the first direction from imaginary lines that pass through central positions of the vertical grooves 115a defined by one of the opposite sidewalls of the first segment group S1 and extend in parallel in the second direction.

Now, methods of fabricating three dimensional semiconductor memory devices according to embodiments of the inventive concept will be described with reference to the drawings.

FIGS. 12 to 20 are perspective views illustrating methods of fabricating a three dimensional semiconductor memory device according to some embodiments of the inventive concept.

Figure 12:
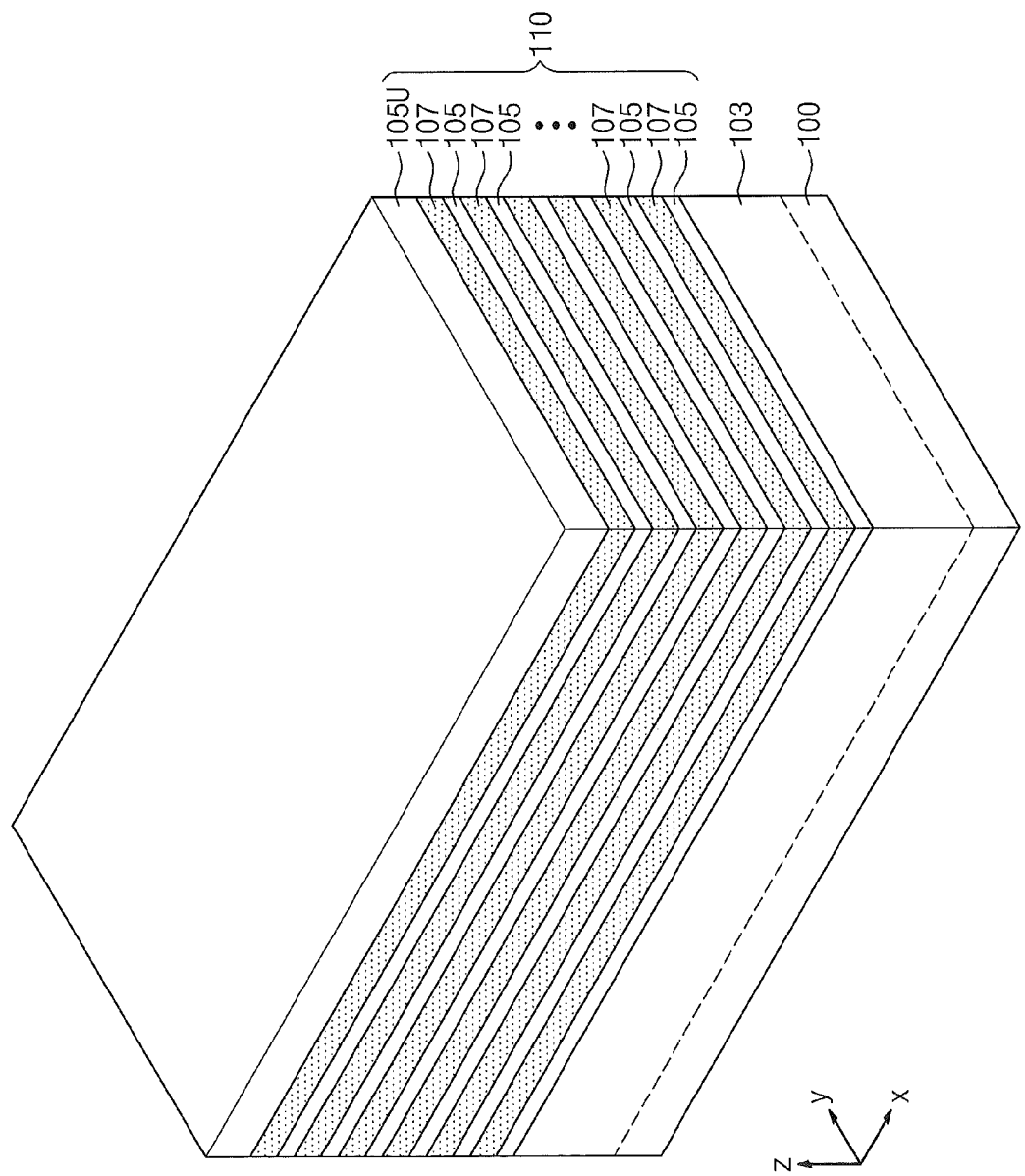
FIGS. 12 to 20 are perspective views illustrating a method of fabricating three dimensional semiconductor memory devices according to embodiments of the inventive concept.

Referring to FIG. 12, dopants of a first conductivity type may be supplied into a semiconductor substrate 100 (hereinafter, referred to as 'a substrate'), thereby forming a well region 103. The dopants of the first conductivity type may be supplied into the substrate 100 using an ion implantation technique. The substrate 100 may be a silicon substrate, a germanium substrate or a silicon-germanium substrate.

A stack structure 110 may be formed on the substrate having the well region 103. The stack structure 110 may be formed by alternately and repeatedly stacking insulating layers 105 and 105U and material layers 107. The material layers 107 maybe formed of a different material layer from the insulating layers 105 and 105U. In some embodiments, the material layers 107 may be formed of a material layer having an etch selectivity with respect to the insulating layers 105 and 105U. For example, each of the insulating layers 105 and 105U may be formed of an oxide layer, and each of the material layers 107 may be formed of an insulating nitride layer.

An uppermost layer of the stack structure 110 may correspond to an uppermost layer 105U of the insulating layers 105 and 105U. The uppermost insulating layer 105U may be formed to be thicker than the insulating layers 105 thereunder. In some embodiments, a lowermost layer of the insulating layers 105 and 105U may be formed to be thinner than the insulating layers on the lowermost insulating layer.

Figure 13:
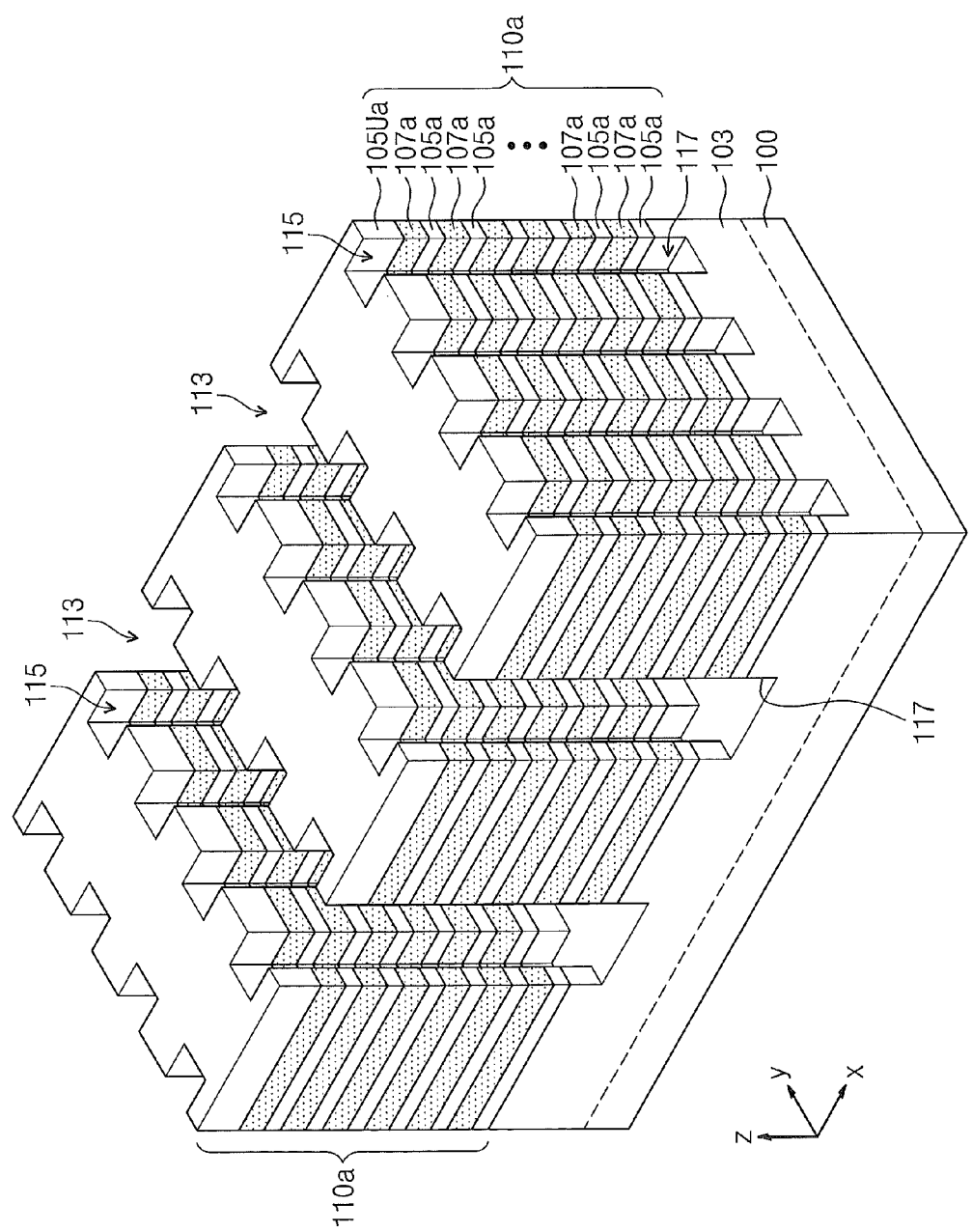

Referring to FIG. 13, the stack structure 110 may be patterned to form a plurality of stack patterns 110a. Each of the stack patterns 110a may include insulating patterns 105a and 105Ua and dummy material patterns 107a which are alternately and repeatedly stacked. The stack patterns 110a may extend in parallel extend in a first direction. The first direction may correspond to a Y-axis direction of FIG. 13. The stack patterns 110a may be arrayed in a second direction that is substantially perpendicular to the first direction. That is, the stack patterns 110a may be spaced apart from each other along the second direction. As such, trenches 113 may be defined between the adjacent stack patterns 110a. The second direction may correspond to an X-axis direction of FIG. 13.

A plurality of vertical grooves 115 may be formed at both sides of each stack pattern 110a. Each of the vertical grooves 115 may vertically extend from a top end of the sidewall of the stack pattern 110a to a bottom end of the sidewall of the stack pattern 110a. In some embodiments, each of the stack patterns 110a may include a first sidewall and a second sidewall opposite to the first sidewall. The vertical grooves 115 formed adjacent to the first and second sidewalls of each stack pattern 110a may be two dimensionally arrayed in a plurality of rows and in pairs of columns, when viewed form a plan view. The pair of vertical grooves 115 in each row may be arrayed along the second direction, and the plurality of vertical grooves 115 in each column may be arrayed along the first direction.

Inner spaces of the vertical grooves 115 may be spatially connected to inner spaces of the trenches 113. A recessed region 117 may be formed in the substrate 100 (e.g., the well region 103) under a gap region between the pair of adjacent stack patterns 110a. That is, the recessed region 117 may downwardly extend from the trench 113 and the vertical grooves 115 which are located between the adjacent stack patterns 110a. A bottom surface of the recessed region 117 may be lower than a top surface of the substrate 100 under the stack patterns 110a. The recessed regions 117 may be formed to be self-aligned with the vertical grooves 115 and the trenches 113.

The stack patterns 110a, the trenches 113 and the vertical grooves 115 may be simultaneously formed. That is, the stack patterns 110a, the trenches 113 and the vertical grooves 115 may be defined by a single photo mask (or a single reticle). Thus, the vertical grooves 115 may be formed to be self-aligned with the stack patterns 110a. Accordingly, any processes for aligning the vertical grooves 115 with the stack patterns 110a may not be required. As a result, fabrication processes may be simplified to realize a high reliable three dimensional semiconductor memory device.

Figure 14:
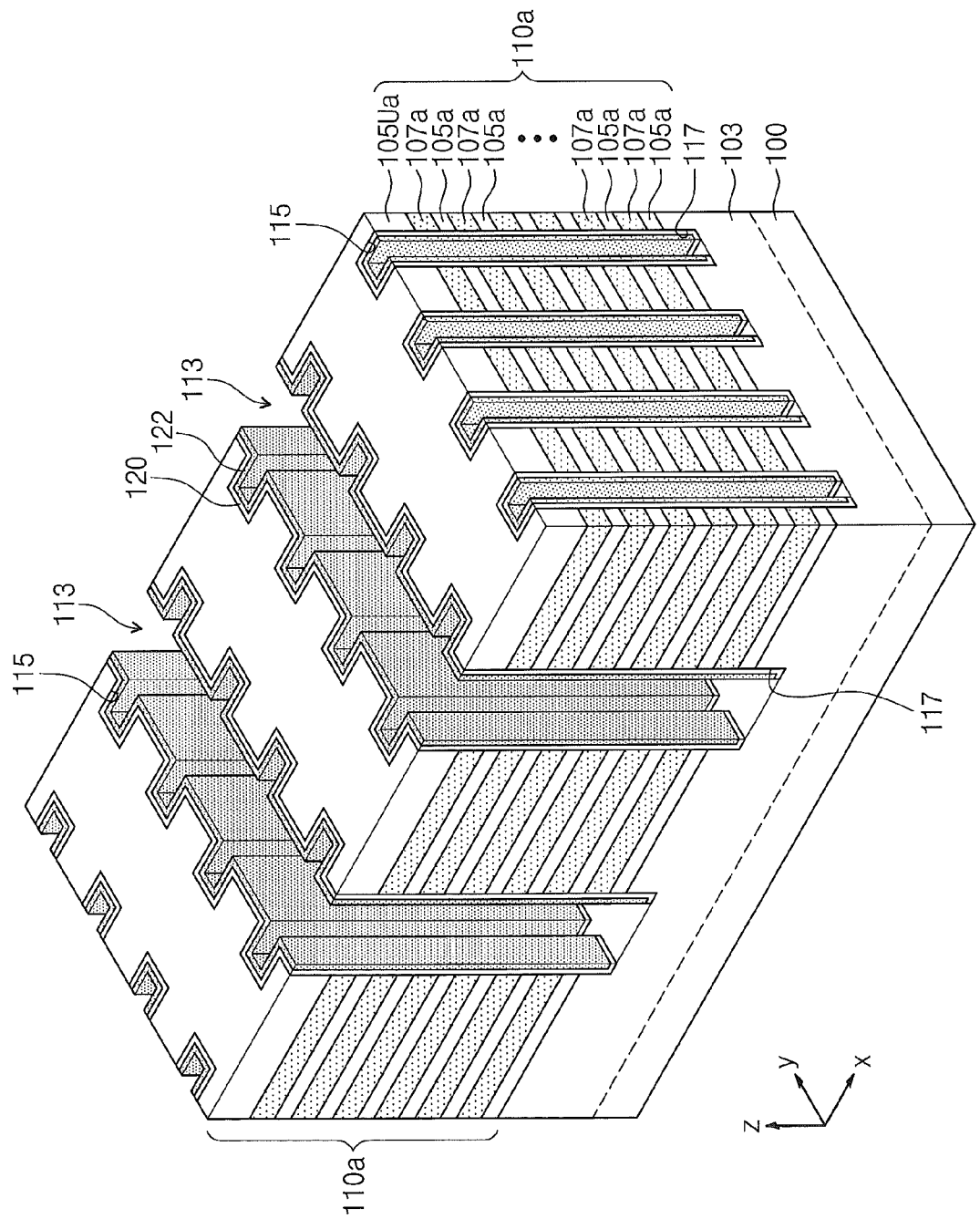

Referring to FIG. 14, a data storing layer 120 may be conformably formed on the substrate having the stack patterns 110a, the vertical grooves 115 and the recessed regions 117. The data storing layer 120 may be formed on both sidewalls of the stack patterns 110a, inner surfaces of the vertical grooves 115 and inner surfaces of the recessed regions 117. In some embodiments, the data storing layer 120 may be formed to include a blocking dielectric layer, a charge storage layer and a tunnel dielectric layer which are sequentially stacked, as described with reference to FIG. 1D.

A first active layer may be conformably formed on the substrate including the data storing layer 120. The first active layer may be anisotropically etched to form first active layer patterns 122 having a spacer shape. The first active layer patterns 122 may be disposed on both sidewalls of the respective stack patterns 110a, inner surfaces of the vertical grooves 115 and inner surfaces of the recessed regions 117. The data storing layer 120 on the bottom surfaces of the recessed regions 117 and on top surfaces of the uppermost insulating patterns 105Ua may be exposed after formation of the first active layer patterns 122. The exposed data storing layer 120 may be etched to expose the bottom surfaces of the recessed regions 117. The data storing layer 120 on the top surfaces of the uppermost insulating patterns 105Ua may also be removed while the exposed data storing layer 120 on the bottom surfaces of the recessed regions 117 is etched.

In some embodiments, each of the first active layer patterns 122 may include a semiconductor material (e.g., a silicon layer, a germanium layer or a silicon-germanium layer). The first active layer patterns 122 may be doped with dopants of the same conductivity type as the well region 103. Alternatively, the first active layer patterns 122 may not be doped with any dopants. That is, the first active layer patterns 122 may be formed of an undoped semiconductor layer.

Figure 15:
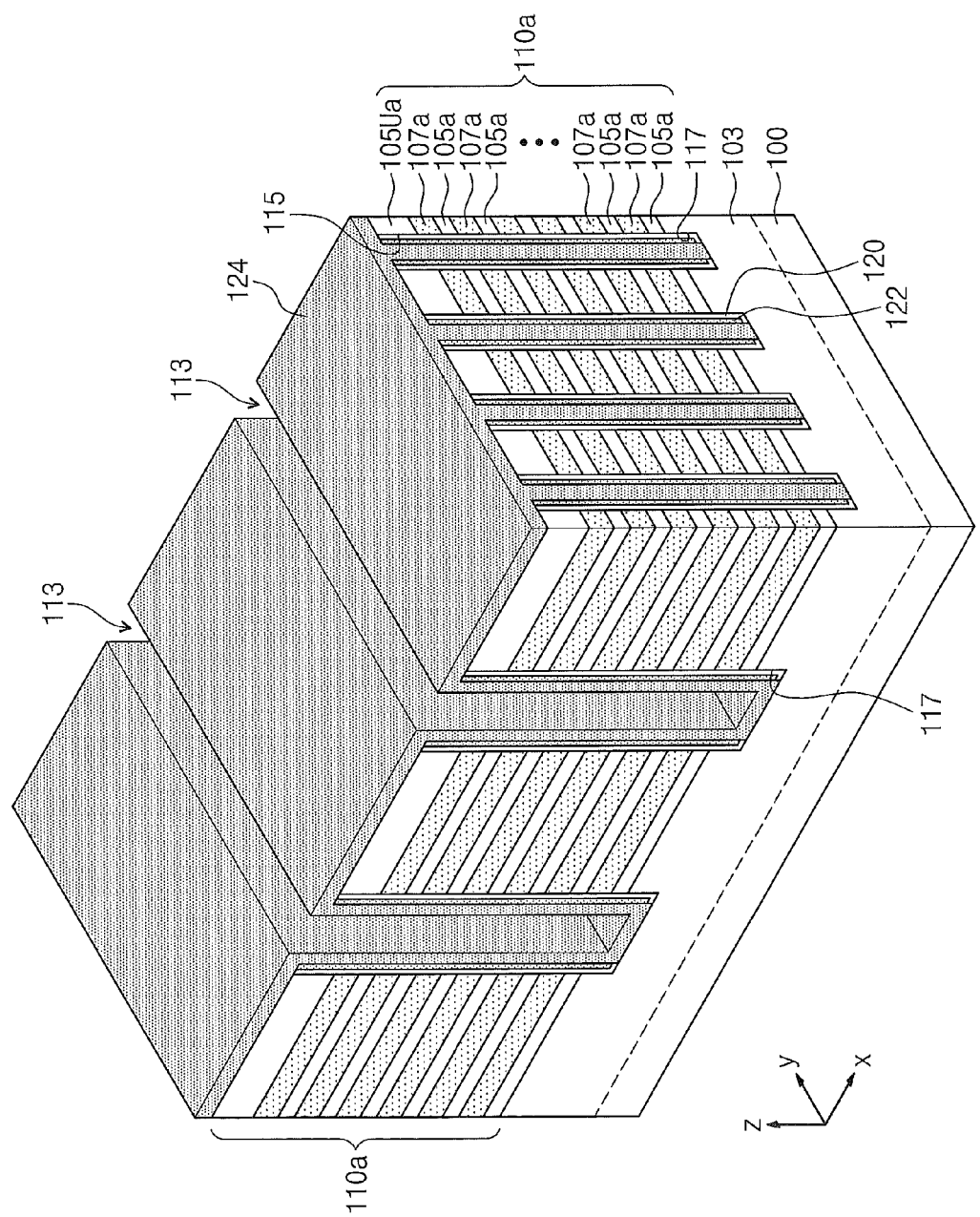

Referring to FIG. 15, a second active layer 124 may be formed on the substrate having the first active layer patterns 122. The second active layer 124 may be formed to contact the first active layer patterns 122 and the bottom surfaces of the recessed regions 117. The second active layer 124 may include a semiconductor material (e.g., a silicon layer, a germanium layer or a silicon-germanium layer). The second active layer 124 may be doped with dopants of the same conductivity type as the well region 103. Alternatively, the second active layer 124 may not be doped with any dopants. That is, the second active layer 124 may be formed of an undoped semiconductor layer.

The second active layer 124 may be conformably formed. The second active layer 124 may be formed to fill the vertical grooves 115. If the width of the vertical grooves 115 is appropriately adjusted, the vertical grooves 115 may be filled with the second active layer 124. The second active layer 124 outside the vertical grooves 115 may be formed to substantially a uniform thickness. That is, the second active layer 124 may be formed to have substantially a uniform thickness on the sidewalls of the stack patterns 110a outside the vertical grooves 115, the bottom surfaces of the recessed regions 117 and the top surfaces of the stack patterns 110a.

Each of the vertical grooves 115 may correspond to a region surrounded by a surface which is laterally concave with respect to the substantially planar or flat sidewall of the stack pattern 110a, and the vertical grooves 115 may be filled with the second active layer 124. Thus, a thickness of the portions of the second active layer 124 formed on inner surfaces of the vertical grooves 115 may be greater than that of the portions of the second active layer 124 formed on the sidewalls of the stack patterns 110a outside the vertical grooves 115.

Figure 16:
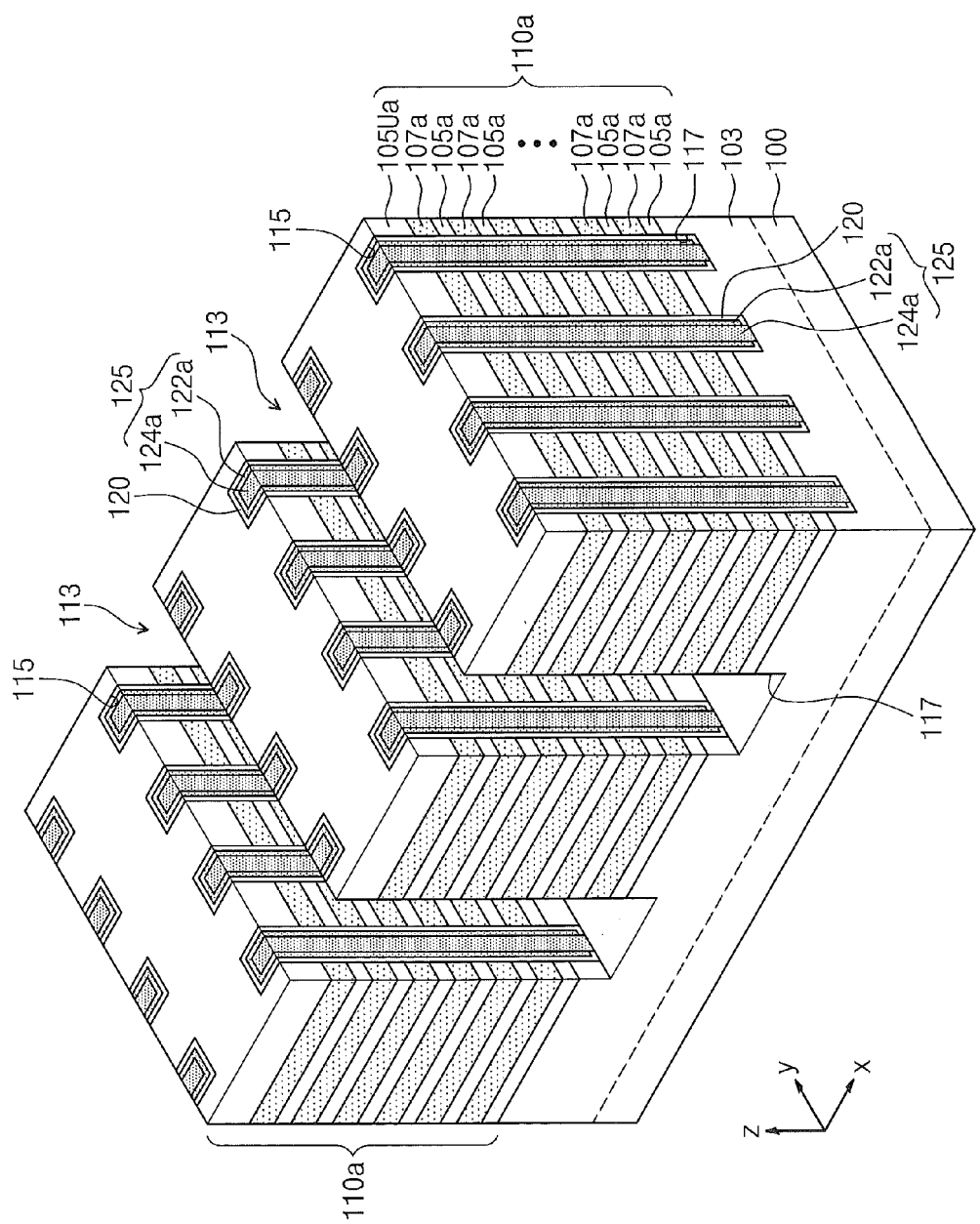

Referring to FIG. 16, the first active layer patterns 122 and the second active layer 124, which are located outside the vertical grooves 115 and outside portions of the recessed regions 117 under the vertical grooves 115, may be removed to form vertical active patterns 125 remaining in the vertical grooves 115 and downwardly extending into the recessed regions 117 under the vertical grooves 115. The first active layer patterns 122 and the second active layer 124 may be etched using an isotropic etching process in order to form the vertical active patterns 125. The isotropic etching process may be performed using at least one of an isotropic dry etching technique and a wet etching technique.

The vertical active patterns 125 may be disposed in the vertical grooves 115, respectively. Further, each of the vertical active patterns 125 may downwardly extend to be disposed in the recessed region 117 directly under the vertical groove 115. Each of the vertical active patterns 125 may include a first active portion 122a and a second active portion 124a. The vertical active patterns 125 may contact the bottom surfaces of the recessed regions 117. The data storing layer 120 on the sidewalls of the stack patterns 110a located outside the vertical grooves 115 may be exposed after formation of the vertical active patterns 125.

The vertical active patterns 125 may have a polycrystalline state. That is, the first active layer and the second active layer 124 may be formed of a polycrystalline layer, and the vertical active patterns 125 may still maintain the polycrystalline state.

The vertical active patterns 125 may also be formed to have a single crystalline state. For example, the first active layer patterns 122 and the second active layer 124 may be formed of an amorphous layer, and then a laser annealing process may be applied to the first active layer patterns 122 and the second active layer 124 having the amorphous state. During the laser annealing process, the substrate 100 contacting the second active layer 124 through the bottom surfaces of the recessed regions 117 may act as a seed layer to change the crystalline phase of the first active layer patterns 122 and the second active layer 124 into a single crystalline state. As such, the vertical active patterns 125 may be formed to have a single crystalline state. However, the inventive concept is not limited to the above description. That is, the vertical active patterns 125 may be formed to have a single crystalline state using other techniques such as a selective epitaxial growth process and a patterning process.

After formation of the vertical active patterns 125, the exposed data storing layer 120 may be removed. As a result, the sidewalls of the stack patterns 110a outside the vertical grooves 115 may be exposed. That is, sidewalls of the insulating patterns 105a and 105Ua and the dummy material patterns 107a located outside the vertical grooves 115 may be exposed. The exposed data storing layer 120 may be removed using an isotropic etching process, for example, an isotropic dry etching technique or a wet etching technique.

Figure 17:
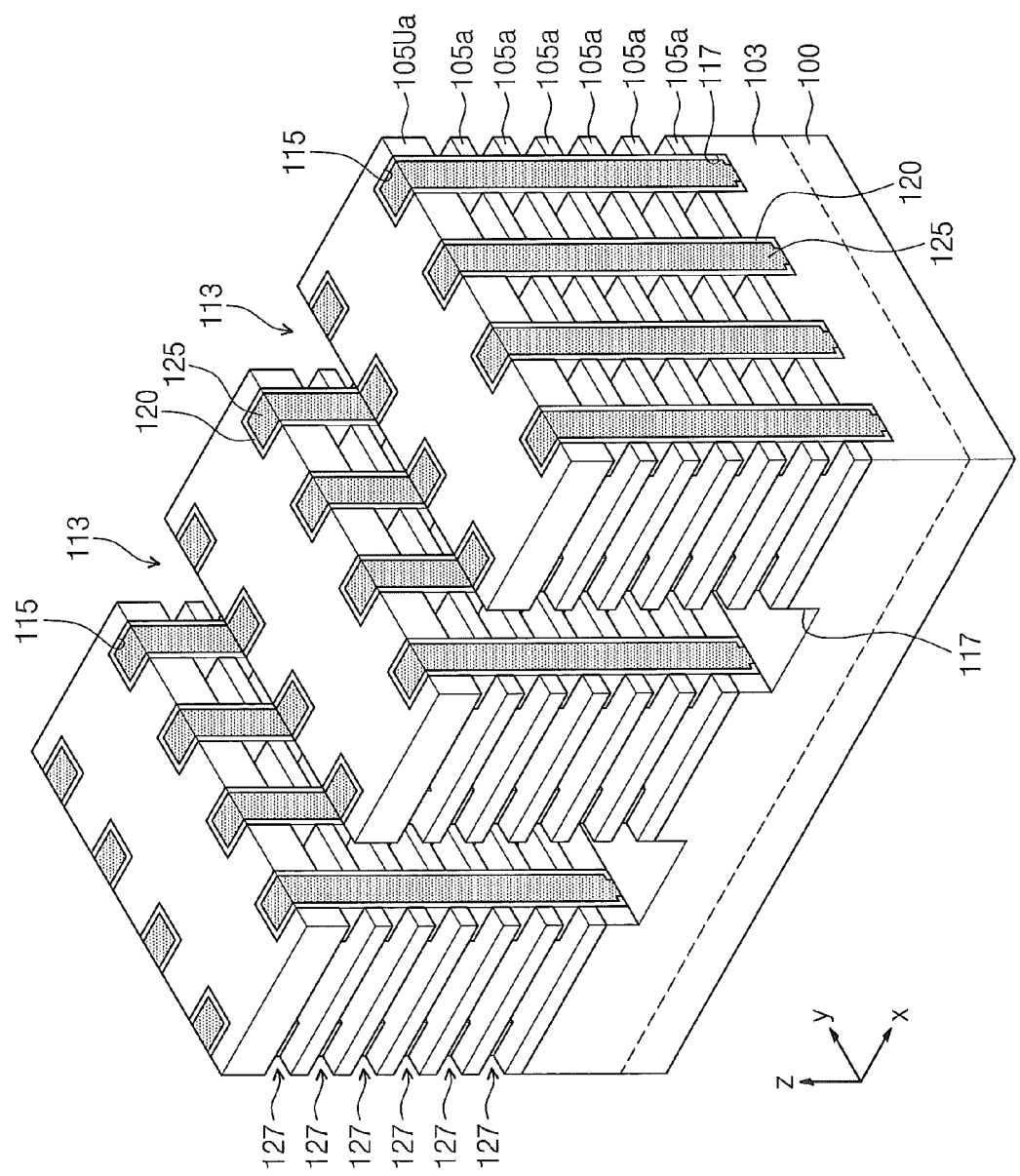

Referring to FIG. 17, the exposed dummy material patterns 107a may be removed to form empty regions 127. The material patterns 107a may be removed using a wet etching process or an isotropic dry etching process. In this case, the insulating patterns 105a and 105Ua may remain. The empty regions 127 may be formed between the insulating patterns 105a and 105Ua.

Figure 18:
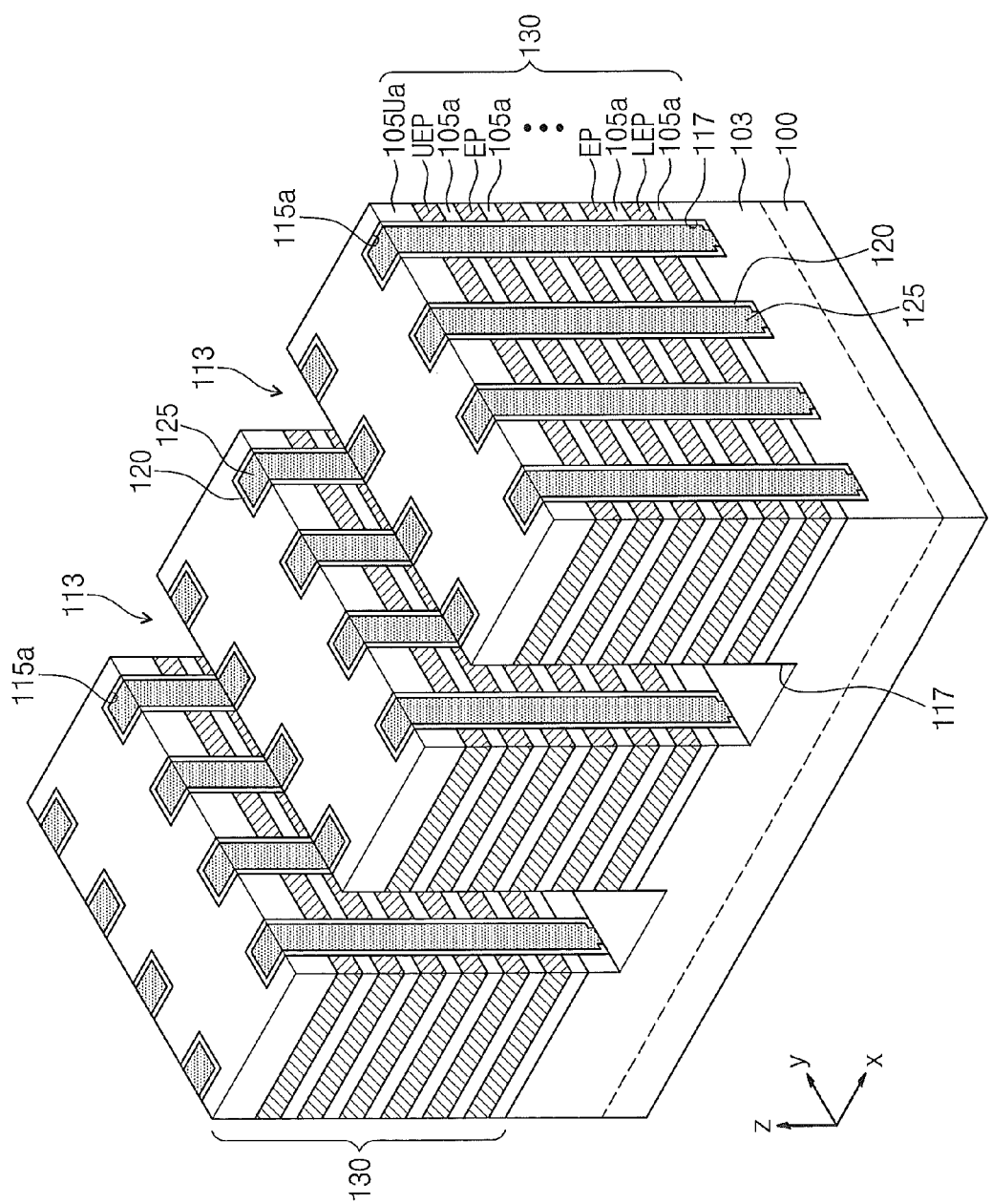

Referring to FIG. 18, a conductive layer may be formed on the substrate including the empty regions 127. The conductive layer may be formed to fill the empty regions 127. The portions of the conductive layer outside the empty regions 127 may be removed to form electrode patterns LEP, EP and UEP. The electrode patterns LEP, EP and UEP may be disposed in the empty regions 127, respectively. In some embodiments, lowermost electrode pattern LEP of the electrode patterns LEP, EP and UEP may be used as ground selection gate electrodes. At least some of the electrode patterns between the lowermost electrode patterns LEP and the uppermost electrode patterns UEP may be used as cell gate lines.

The insulating patterns 105a and 105Ua and the electrode patterns LEP, EP and UEP which are alternately and repeatedly stacked between the pair of adjacent trenches 113 may constitute an electrode structure 130. The vertical active patterns 125 may be disposed in vertical grooves 115a defined in the opposing sidewalls of the electrode structures 130, respectively. The vertical grooves 115a may be defined due to the vertical grooves 115 formed at the sidewalls of the stack patterns 110a. That is, the vertical grooves 115a may be defined by sidewalls of the electrode structures 130 which are formed by replacing the dummy material patterns 107a with the electrode patterns LEP, EP and UEP.

Figure 19:
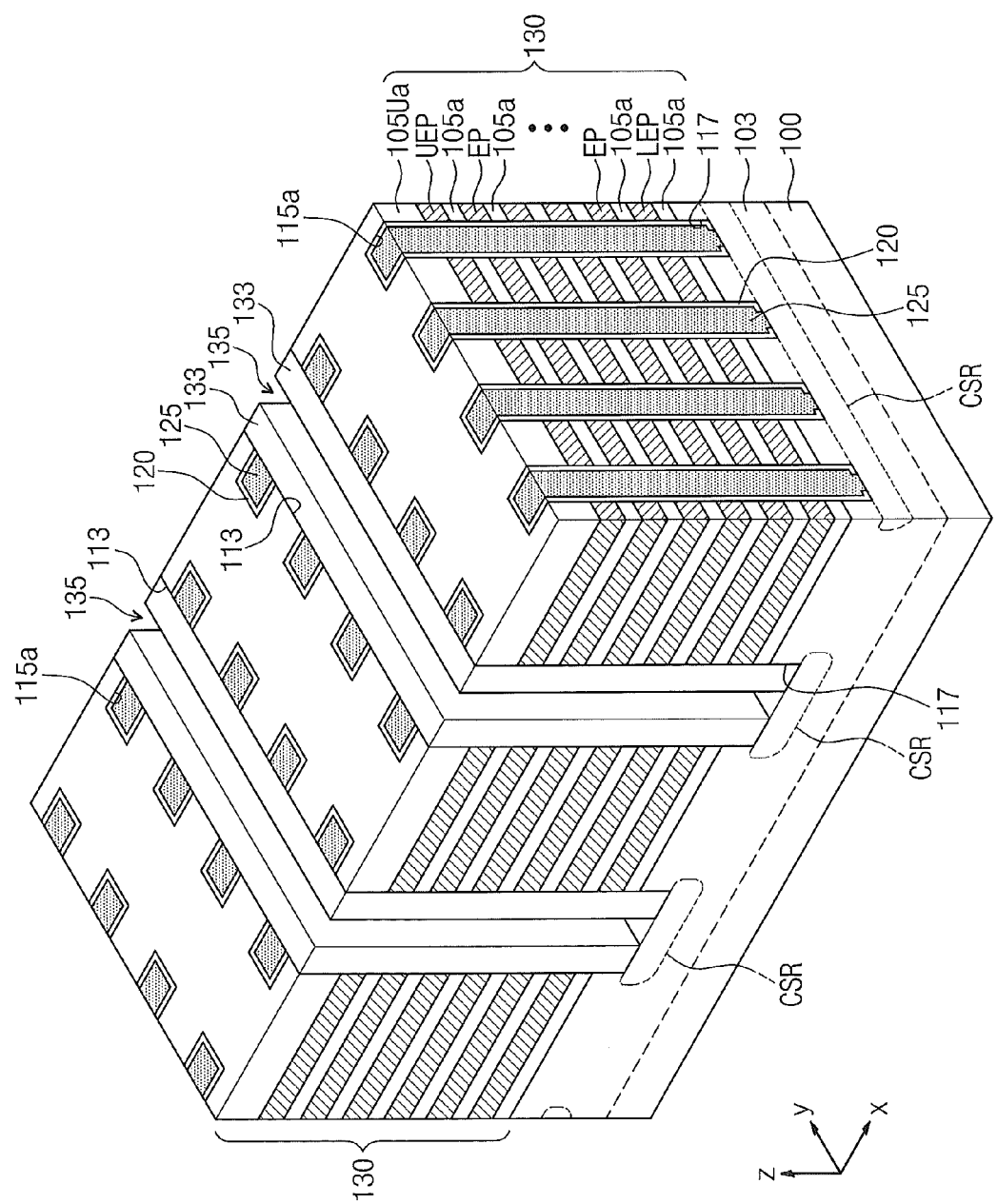

Referring to FIG. 19, a pair of sidewall insulating patterns 133 may be formed on both inner sidewalls of each trench 113, respectively. That is, a pair of sidewall insulating patterns 133 may be formed on both the opposite sidewalls of each electrode structure 130, respectively. The pair of sidewall insulating patterns 133 in each trench 113 may be separated from each other along the second direction. Thus, a space 135 may be defined between the pair of sidewall insulating patterns 133 in each trench 113. Each of the sidewall insulating patterns 133 may have a linear shape extending in the second direction in plan view. Thus, the spaces 135 may also extend in the first direction.

The sidewall insulating patterns 133 may contact the vertical active patterns 125. The sidewall insulating patterns 133 may be formed by conformably depositing a sidewall insulating layer on the substrate having the electrode structures 130 and anisotropically etching the sidewall insulating layer. The sidewall insulating layer may include an oxide layer, a nitride layer and/or an oxynitride layer.

Common source regions CSR may be formed in the well region 103 under gap regions between the electrode structures 130. The common source regions CSR may be doped with dopants of the second conductivity type. The common source regions CSR may be formed under the recessed regions 117, respectively. In this case, the common source regions CSR may be connected to the vertical active patterns 125. In more detail, the common source regions CSR may be in contact with the vertical active patterns 125. The vertical active patterns 125 may also be connected to the well region 103. In more detail, the vertical active patterns 125 may be in contact with the well region 103.

The common source regions CSR may be formed by implanting dopants of the second conductivity type into the well region 103 using the electrode structures 130 as implantation masks and annealing the substrate to activate the implanted dopants. In some embodiments, after formation of the sidewall insulating patterns 133, dopants of the second conductivity type may be implanted through the spaces 135 to form the common source regions CSR. Alternatively, the common source regions CSR may be formed prior to formation of the sidewall insulating patterns 133.

Figure 20:
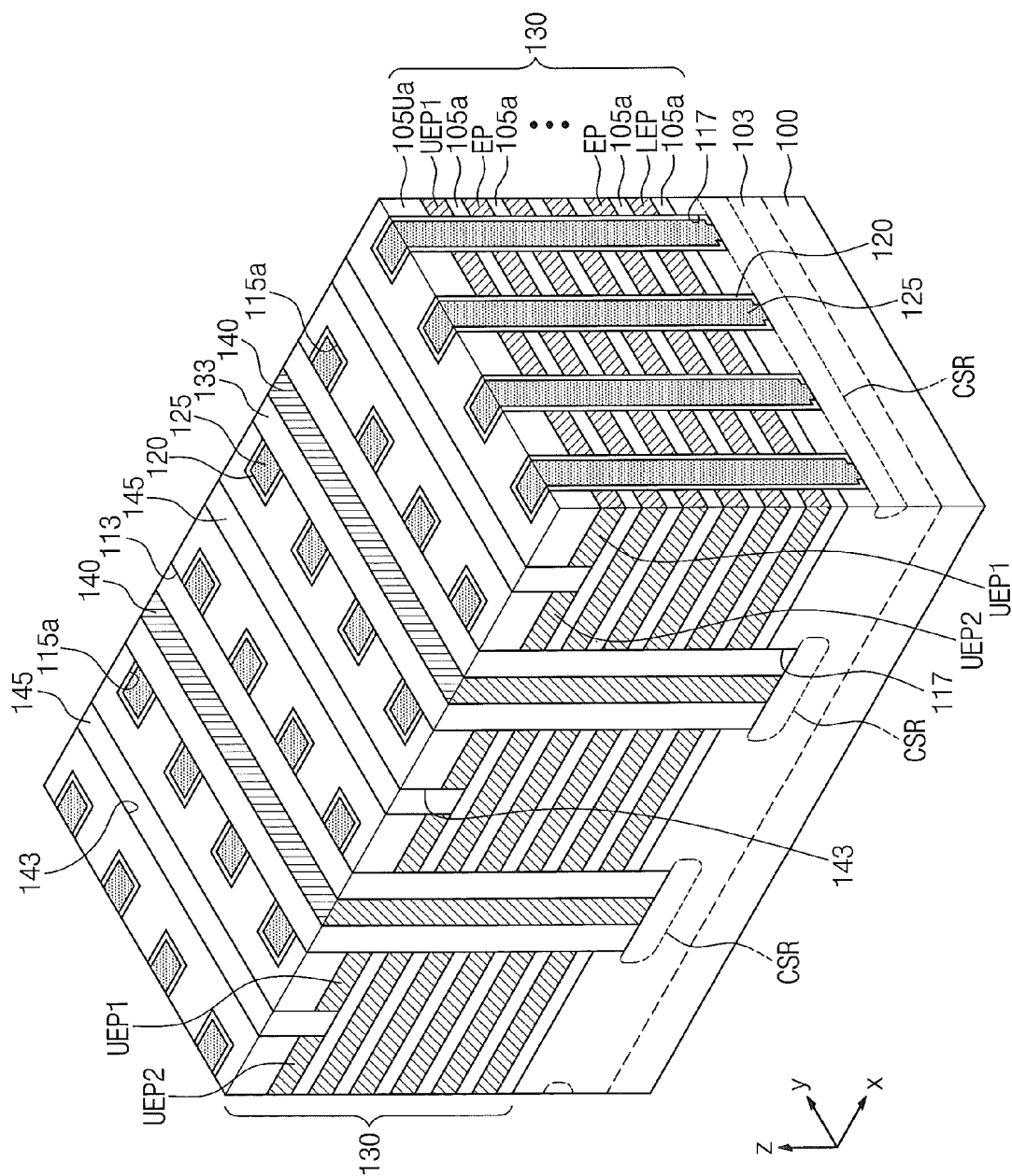

Referring to FIG. 20, contact conductive patterns 140 may be formed in the spaces 135, respectively. The contact conductive patterns 140 may fill the spaces 135 and may contact the common source regions CSR. The contact conductive patterns 140 may be formed by depositing a contact conductive layer filling the spaces 135 and planarizing the contact conductive layer.

At least the uppermost insulating pattern 105Ua and the uppermost electrode pattern UEP in each electrode structure 130 may be patterned to form a separating region 143. The separating region 143 may divide the uppermost electrode pattern UEP into first and second segments UEP1 and UEP2. Further, the separating region 143 may divide the uppermost insulating pattern 105Ua into a pair of portions. A separating dielectric pattern 145 may be formed to fill the separating region 143. The separating dielectric pattern 145 may include an oxide layer, a nitride layer and/or an oxynitride layer.

Subsequently, an interlayer dielectric layer 147, contact plugs 150 and interconnections 155 of FIGS. 1A to 1C may be formed. As such, the three dimensional semiconductor memory device disclosed in FIGS. 1A to 1D may be realized.

According to the above embodiment, the stack patterns 110a and the vertical grooves 115 may be simultaneously formed. Thus, further processes for aligning the vertical grooves 115 with the stack patterns 110a may not be required. As a result, fabrication processes may be simplified to realize a high reliable and highly integrated three dimensional semiconductor memory device.

Moreover, the vertical active patterns 125 may be respectively disposed in the vertical grooves 115a defined by both the opposite sidewalls of each electrode structure 130. Thus, vertical active patterns 125 may support the electrode structure 130, thereby realizing a high reliable three dimensional semiconductor memory device.

Hereinafter, modified embodiments of a method of fabricating three dimensional semiconductor memory devices according to embodiments of the inventive concept will be described with reference to the drawings.

Figure 21:
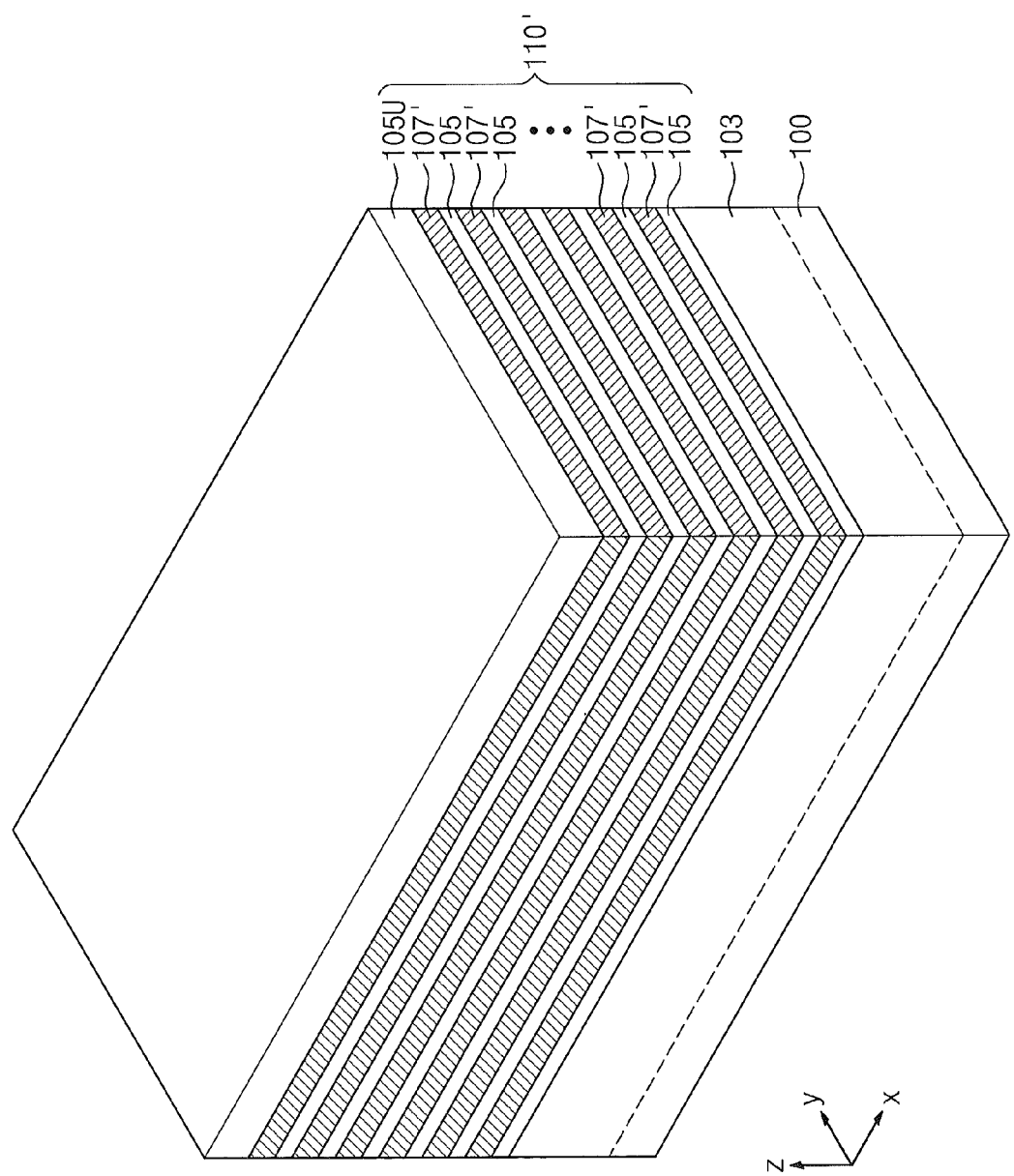
FIGS. 21 and 22 are perspective views illustrating a modified embodiment of a method of fabricating three dimensional semiconductor memory devices according to embodiments of the inventive concept.
Figure 22:
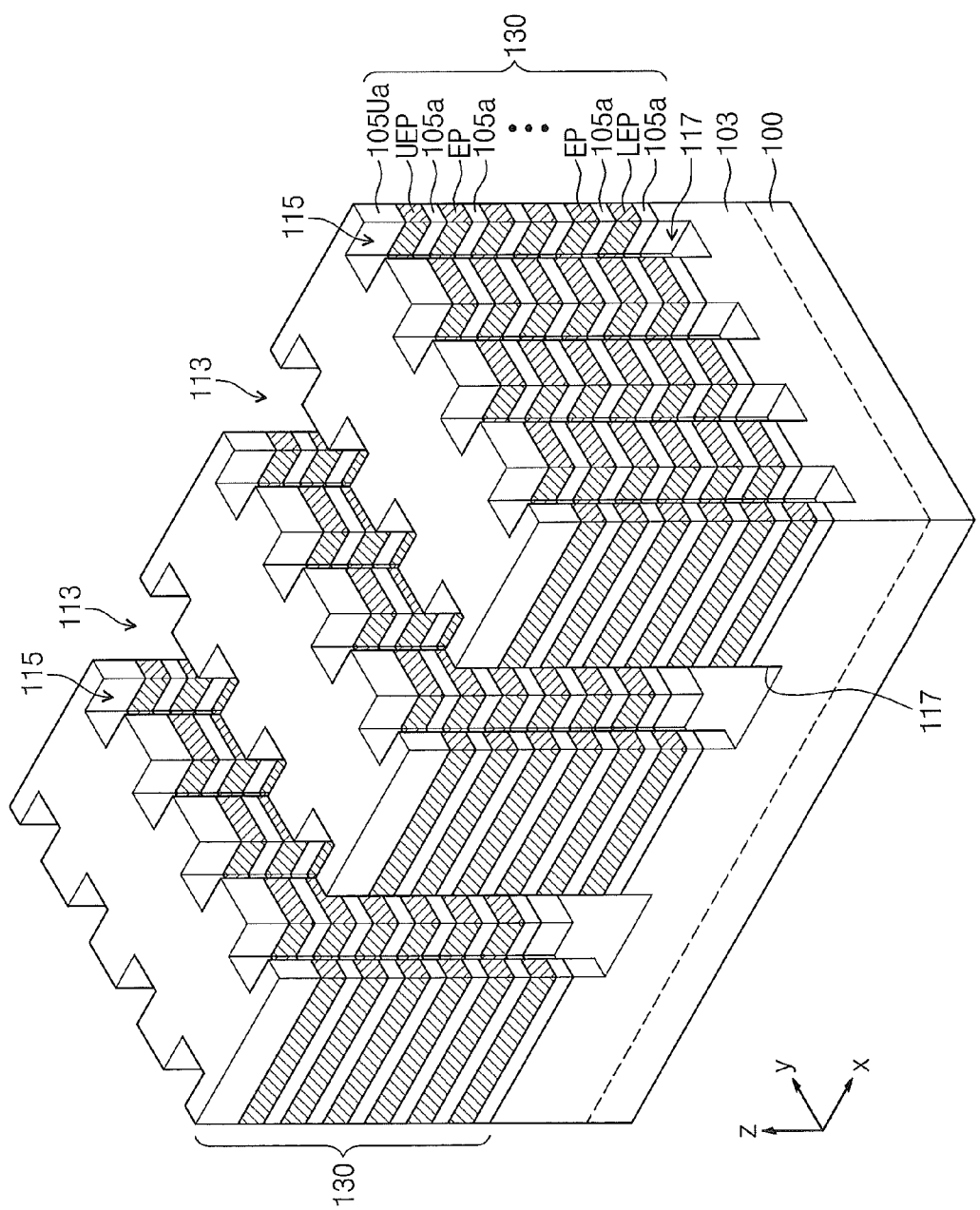

FIGS. 21 and 22 are perspective views illustrating a modified embodiment of a method of fabricating three dimensional semiconductor memory devices according to embodiments of the inventive concept.

Referring to FIG. 21, a stack structure 110' may be formed on a substrate 100 having a well region 103. The stack structure 110' may include insulating layers 105 and 105U and material layers 107' which are alternately and repeatedly stacked. In this case, the material layers 107' may be formed of a conductive layer.

Referring to FIG. 22, the stack structure 110' may be patterned to form a plurality of electrode structures 130. Trenches 113 may be defined between the electrode structures 130. Each of the electrode structures 130 may include insulating patterns 105a and 105Ua and electrode patterns LEP, EP and UEP which are alternately and repeatedly stacked. A plurality of vertical grooves 115a may be formed in the opposite or opposing sidewalls of each electrode structure 130. The electrode structures 130 and the vertical grooves 115a may be simultaneously formed. That is, the electrode structures 130 and the vertical grooves 115a may be defined by a single photo mask. Recessed regions 117 may be formed in the substrate under the trenches 113 and the vertical grooves 115a.

Subsequently, a data storing layer 120 and a vertical active pattern 125 may be formed in each vertical groove 115a in a same or similar manner as described with reference to FIGS. 14 to 16. The methods of fabricating three dimensional semiconductor memory devices according to the present modified embodiment may not require forming the empty regions 127 described with reference to FIGS. 18 and 19 and forming electrode patterns in the empty regions 127. After formation of the vertical active patterns 125, subsequent processes described with reference to FIGS. 19 and 20 may be performed.

Figure 23:
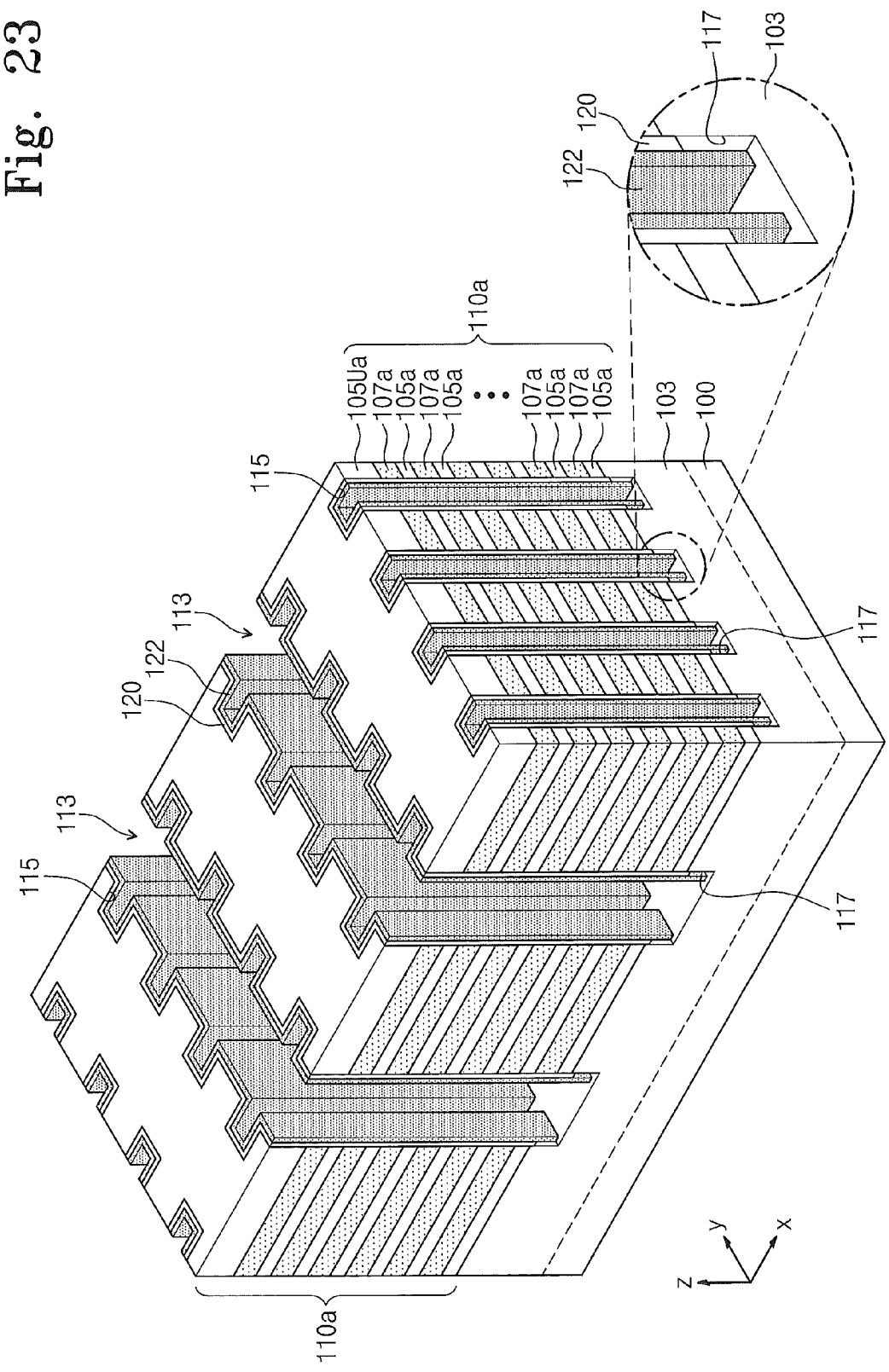
FIGS. 23 to 25 are perspective views illustrating another modified embodiment of a method of fabricating three dimensional semiconductor memory devices according to embodiments of the inventive concept.
Figure 24:
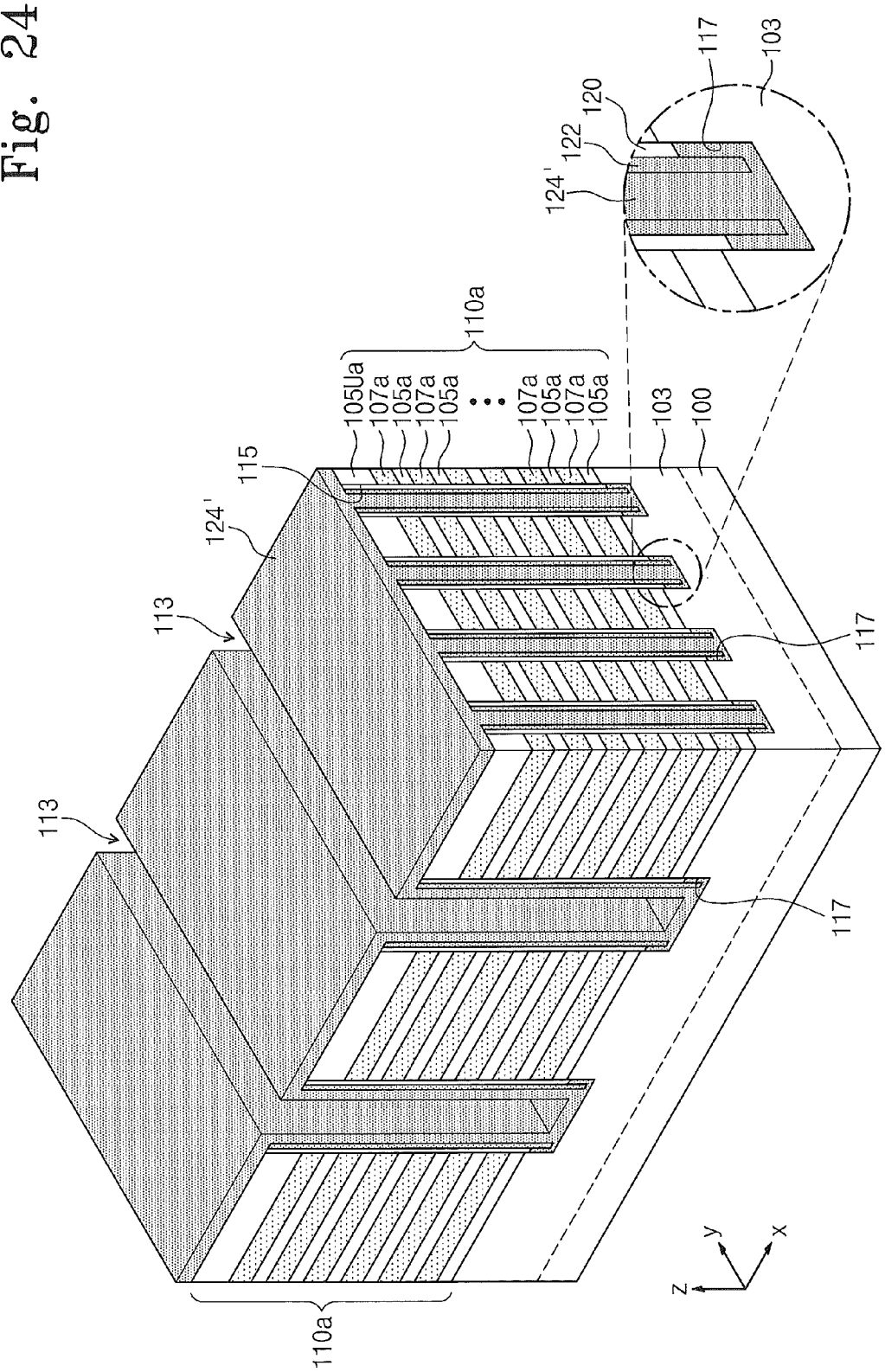
Figure 25:
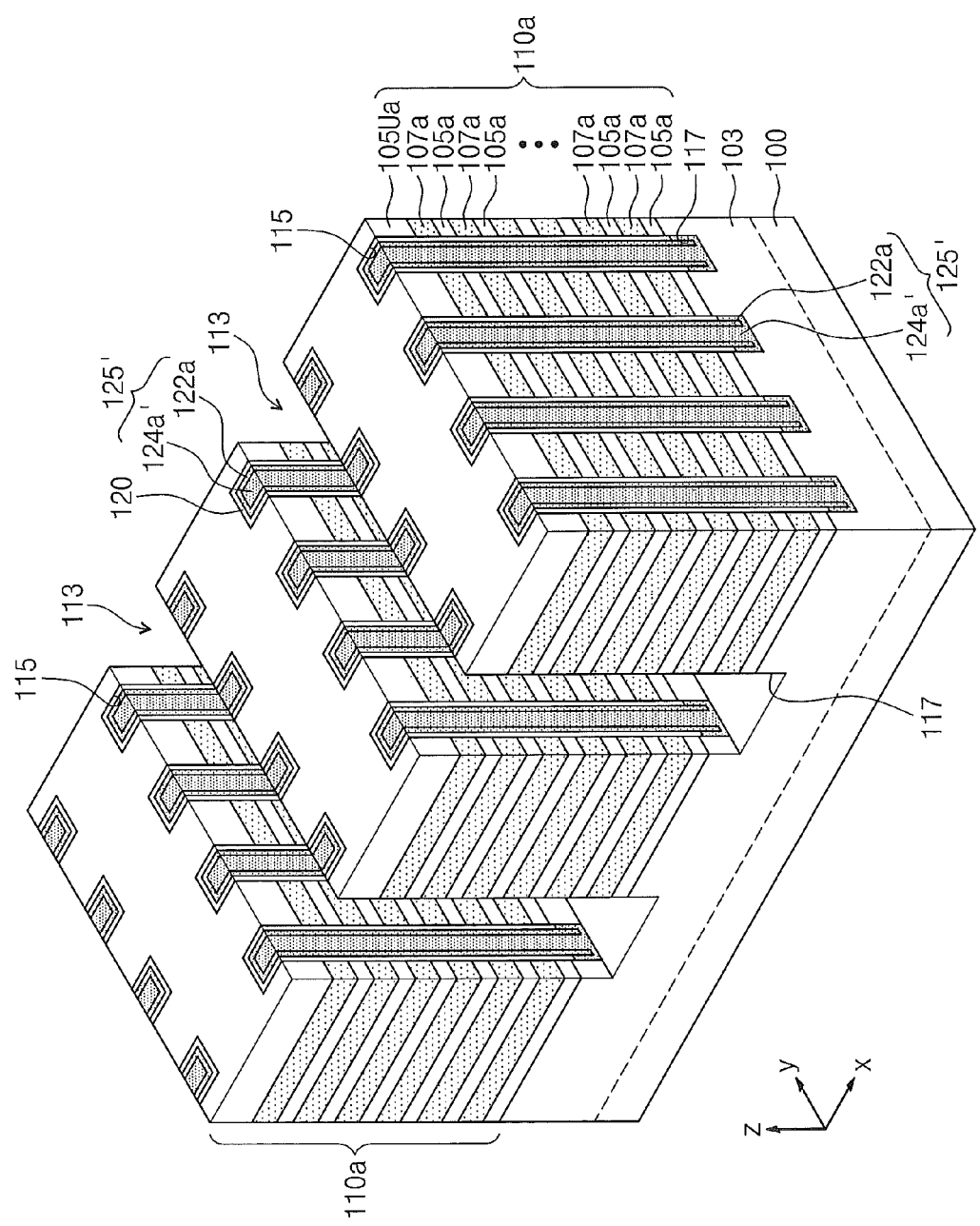

FIGS. 23 to 25 are perspective views illustrating another modified embodiment of a method of fabricating three dimensional semiconductor memory devices according to embodiments of the inventive concept. The fabrication methods according to the present modified embodiment may include the fabrication processes described with reference to FIGS. 12 and 14.

Referring to FIG. 23, after formation of the first active layer patterns 122, the data storing layer 120 exposed in the recessed region 117 may be etched to expose an inner surface and a bottom surface of the recessed region 117. In this case, the exposed data storing layer 120 may be etched using an isotropic dry etching technique or a wet etching technique. Although not shown in the drawings, when the data storing layer 120 in the recessed regions 117 is etched, a portion of the data storing layer 120 on the sidewall of each uppermost insulating pattern 105Ua and/or a portion of each uppermost insulating pattern 105Ua may be etched.

Referring to FIG. 24, a second active layer 124' may be formed on the resultant where the data storing layer 120 exposed in the recessed regions 117 is etched. The second active layer 124' may be in contact with the first active layer patterns 122. Further, the second active layer 124' may be in contact with the exposed bottom surfaces and the exposed inner sidewalls of the recessed regions 117.

Referring to FIG. 25, the second active layer 124' and the first active layer patterns 122, which are located outside the vertical grooves 115 and portions of the recessed regions 117 under the vertical grooves 115, may be removed to form vertical active patterns 125' remaining in the vertical grooves 115 and downwardly extending into the recessed regions 117 under the vertical grooves 115. Each of the vertical active patterns 125' may include a first active portion 122a and a second active portion 124a'. The vertical active patterns 125' may contact the bottom surfaces and the inner sidewalls of the recessed regions 117. The data storing layer 120 on the sidewalls of the stack patterns 110a outside the vertical grooves 115 may be removed.

Subsequent processes may be the same as or similar to those described with reference to FIGS. 17 to 20. As such, the three dimensional semiconductor memory device disclosed in FIGS. 2A to 2C may be realized.

Meanwhile, in the fabrication methods described with reference to FIGS. 23 to 25 and FIGS. 17 to 20, the vertical active patterns 125 may be laterally recessed. As a result, the vertical active patterns 125R disclosed in FIGS. 8A and 8B may be formed. In this case, the sidewall insulating patterns 133 of FIG. 19 may fill portions of the vertical grooves 115a. Thus, the three dimensional semiconductor memory device disclosed in FIGS. 8A and 8B may be realized.

In some embodiments, when the common source regions CSR illustrated in FIG. 19 are formed, the annealing process for activating the dopants may be sufficiently performed to form the common source regions CSR laterally diffused. As such, the common source regions CSR may be formed under the entire bottom surfaces of the recessed regions 117, as illustrated in FIG. 3. As a result, the three dimensional semiconductor memory device disclosed in FIG. 3 may be realized.

In some embodiments, the vertical grooves 115 of FIG. 13 and/or the vertical grooves 115a of FIG. 22 may be formed to have a rounded sidewall in a plan view, like the vertical grooves 215a illustrated in FIGS. 4A and 4B. As such, the three dimensional semiconductor memory device disclosed in FIGS. 4A and 4B may be realized.

Figure 26:
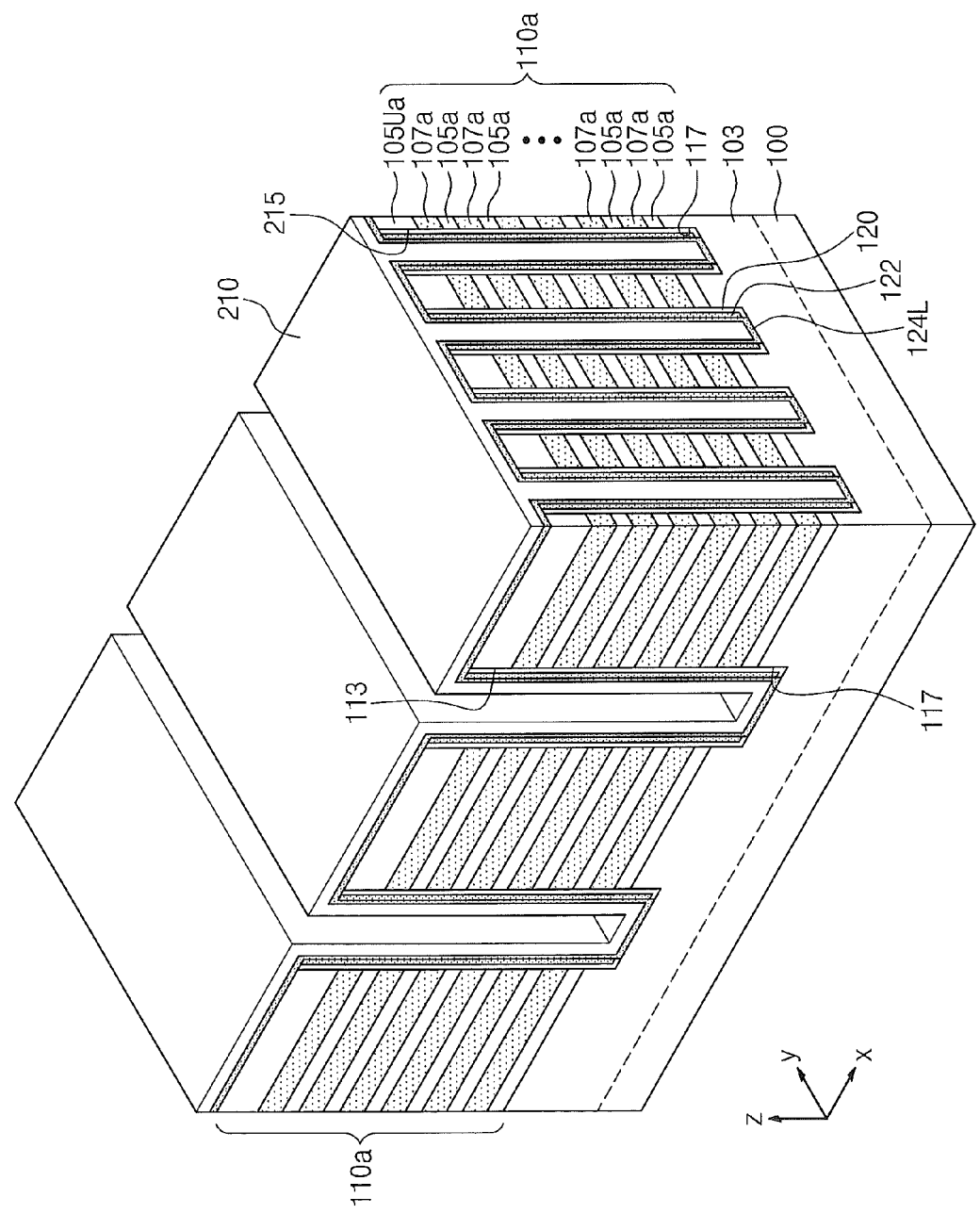
FIGS. 26 and 27 are perspective views illustrating still another modified embodiment of a method of fabricating three dimensional semiconductor memory devices according to embodiments of the inventive concept.
Figure 27:
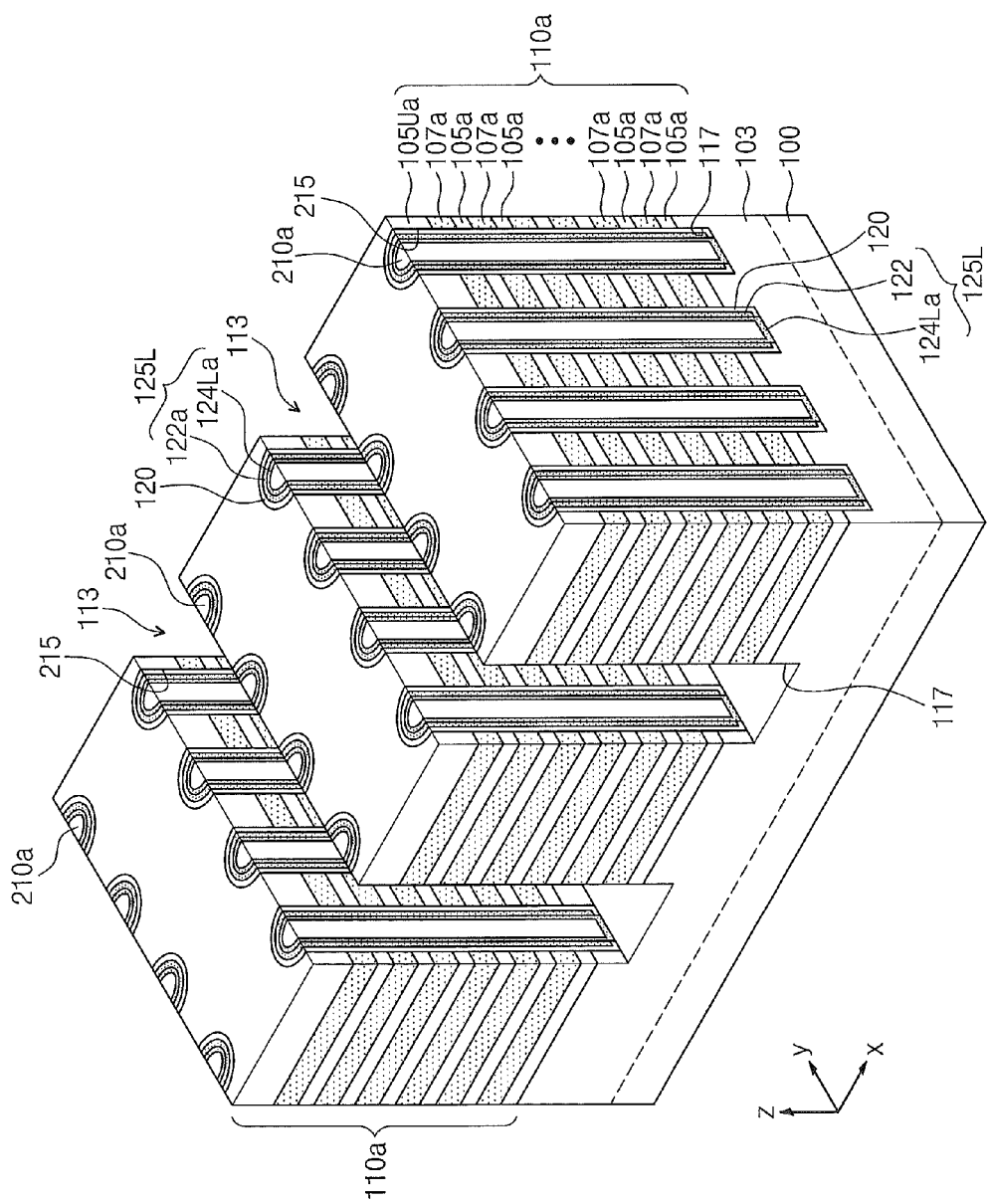

FIGS. 26 and 27 are perspective views illustrating still another modified embodiment of a method of fabricating three dimensional semiconductor memory devices according to embodiments of the inventive concept. The fabrication methods according to the present modified embodiment may include the fabrication processes described with reference to FIGS. 12 and 13. In this case, the vertical grooves 115 of FIG. 13 may be formed as vertical grooves 215 having a rounded sidewall in a plan view.

Referring to FIG. 26, the data storing layer 120 and the first active layer patterns 122 described with reference to FIG. 14 may be formed on the substrate having the vertical grooves 215 having a rounded sidewall in a plan view. A second active layer 124L may be then formed on the substrate having the first active layer patterns 122. The second active layer 124L may contact the first active layer patterns 122 and the bottom surfaces of the recessed regions 117. The second active layer 124L may be conformably formed. As such, the second active layer 124L may be formed to have substantially a uniform thickness on inner surfaces of the vertical grooves 215, sidewalls of the stack patterns 110a and bottom surfaces of the recessed regions 117. The second active layer 124L may be formed to partially fill the vertical grooves 215. That is, the second active layer 124L may be conformably formed in the grooves 215. The second active layer 124L may be formed of the same material as the second active layer 124 of FIG. 15.

A filling dielectric layer 210 may be formed on the substrate having the second active layer 124L. The filling dielectric layer 210 may be formed to fill the vertical grooves 215.

Referring to FIG. 27, the filling dielectric layer 210 may be etched to expose the second active layer 124L formed on the sidewalls of the stack patterns 110a outside the vertical grooves 215. As a result, filling dielectric patterns 210a may be formed in the vertical grooves 215, respectively. The second active layer 124L and the first active layer patterns 122 outside the vertical grooves 215 may be removed to form vertical active patterns 125L which are respectively located in the vertical grooves 215. The data storing layer 120 on the sidewalls of the stack patterns 110a outside the vertical grooves 215 may be then removed. Subsequent processes may be performed using the processes described with reference to FIGS. 17 to 20. As such, the three dimensional semiconductor memory device disclosed in FIGS. 5A and 5B may be realized.

Figure 28:
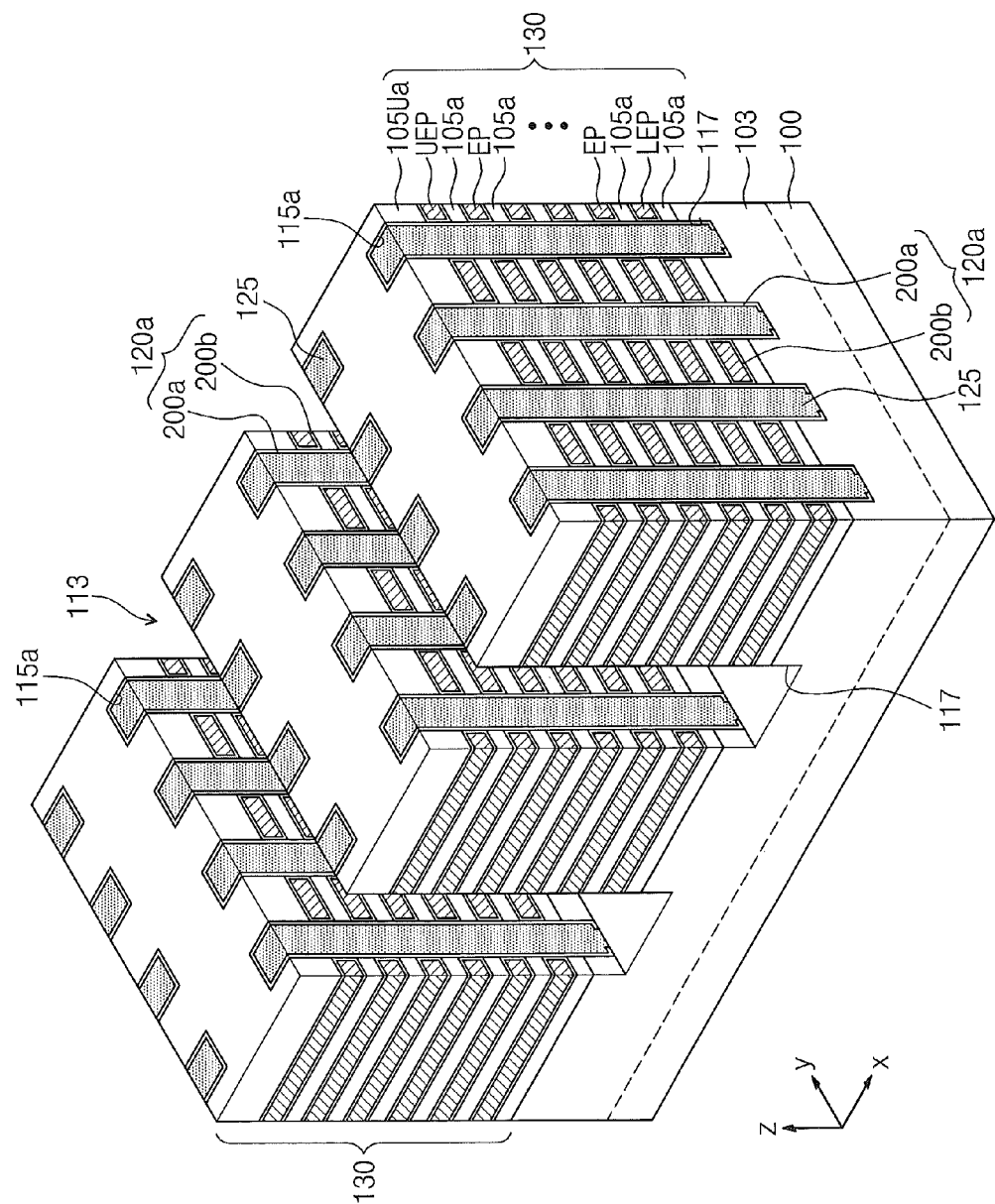
FIG. 28 is a perspective view illustrating yet another modified embodiment of a method of fabricating three dimensional semiconductor memory devices according to embodiments of the inventive concept.

FIG. 28 is a perspective view illustrating yet another modified embodiment of a method of fabricating three dimensional semiconductor memory devices according to embodiments of the inventive concept. The fabrication methods according to the present modified embodiment may be similar to the fabrication method described with reference to FIGS. 12 to 20. Thus, to avoid duplicate explanation, differences between the present modified embodiment and the embodiment of FIGS. 12 to 20 will be mainly described in detail hereinafter.

Referring to FIG. 28, a data storing layer 120a may be formed to include a first portion 200a and a second portion 200b. The first portion 200a of the data storing layer 120a may be formed before forming the first active layer described with reference to FIG. 14. The second portion 200b of the data storing layer 120a may be conformably formed in the empty regions (127 of FIG. 17) prior to formation of the electrode patterns LEP, EP and UEP of FIG. 18. The electrode patterns LEP, EP and UEP may be then formed in the empty regions 127 surrounded by the second portion 200b of the data storing layer 120a, respectively. Subsequent processes may be performed using the processes described with reference to FIGS. 19 and 20. As such, the three dimensional semiconductor memory device disclosed in FIGS. 6A to 6C may be realized.

Figure 29:
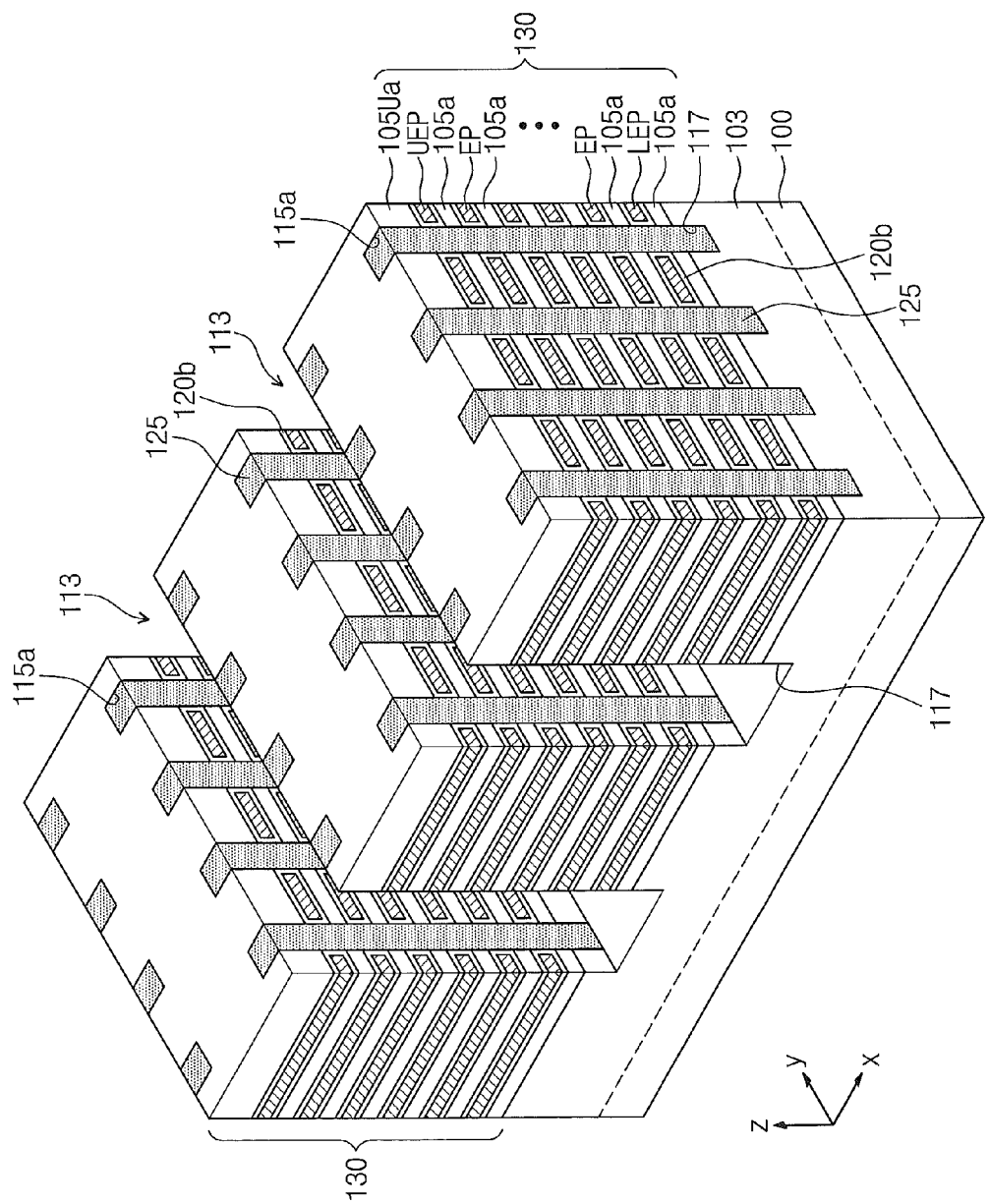
FIG. 29 is a perspective view illustrating still yet another modified embodiment of a method of fabricating three dimensional semiconductor memory devices according to embodiments of the inventive concept.

FIG. 29 is a perspective view illustrating still yet another modified embodiment of a method of fabricating three dimensional semiconductor memory devices according to embodiments of the inventive concept. The fabrication methods according to the present modified embodiment may be similar to the fabrication method described with reference to FIGS. 12 to 20.

According to the present modified embodiment, processes for forming the data storing layer 120 and the first active layer patterns 122 illustrated in FIG. 14 may be omitted. In this case, the active layer 124 of FIG. 15 may be formed directly in the vertical grooves 115. The active layer 124 may be then etched to form vertical active patterns 125 respectively disposed in the vertical grooves 115. Thus, the vertical active patterns 125 may be in contact with inner surfaces of the vertical grooves 115, respectively.

Referring to FIG. 29, material patterns (107a of FIG. 16) may be removed to form empty regions 127, and a data storing layer 120b may be formed in the empty regions 127. Electrode patterns LEP, EP and UEP may be formed in the empty regions 127 surrounded by the data storing layer 120b, respectively. Subsequent processes may be performed using the processes described with reference to FIGS. 19 and 20. As such, the three dimensional semiconductor memory device disclosed in FIGS. 7A and 7B may be realized.

Figure 30:
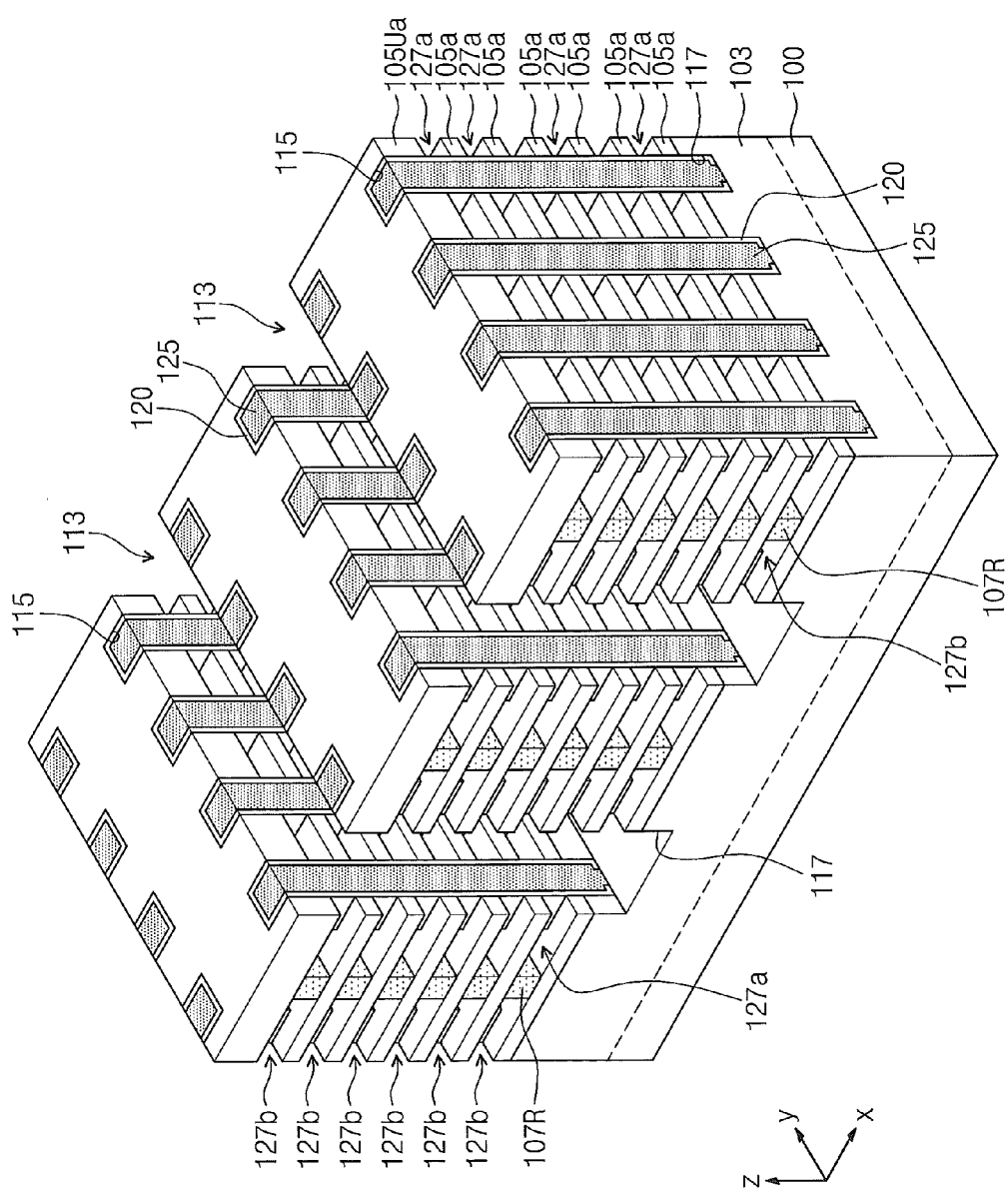
FIGS. 30 and 31 are perspective views illustrating a further modified embodiment of a method of fabricating three dimensional semiconductor memory devices according to embodiments of the inventive concept.
Figure 31:
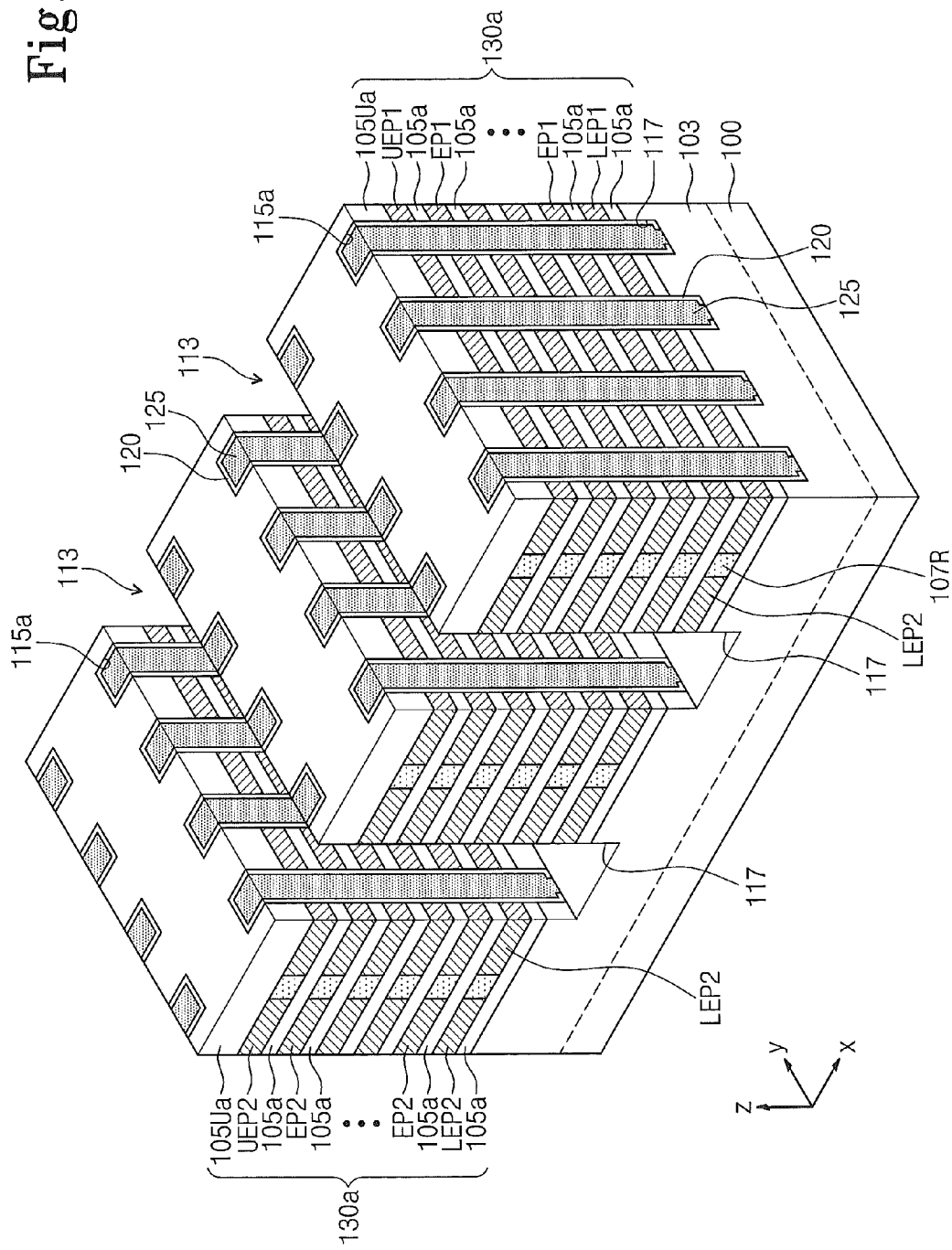

FIGS. 30 and 31 are perspective views illustrating a further modified embodiment of a method of fabricating three dimensional semiconductor memory devices according to embodiments of the inventive concept. The fabrication methods according to the present modified embodiment may include the fabrication processes described with reference to FIGS. 12 to 16.

Referring to FIGS. 16 and 30, the exposed material patterns 107a may be removed to form empty regions 127a and 127b. After formation of the empty regions 127a and 127b, a portion 107R of each material pattern 107a may remain to divide the region between the pair of adjacent stacked insulating patterns 105a into a first empty region 127a and a second empty region 127b. Hereinafter, the remaining portions 107R of the material patterns 107a may be referred to as partition patterns. As a result, the first empty region 127a and the second empty region 127b may be disposed at both sides of the partition pattern 107R, respectively. The first and second empty regions 127a and 127b respectively disposed at both sides of each partition pattern 107R may be located at a same level. According to the present modified embodiment, the material patterns 107a may be formed of a material layer having an etch selectivity with respect to the insulating patterns 105a and 105Ua.

Referring to FIG. 31, a conductive layer filling the first and second empty regions 127a and 127b may be formed on the substrate having the partition patterns 107R. The conductive layer outside the first and second empty regions 127a and 127b may be removed to form first segments LEP1, EP1 and UEP1 respectively filling the first empty regions 127a and second segments LEP2, EP2 and UEP2 respectively filling the second empty regions 127b. As such, electrode structures 130a may be formed on the substrate 100. Each of the electrode structures 130a may include insulating patterns 105a and 105Ua and electrode patterns which are alternately and repeatedly stacked. Each of the electrode patterns may be divided into first and second segments LEP1 and LEP2, EP1 and EP2 or UEP1 and UEP2 which are laterally separated by each partition pattern 107R. The first segments LEP1, EP1 and UEP1 stacked in each electrode structure 130a may be coupled to the vertical active patterns 125 disposed adjacent to a first sidewall of the electrode structure 130a, and the second segments LEP2, EP2 and UEP2 stacked in each electrode structure 130a may be coupled to the vertical active patterns 125 disposed adjacent to a second sidewall opposite to the first sidewall of the electrode structure 130a. In some embodiments, at least the lowermost first and second segments LEP1 and LEP2 may correspond to ground selection gates, and at least the uppermost first and second segments UEP1 and UEP2 may correspond to string selection gates.

Subsequently, the sidewall insulating patterns 133, the common source regions CSR and the contact conductive patterns 140 of FIGS. 9A to 9C may be formed on the substrate having the first and second segments LEP1 and LEP2, EP1 and EP2 or UEP1 and UEP2. The sidewall insulating patterns 133, the common source regions CSR and the contact conductive patterns 140 may be formed in a same or similar manner as described with reference to FIGS. 19 and 20. The interlayer dielectric layer 147, the contact plugs 150 and the interconnections 155 of FIGS. 9A to 9C may be then formed on the substrate having the sidewall insulating patterns 133, the common source regions CSR and the contact conductive patterns 140. As such, the three dimensional semiconductor memory device disclosed in FIGS. 9A to 9C may be realized.

Figure 32:
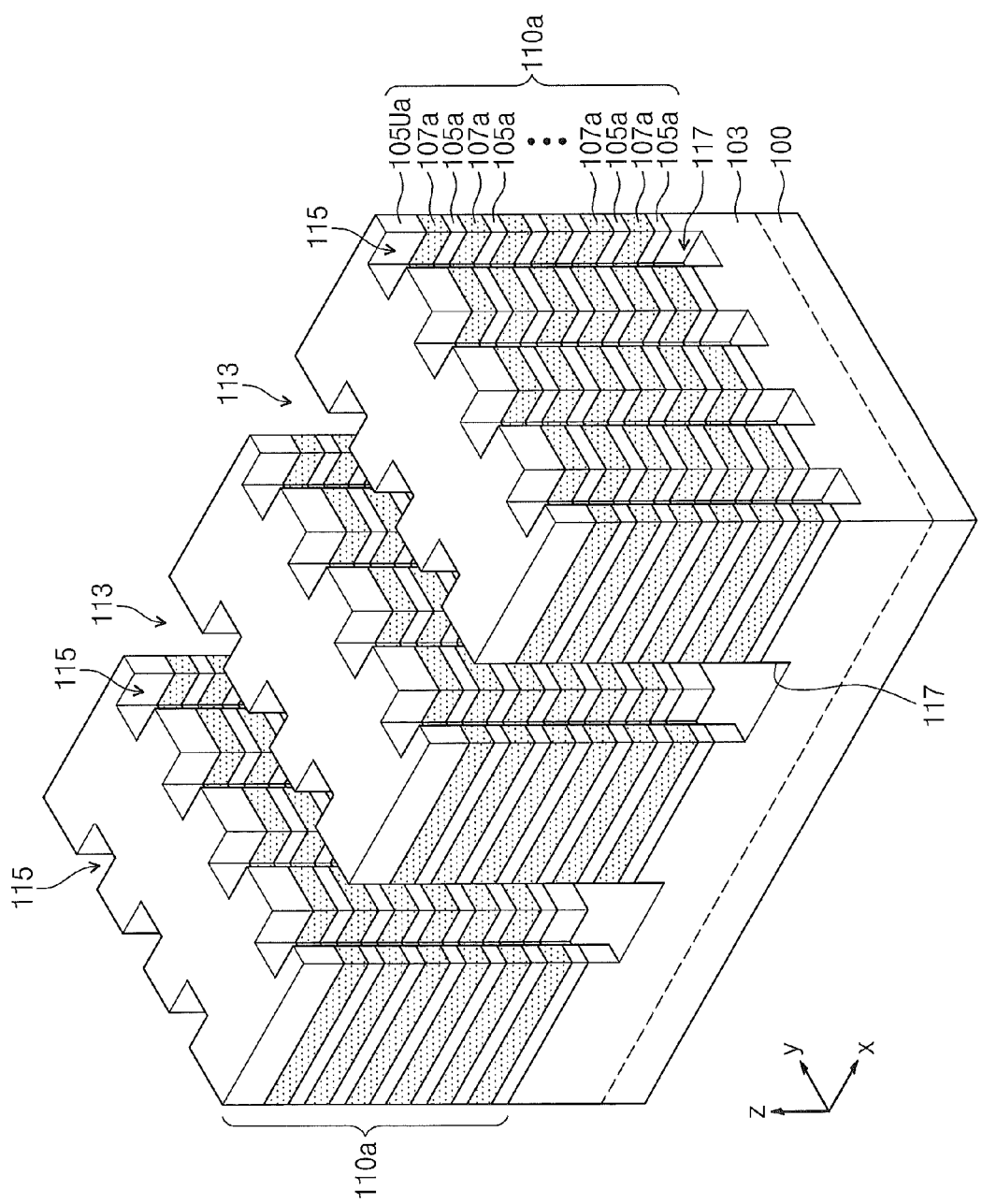
FIG. 32 is a perspective view illustrating a still further modified embodiment of a method of fabricating three dimensional semiconductor memory devices according to embodiments of the inventive concept.

FIG. 32 is a perspective view illustrating a still further modified embodiment of a method of fabricating three dimensional semiconductor memory devices according to embodiments of the inventive concept. The fabrication methods according to the present modified embodiment may be similar to the fabrication method described with reference to FIGS. 12 to 19.

Referring to FIG. 32, a plurality of vertical grooves 115 may be formed at both the opposite sidewalls of each stack pattern 110a. The vertical grooves 115 formed adjacent to one of the opposing sidewalls of the stack pattern 110a may be respectively offset along the Y-axis direction from central positions of the vertical grooves 115 formed adjacent to the other of the opposing sidewalls of the stack pattern 110a. As such, the vertical grooves 115 formed adjacent to one of the opposite sidewalls of the stack pattern 110a may not be aligned with the vertical grooves 115 formed adjacent to the other of the opposite sidewalls of the stack pattern 110a along a second direction (e.g., the X-axis direction) that is perpendicular to the first direction. For example, the vertical grooves 115 formed at both the sidewalls of the stack pattern 110a may be arrayed in a zigzag fashion in the first direction when viewed from a plan view.

Subsequent processes may be performed using the processes described with reference to FIGS. 14 to 19. The contact conductive patterns 140, the interlayer dielectric layer 147, the contact plugs 150 and the interconnections 155a illustrated in FIGS. 10A to 10C may be then formed on the substrate having the common source regions CSR and the sidewall insulating patterns 133. As such, the three dimensional semiconductor memory device disclosed in FIGS. 10A to 10C may be realized. The fabrication methods according to the present modified embodiment may not require forming the separating regions 143 and forming the separating dielectric patterns 145, which are described with reference to FIG. 20.

Figure 33:
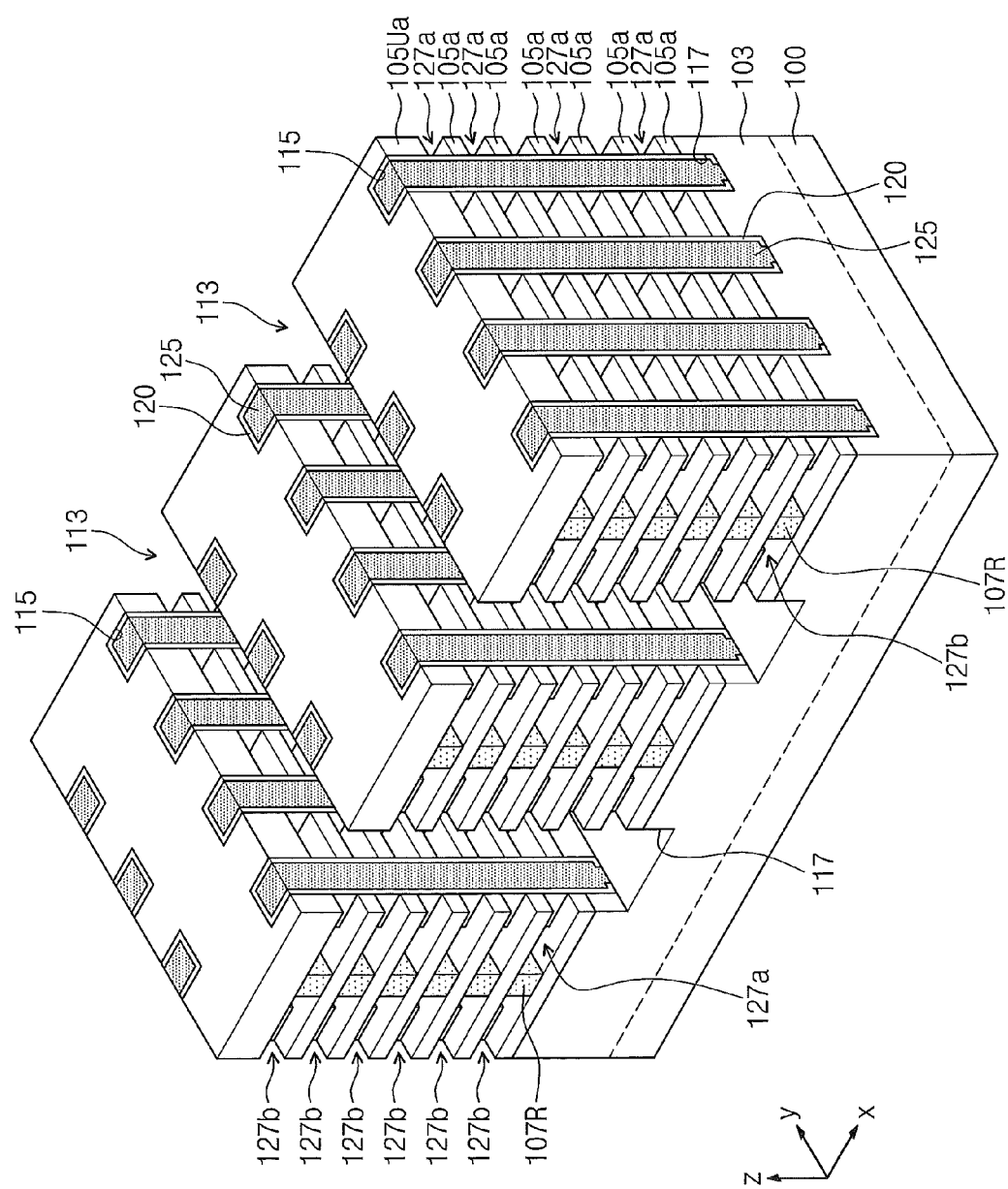
FIG. 33 is a perspective view illustrating a yet further modified embodiment of a method of fabricating three dimensional semiconductor memory devices according to embodiments of the inventive concept.

FIG. 33 is a perspective view illustrating a yet further modified embodiment of a method of fabricating three dimensional semiconductor memory devices according to embodiments of the inventive concept. The present modified embodiment may correspond to a combination of the modified embodiment described with reference to FIG. 32 and the modified embodiment described with reference to FIGS. 30 and 31.

Referring to FIGS. 32 and 33, after formation of the vertical grooves 115 arrayed zigzag in each stack pattern 110a, data storing layers 120 and vertical active patterns 125 may be formed in the vertical grooves 115. The data storing layers 120 and the vertical active patterns 125 may be formed in a same or similar manner as described with reference to FIGS. 14 to 16.

Subsequently, the material patterns 107a may be isotropically etched to form first empty regions 127a and second empty regions 127b. As such, a portion 107R of each material pattern 107a may remain. The remaining portions 107R of the material patterns 107a may be referred to as partition patterns. The segments LEP1, LEP2, EP1, EP2, UEP1 and UEP2 of FIGS. 11A to 11C may be then formed to fill the empty regions 127a and 127b, respectively. Further, the sidewall insulating patterns 133, the common source regions CSR and the contact conductive patterns 140 of FIGS. 11A to 11C may be formed. The sidewall insulating patterns 133, the common source regions CSR and the contact conductive patterns 140 may be formed using a same or similar manner as described with reference to FIGS. 19 and 20. Next, the interlayer dielectric layer 147, the contact plugs 150 and the interconnections 155a of FIGS. 11A to 11C may be formed. As a result, the three dimensional semiconductor memory device disclosed in FIGS. 11A to 11C may be realized.

The fabrication methods described with reference to FIGS. 12 to 33 may be combined with each other. For example, the fabrication process of the vertical active patterns 125' contacting the inner sidewalls of the recessed regions 117, which is described with reference to FIGS. 23 to 25, may be applied to the methods of fabricating the three dimensional semiconductor memory device illustrated in FIGS. 4A and 4B, the methods of fabricating the three dimensional semiconductor memory device illustrated in FIGS. 5A and 5B, the methods of fabricating the three dimensional semiconductor memory device illustrated in FIGS. 6A to 6C, the methods of fabricating the three dimensional semiconductor memory device illustrated in FIGS. 7A to 7C, the methods of fabricating the three dimensional semiconductor memory device illustrated in FIGS. 9A to 9C, the methods of fabricating the three dimensional semiconductor memory device illustrated in FIGS. 10A to 10C and/or the methods of fabricating the three dimensional semiconductor memory device illustrated in FIGS. 11A to 11C. That is, any features of the fabrication methods described above may be combined with each other to the extent that they are not mutually exclusive.

The three dimensional semiconductor memory devices described above may be encapsulated using various packaging techniques. For example, the three dimensional semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the three dimensional semiconductor memory devices according to the above embodiments is mounted may further include at least one semiconductor device (e.g., a controller and/or a logic device) that controls the three dimensional semiconductor memory devices.

Figure 34:
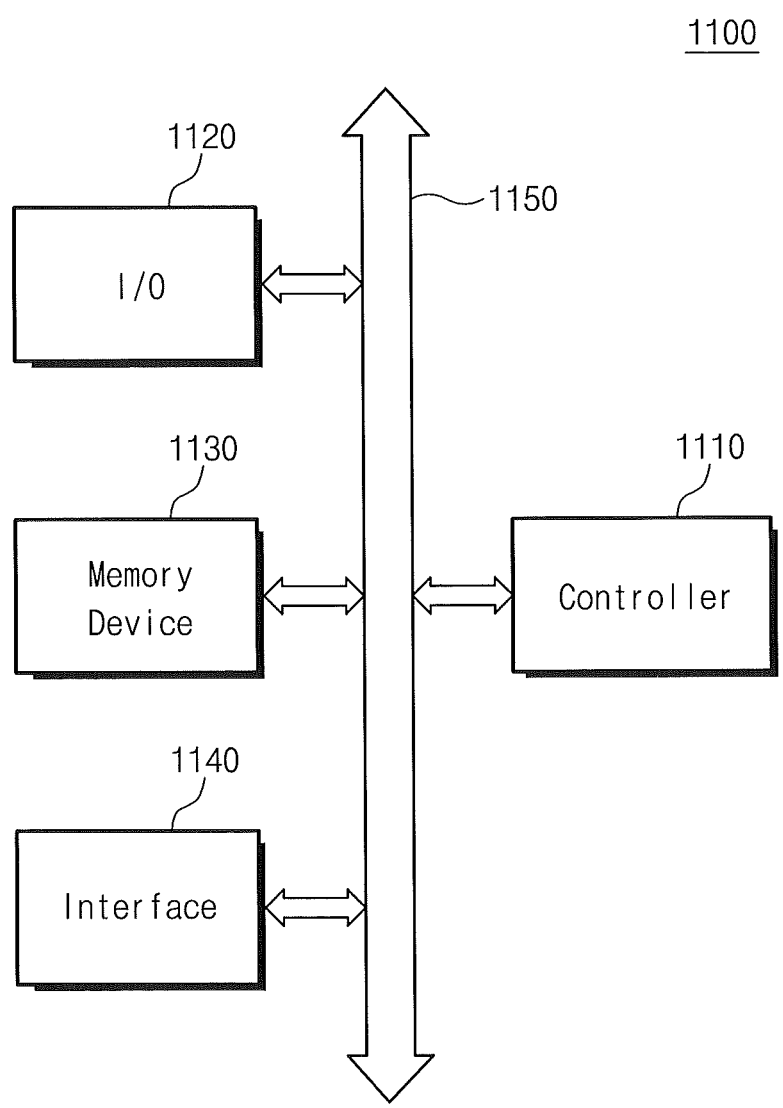
FIG. 34 is a schematic block diagram illustrating an example of electronic systems including three dimensional semiconductor memory devices according to embodiments of the inventive concept.

FIG. 34 is a schematic block diagram illustrating an example of electronic systems including three dimensional semiconductor memory devices according to embodiments of the inventive concept.

Referring to FIG. 34, an electronic system 1100 according to some embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the three dimensional semiconductor memory devices according to the embodiments described above. The memory device 1130 may further include another type of semiconductor memory device which is different from the three dimensional semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be used in a personal digital assistant (PDA), a portable computer, a web tablet, a wireless phone, a mobile phone, a digital music player, a memory card or another electronic product. The other electronic product may receive or transmit information data by wireless communication.

Figure 35:
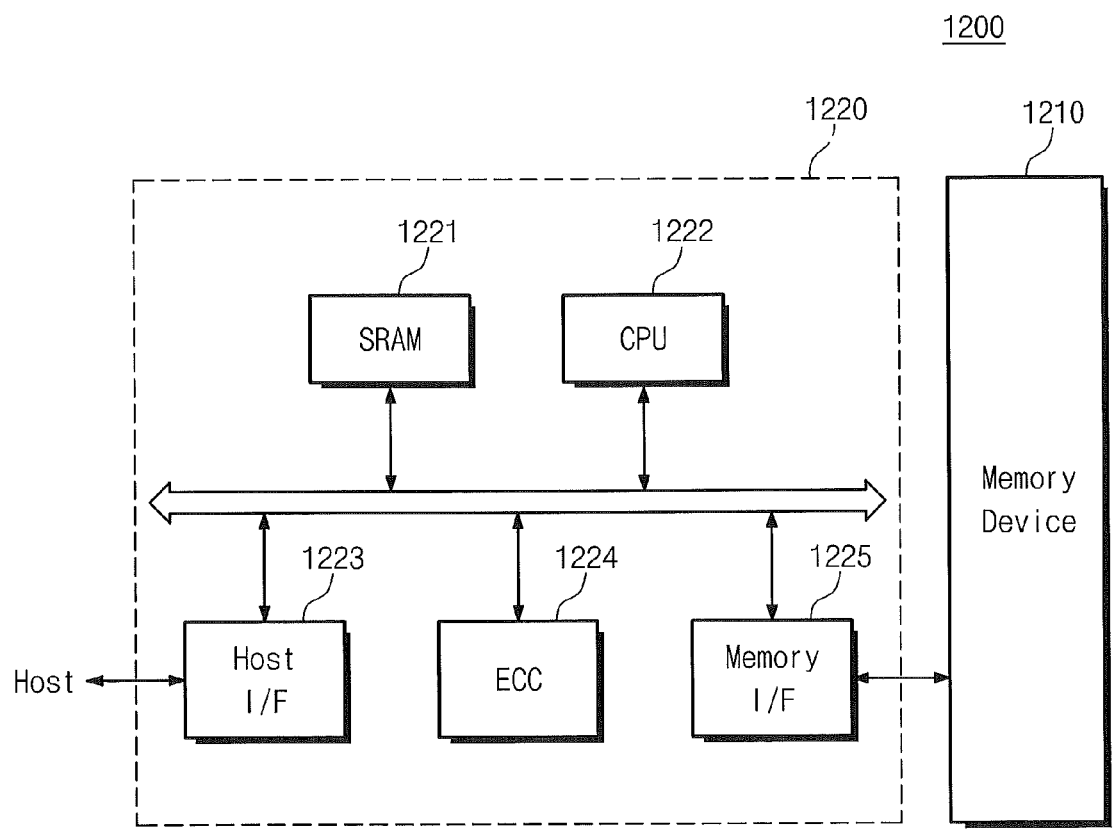
FIG. 35 is a schematic block diagram illustrating an example of memory cards including three dimensional semiconductor memory devices according to embodiments of the inventive concept.

FIG. 35 is a schematic block diagram illustrating an example of a memory card including the three dimensional semiconductor memory devices according to the embodiments of the inventive concept.

Referring to FIG. 35, a memory card 1200 according to some embodiments of the inventive concept may include a memory device 1210. The memory device 1210 may include at least one of the three dimensional semiconductor memory devices according to the various embodiments mentioned above. In other embodiments, the memory device 1210 may further include another type of semiconductor memory device which is different from the three dimensional semiconductor memory devices according to the embodiments described above. For example, the memory device 1210 may further include a magnetic memory device, a phase change memory device, a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operational memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. The memory card 1200 may also replace hard disks of computer systems to provide solid state disks of the computer systems.

According to the embodiments set forth above, vertical active patterns may be disposed in vertical grooves defined in opposite or opposing sidewalls of each electrode structure. As such, the vertical active patterns may be directly connected to common source regions disposed at sides of the electrode structure. As a result, a length of a current path between channel regions in each vertical active pattern and the common source region may be decreased during operation of a semiconductor device including the vertical active patterns and the common source region. Further, each electrode structure may be supported by the vertical active patterns disposed at both sides of the electrode structure. Thus, a leaning phenomenon of the electrode structure may be suppressed. As a result, a high reliable and highly integrated three dimensional semiconductor memory device may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:
1. A three dimensional semiconductor memory device, comprising:
a substrate;
an electrode structure including a plurality of conductive electrode patterns and insulating patterns alternatingly stacked on the substrate, wherein opposite sidewalls of the electrode structure include respective grooves therein extending in a direction substantially perpendicular to the substrate;

first and second active patterns protruding from the substrate and extending within the grooves in the opposite sidewalls of the electrode structure, respectively; and respective data storing layers in the grooves extending between the conductive electrode patterns of the electrode structure and sidewalls of the first and second active patterns adjacent thereto.

2. The device of claim 1, wherein the substrate includes respective common source regions of a second conductivity type therein adjacent the opposite sidewalls of the electrode structure and a well region of a first conductivity type therebetween, and wherein the first and second active patterns contact the respective common source regions.

3. The device of claim 2, wherein the first and second active patterns directly contact the respective common source regions and the well region.

4. The device of claim 3, wherein the first and second active patterns directly contact the well region at respective bottom portions and/or at respective sidewalls thereof.

5. The device of claim 2, further comprising:
an interconnection line electrically connected to the first and second active patterns,
wherein an uppermost one of the conductive electrode patterns opposite the substrate comprises first and second segments that are electrically isolated from one another.

6. The device of claim 5, wherein each of the conductive electrode patterns comprises first and second segments that are electrically isolated from one another by a partition pattern comprising an insulating material having an etching selectivity with that of the insulating patterns of the electrode structure.

7. The device of claim 2, further comprising:
first and second interconnection lines extending substantially parallel to one another and electrically connected to the first and second active patterns, respectively,
wherein the respective grooves in the opposite sidewalls of the electrode structure and the first and second active patterns therein are offset relative to one another along a direction substantially perpendicular to that of the first and second interconnection lines.

8. The device of claim 1, wherein the respective data storing layers further comprise a tunnel dielectric layer, a charge storage layer, and a blocking dielectric layer extending between the conductive electrode patterns and the sidewalls of the first and second active patterns.

9. The device of claim 8, wherein the blocking dielectric layer further extends between the insulating patterns and the conductive electrode patterns.

10. The device of claim 1, wherein the respective data storing layers extend along the respective grooves in the opposite sidewalls of the electrode structure between the insulating patterns and the sidewalls of the first and second active regions, and further extend into respective recessed regions of the substrate adjacent to the opposite sidewalls.

11. The device of claim 1, wherein the respective grooves define a substantially concave shape, and wherein the sidewalls of the first and second active patterns adjacent to the grooves have the substantially concave shape.

12. The device of claim 11, wherein respective sidewalls of the first and second active patterns opposite the grooves define a substantially planar shape.

13. The device of claim 11, further comprising:
respective dielectric patterns protruding from the substrate and extending along the first and second active patterns in the respective grooves.

14. The device of claim 1, further comprising:
sidewall insulating layers extending along the opposite sidewalls of the electrode structure and at least partially into the respective grooves.

15. A three dimensional semiconductor memory device comprising:
an electrode structure including electrode patterns and insulating patterns alternately and repeatedly stacked on a substrate;
a vertical active pattern disposed in a vertical groove defined in a sidewall of the electrode structure, the vertical groove extending in a direction substantially perpendicular to the substrate;
a filling dielectric pattern disposed in the vertical groove, wherein the vertical active pattern is disposed between the filling dielectric pattern and an inner surface of the vertical groove, and wherein the vertical active pattern is disposed along the inner surface of the vertical groove with a substantially uniform thickness; and
a data storing layer between the respective electrode patterns and a sidewall of the vertical active pattern.

16. The device of claim 15, further comprising:
a well region in the substrate and doped with dopants of a first conductivity type; and
a common source region in the well region adjacent the sidewall of the electrode structure and doped with dopants of a second conductivity type,
wherein the vertical active pattern is connected to the common source region.

17. The device of claim 16, wherein the vertical active pattern is also connected to the well region.

18. The device of claim 17, wherein the vertical active pattern downwardly extends into a recessed region in the substrate under the vertical groove, and
wherein the vertical active pattern contacts a bottom surface of the recessed region.

19. The device of claim 18, wherein the vertical active pattern contacts an inner sidewall of the recessed region.

20. The device of claim 16, wherein a reference voltage is applied to the common source region in an operation mode.

21. The device of claim 15, wherein the vertical groove has a rounded sidewall in a plan view.

22. The device of claim 15, wherein the vertical active pattern covers an entire portion of the inner surface of the vertical groove.

23. The device of claim 15, wherein the vertical active pattern is laterally recessed from the sidewall of the electrode structure which is located outside the vertical groove.

24. The device of claim 15, wherein the data storing layer vertically extends to intervene between the insulating patterns and the sidewall of the vertical active pattern.

25. The device of claim 15, wherein a first portion of the data storing layer vertically extends to intervene between the insulating patterns and the sidewall of the vertical active pattern, and
wherein a second portion of the data storing layer horizontally extends to cover a bottom surface and a top surface of the respective electrode patterns.

26. The device of claim 15, wherein an entire portion of the data storing layer horizontally extends to cover a bottom surface and a top surface of the respective electrode patterns.

27. The device of claim 15, wherein each of the stacked electrode patterns is divided into a first segment and a second segment which are separated from each other at a same level, the device further comprising;
 a partition pattern between the respective first segments and the respective second segments located at the same level,
 wherein the partition patterns include an insulating material having an etch selectivity with respect to the insulating patterns.

28. A three dimensional semiconductor memory device comprising:
 an electrode structure including electrode patterns and insulating patterns alternately and repeatedly stacked on a substrate;
 a well region in the substrate and doped with dopants of a first conductivity type;
 a common source region in the well region adjacent a sidewall of the electrode structure and doped with dopants of a second conductivity type;
 a vertical active pattern disposed in a vertical groove defined in the sidewall of the electrode structure, the vertical groove extending in a direction substantially perpendicular to the substrate, wherein the vertical active pattern is connected to the well region and the common source region; and
 a data storing layer between the respective electrode patterns and a sidewall of the vertical active pattern,
 wherein the vertical active pattern downwardly extends into a recessed region in the substrate under the vertical groove and contacts a bottom surface of the recessed region, and
 wherein a first portion and a second portion of the bottom surface of the vertical active pattern contact the well region and the common source region, respectively.

29. A three dimensional semiconductor memory device comprising:
 an electrode structure including electrode patterns and insulating patterns alternately and repeatedly stacked on a substrate;
 a well region in the substrate and doped with dopants of a first conductivity type;
 a common source region in the well region adjacent a sidewall of the electrode structure and doped with dopants of a second conductivity type;
 a vertical active pattern disposed in a vertical groove defined in the sidewall of the electrode structure, the vertical groove extending in a direction substantially perpendicular to the substrate, wherein the vertical active pattern is connected to the well region and the common source region; and
 a data storing layer between the respective electrode patterns and a sidewall of the vertical active pattern,
 wherein the vertical active pattern downwardly extends into a recessed region in the substrate under the vertical groove and contacts a bottom surface and an inner sidewall of the recessed region,
 wherein a portion of the vertical active pattern contacting the inner sidewall of the recessed region is in contract with the well region, and
 wherein an entire portion of the bottom surface of the vertical active pattern is in contact with the common source region.

30. A three dimensional semiconductor memory device comprising:
 an electrode structure including electrode patterns and insulating patterns alternately and repeatedly stacked on a substrate;
 a well region doped with dopants of a first conductivity type in the substrate;
 a common source region doped with dopants of a second conductivity type in the substrate at a side of the electrode structure;
 a vertical active pattern on a sidewall of the electrode structure adjacent to the common source region, the vertical active pattern directly contacting the common source region at a bottom surface thereof, and directly contacting the well region at the bottom surface and/or at a sidewall thereof; and
 a data storing layer between the respective electrode patterns and a sidewall of the vertical active pattern.

31. The device of claim 30,
 wherein the vertical active pattern directly contacts the well region at the sidewall of the vertical active pattern.

32. The device of claim 30, wherein the sidewall of the electrode structure includes a first portion which is substantially planar, and a second portion which is laterally concave from the first portion in a plan view and vertically extends in a direction substantially perpendicular to the substrate, and
 wherein the vertical active pattern is disposed on the second portion of the sidewall of the electrode structure.

* * * * *